US011380562B2

(12) United States Patent
Takeaki et al.

(10) Patent No.: US 11,380,562 B2
(45) Date of Patent: Jul. 5, 2022

(54) SUBSTRATE PROCESSING APPARATUS

(71) Applicant: SCREEN Holdings Co., Ltd., Kyoto (JP)

(72) Inventors: Rei Takeaki, Kyoto (JP); Koji Ando, Kyoto (JP); Tadashi Maegawa, Kyoto (JP); Yosuke Yasutake, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 72 days.

(21) Appl. No.: 16/879,178

(22) Filed: May 20, 2020

(65) Prior Publication Data

US 2020/0286750 A1 Sep. 10, 2020

Related U.S. Application Data

(62) Division of application No. 16/440,135, filed on Jun. 13, 2019, now Pat. No. 10,727,091, which is a
(Continued)

(30) Foreign Application Priority Data

| Jun. 18, 2015 | (JP) | 2015-122700 |
| Jun. 18, 2015 | (JP) | 2015-122703 |
| Jun. 18, 2015 | (JP) | 2015-122714 |

(51) Int. Cl.
*H01L 21/67* (2006.01)
*H01L 21/687* (2006.01)

(52) U.S. Cl.
CPC .... *H01L 21/6708* (2013.01); *H01L 21/67017* (2013.01); *H01L 21/67109* (2013.01); *H01L 21/68792* (2013.01)

(58) Field of Classification Search
None
See application file for complete search history.

(56) References Cited

U.S. PATENT DOCUMENTS

| 5,177,878 A | 1/1993 | Visser |
| 6,111,225 A | 8/2000 | Ohkase |

(Continued)

FOREIGN PATENT DOCUMENTS

| CN | 104051304 A | 9/2014 |
| CN | 104517871 A | 4/2015 |

(Continued)

OTHER PUBLICATIONS

Decision of Grant dated Oct. 8, 2019 in counterpart Japanese Patent Application No. 2016-120847.
(Continued)

*Primary Examiner* — Cristi J Tate-Sims
(74) *Attorney, Agent, or Firm* — Ostrolenk Faber LLP

(57) ABSTRACT

A substrate processing apparatus includes a substrate holder, a rotating mechanism, a processing liquid discharge unit, and a gas discharge unit. The processing liquid discharge unit discharges a liquid flow of a processing liquid such that the liquid flow comes into contact with a landing position in a rotation path of a peripheral portion of an upper surface of the substrate being rotated. The gas discharge unit discharges a first gas flow of an inert gas from above toward a first position upstream from the landing position in a direction of rotation of the substrate in the rotation path, and discharges a second gas flow of the inert gas from above toward a second position upstream from the first position in the direction of rotation of the substrate in the rotation path. The kinetic energy of the second gas flow is lower than the kinetic energy of the first gas flow.

7 Claims, 25 Drawing Sheets

Related U.S. Application Data division of application No. 15/181,619, filed on Jun. 14, 2016, now Pat. No. 10,438,821.

(56) References Cited

U.S. PATENT DOCUMENTS

| | | | |
|---|---|---|---|
| 6,197,150 B1 | 3/2001 | Kwag et al. | 156/345 |
| 2002/0139388 A1 | 10/2002 | Chebi | |
| 2002/0195128 A1 | 12/2002 | Shibagaki | |
| 2003/0196683 A1 | 10/2003 | Izumi et al. | 134/2 |
| 2006/0021636 A1 | 2/2006 | Miya | |
| 2007/0012339 A1 | 1/2007 | Fukuda et al. | |
| 2007/0113874 A1 | 5/2007 | Izumi et al. | 134/33 |
| 2008/0035610 A1 | 2/2008 | Miya et al. | 216/84 |
| 2008/0254224 A1 | 10/2008 | Kishimoto | |
| 2008/0280054 A1 | 11/2008 | Ogata et al. | |
| 2009/0114253 A1 | 5/2009 | Matsumoto | |
| 2010/0227056 A1 | 9/2010 | Takayanagi | |
| 2010/0236579 A1 | 9/2010 | Araki | |
| 2011/0062114 A1 | 3/2011 | Mizuno et al. | 216/83 |
| 2012/0125376 A1 | 5/2012 | Ohmi | |
| 2013/0171831 A1 | 7/2013 | Namba et al. | 438/748 |
| 2013/0189802 A1 | 7/2013 | Tromp | |
| 2014/0065295 A1 | 3/2014 | Emoto et al. | 427/8 |
| 2014/0090669 A1 | 4/2014 | Hinode et al. | 134/19 |
| 2014/0116478 A1 | 5/2014 | Higashijima et al. | 134/104.2 |
| 2014/0116480 A1 | 5/2014 | Higashijima et al. | 134/153 |
| 2014/0261572 A1 | 9/2014 | Sotoku et al. | 134/33 |
| 2014/0374022 A1 | 12/2014 | Namba et al. | 156/345.15 |
| 2015/0090302 A1 | 4/2015 | Fujiwara et al. | 134/26 |
| 2017/0194173 A1 | 7/2017 | Sotoku et al. | |
| 2017/0278729 A1* | 9/2017 | Hayashi | H01L 21/67034 |
| 2017/0358466 A1 | 12/2017 | Sotoku et al. | |
| 2018/0012754 A1 | 1/2018 | Nanba | |
| 2018/0108544 A1 | 4/2018 | Namba et al. | |
| 2018/0204745 A1* | 7/2018 | Fujita | B08B 3/02 |

FOREIGN PATENT DOCUMENTS

| | | |
|---|---|---|
| JP | H08-078378 A | 3/1996 |
| JP | H09-293715 A | 11/1997 |
| JP | 2000-195839 A | 7/2000 |
| JP | 2003-007664 A | 1/2003 |
| JP | 2003-086567 | 3/2003 |
| JP | 2003-264168 | 9/2003 |
| JP | 2004-079908 | 3/2004 |
| JP | 2005-142290 | 6/2005 |
| JP | 2005-340381 A | 12/2005 |
| JP | 2006-216794 A | 8/2006 |
| JP | 2008-277708 A | 11/2008 |
| JP | 2009-070946 | 4/2009 |
| JP | 2009-295803 A | 12/2009 |
| JP | 2011-066194 | 3/2011 |
| JP | 2013-153135 A | 8/2013 |
| JP | 2013-162040 A | 8/2013 |
| JP | 2014-038979 A | 2/2014 |
| JP | 2014-072389 | 4/2014 |
| JP | 2014-086638 A | 5/2014 |
| JP | 2014-086639 A | 5/2014 |
| JP | 2014-197571 A | 10/2014 |
| JP | 2015-008273 A | 1/2015 |
| JP | 2015-056455 A | 3/2015 |
| JP | 2015-070018 A | 4/2015 |
| JP | 2015-106701 A | 6/2015 |
| JP | 2016-139743 A | 8/2016 |
| KR | 10-2003-0001198 | 1/2003 |
| KR | 10-2011-0096348 A | 8/2011 |
| TW | 434660 B | 5/2001 |
| TW | 201338075 A | 9/2013 |

OTHER PUBLICATIONS

Notice of Final Rejection dated Aug. 26, 2019 in counterpart Korean Patent Application No. 10-2018-0054955 with English translation obtained from Global Dossier.

Amano Yoshifumi, Liquid Treatment Apparatus, 2009 (Year: 2009).

Baek In Hwan, Apparatus for Dry Etching and Substrate Processing System Having the Same translation, KR 10-2011-0096348, entire document (Year: 2011).

Office Action dated Nov. 14, 2018 in counterpart Korean Patent Application No. 10-2016-0075137 with partial English translation based on the Japanese translation.

Office Action dated Feb. 18, 2019 in counterpart Korean Patent Application No. 10-2018-0054955 with Japanese translation and English partial translation based on the Japanese translation.

Decision of Refusal dated Feb. 12, 2019 in counterpart Japanese Patent Application No. 2015-122700 with partial English translation.

Second Office Action dated Mar. 8, 2019 in counterpart Chinese Patent Application No. 201610444504.1 with Japanese translation and English translation based on the Japanese translation.

Office Action dated Jul. 6, 2018 in counterpart Korean Patent Application No. 10-2018-0054955 with Japanese translation and English partial translation based on the Japanese translation.

Office Action dated Jul. 3, 2018 in counterpart Chinese Application No. 2016104445041 and English translation of the Office Action based on the Japanese translation.

Office Action (Notification of Reasons for Refusal) dated Nov. 13, 2018 in counterpart Japanese Patent Application No. 2015-122700 with partial English translation.

Taiwan Office Action dated Jul. 31, 2018 in counterpart Taiwanese Application No. 107108092 and English translation of the Office Action based on the Japanese translation.

Japanese Office Action dated Sep. 11, 2018 in counterpart Japanese Application No. 2015-122714 and partial English translation thereof.

Japanese Office Action (Application No. 2015-122714) dated May 15, 2018 and partial English translation thereof.

Office Action dated Mar. 16, 2018 in counterpart Korean Patent Application No. 10-2016-0075137 with Japanese translation and English partial translation based on the Japanese translation.

* cited by examiner

F I G. 1 5
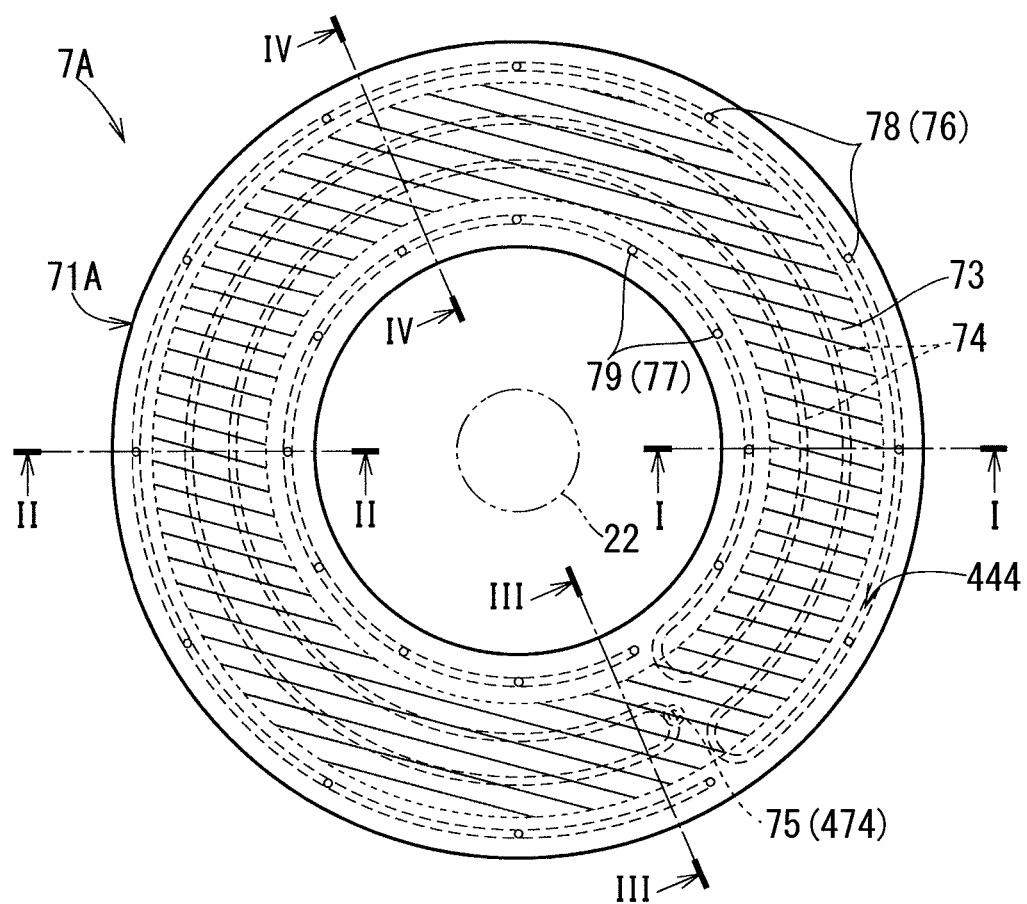

F I G. 1 6
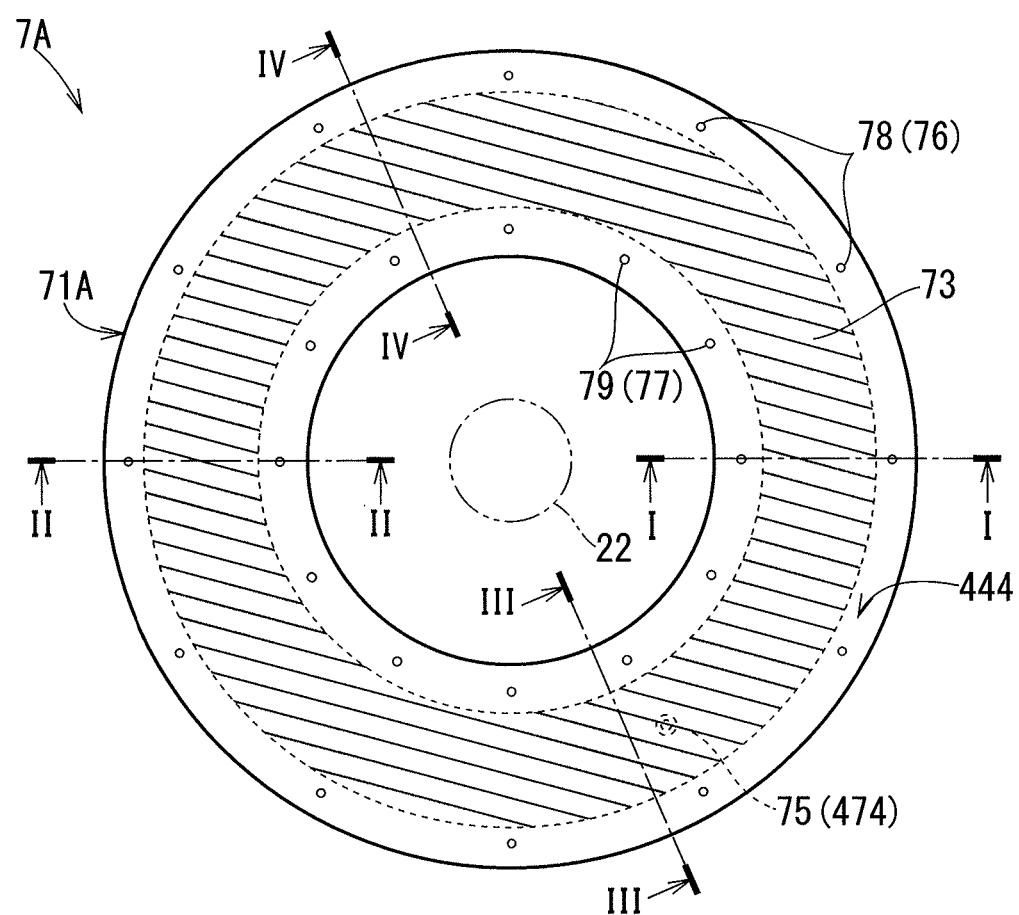

F I G. 1 7
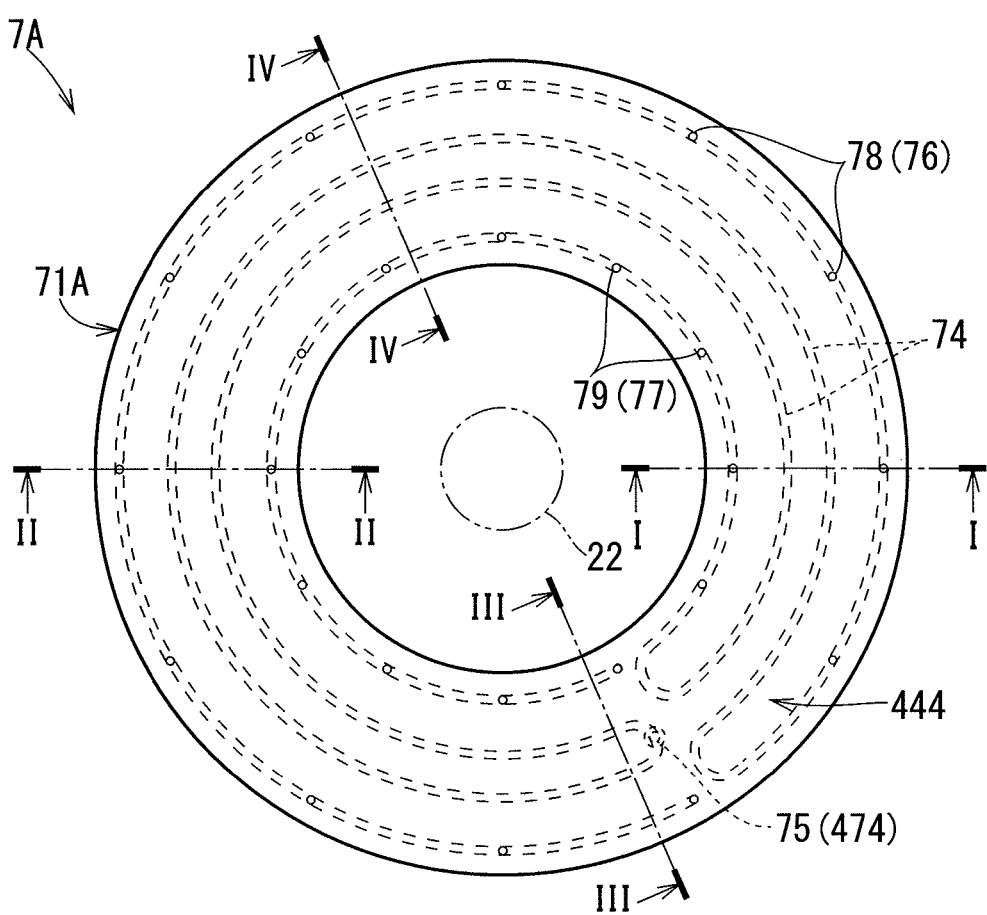

F I G. 2 6
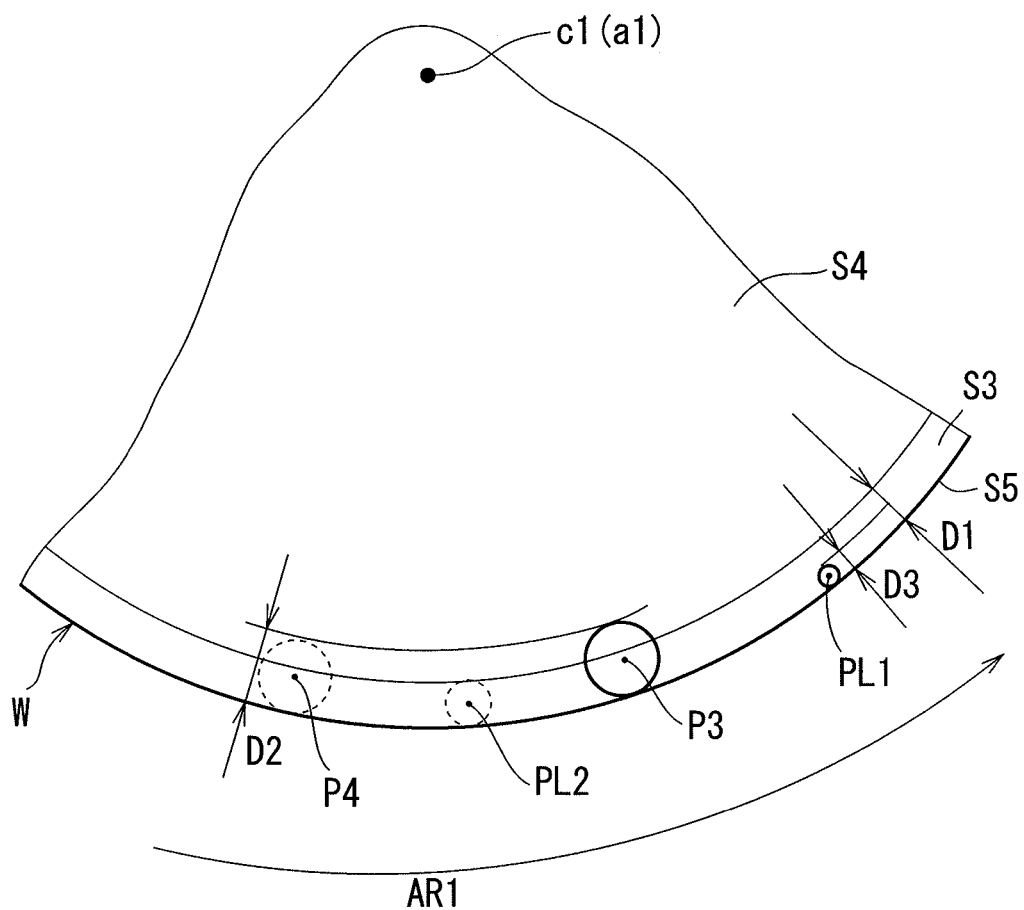

SUBSTRATE PROCESSING APPARATUS

CROSS-REFERENCE TO RELATED APPLICATIONS

The present application is a divisional of prior U.S. patent application Ser. No. 16/440,135, filed Jun. 13, 2019, by Rei TAKEAKI, Koji ANDO, Tadashi MAEGAWA and Yosuke YASUTAKE, entitled "SUBSTRATE PROCESSING APPARATUS," which is a divisional of U.S. patent application Ser. No. 15/181,619, filed Jun. 14, 2016, now U.S. Pat. No. 10,438,821, issued Oct. 8, 2019, which claims priority to Japanese Patent Application Nos. 2015-122700, filed Jun. 18, 2015, 2015-122703, filed Jun. 18, 2015 and 2015-122714, filed Jun. 18, 2015. The entire contents of each of these patent applications are incorporated herein by reference.

BACKGROUND OF THE INVENTION

Field of the Invention

The present invention relates to a technique of processing substrates such as a semiconductor wafer, a glass substrate for liquid crystal display, a glass substrate for plasma display, a substrate for optical disc, a substrate for magnetic disk, a substrate for magneto-optical disk, a glass substrate for photomask, and a substrate for solar cell (hereinafter, merely referred to as "substrates").

Description of the Background Art

A device pattern (circuit pattern) is not usually formed right up to the end face of a substrate, and in many cases, the device pattern is formed in the upper surface region located inside from the end face of the substrate by a constant width.

In the deposition step for forming a device pattern, however, a film may be formed up to the outside of the region in which a device pattern is formed (hereinafter, merely referred to as a "device region"). The film formed outside of the device region is not required and also can cause various malfunctions. For example, the film formed outside of the device region may peel off during the processing steps, reducing yields or causing malfunction in, for example, a substrate processing apparatus.

In consideration of the above, the process of removing a thin film formed outside of the device region by etching, or, so-called bevel etching process is performed in some cases, and apparatuses for performing such a process are proposed (for example, see Japanese Patent Application Laid-Open Nos. 2011-066194 and 2009-070946).

The apparatuses of Japanese Patent Application Laid-Open Nos. 2011-066194 and 2009-070946 discharge a processing liquid onto a peripheral portion of an upper surface of a substrate from nozzles arranged above the peripheral portion while rotating the substrate about the central axis in a horizontal plane, thereby processing the peripheral portion of the upper surface. The nozzles have outlets that are opposed to a part of the rotation path of the peripheral portion of the substrate from above. The nozzles continuously discharge a processing liquid such that the processing liquid comes into contact with the portion, which is located below the outlets, of the peripheral portion of the upper surface of the substrate being rotated. Each part of the peripheral portion of the upper surface repeatedly passes through below the nozzles, and each time, is supplied with a fresh processing liquid from the nozzles.

Japanese Patent Application Laid-Open Nos. 2005-142290, 2014-072389, and 2003-264168 describe the apparatuses that supply processing liquids such as various chemical solutions to an upper surface of a substrate while heating the substrate by a heater opposed to the substrate, thereby processing the substrate. Heating the substrate improves, for example, a processing rate.

The apparatus of Japanese Patent Application Laid-Open No. 2005-142290 includes a heater opposed to the peripheral portion of the upper surface of the substrate and another heater opposed to the peripheral portion of the lower surface of the substrate. The apparatus supplies a processing liquid to the central portion of the upper surface while heating the peripheral portion of the substrate by these heaters from above and below, thereby processing the entire upper surface. The apparatus of Japanese Patent Application Laid-Open No. 2014-072389 discharges a processing liquid onto the central portion of the upper surface of the substrate while heating the entire substrate by the heater opposed to the entire lower surface of the substrate, thereby processing the entire upper surface. The apparatus of Japanese Patent Application Laid-Open No. 2003-264168 discharges a processing liquid onto the peripheral portion of the upper surface of the substrate while heating the peripheral portion of the substrate by an annular heater opposed to the peripheral portion of the lower surface of the substrate, thereby processing the peripheral portion of the upper surface.

Japanese Patent Application Laid-Open No. 2004-79908 describes a substrate processing apparatus including an etching liquid supply nozzle and a pure water supply nozzle. The etching liquid supply nozzle discharges an etching liquid onto a plurality of positions of a peripheral portion of an upper surface of a substrate, which have different distances from the center of rotation of the substrate. The pure water supply nozzle discharges pure water for protection onto the central portion of the upper surface of the substrate. The pure water discharged onto the central portion of the upper surface is supplied to the entire upper surface by the rotation of the substrate and washes away the etching liquid dispersed in a to-be-protected region of the upper surface except for the peripheral portion. This protects the to-be-protected region. The etching liquid has a high concentration at the position with which the etching liquid comes into contact, and the etching liquid that has spread from that position toward the periphery is diluted with pure water and accordingly has a decreased concentration. For the etching process to advance uniformly at the respective positions with different radial distances from the center of rotation in the peripheral portion of the substrate, the apparatus of Japanese Patent Application Laid-Open No. 2004-79908 supplies an etching liquid to the plurality of positions with different distances from the center of rotation of the substrate, to thereby make the concentration of the etching liquid uniform in the peripheral portion of the substrate.

Japanese Patent Application Laid-Open No. 2003-86567 discloses a substrate processing apparatus including an etching liquid discharge nozzle and a rinse liquid discharge nozzle. The etching liquid discharge nozzle discharges an etching liquid such that the etching liquid comes into contact with the peripheral portion of the substrate. The rinse liquid discharge nozzle discharges a rinse liquid such that the rinse liquid comes into contact with the position of the substrate located on the side closer to the center of the substrate than the position with which the etching liquid comes into contact. The apparatus first positions both of the nozzles such that the etching liquid and the rinse liquid come into contact with two portions of the substrate closer to the center of the substrate, and then discharges the etching liquid and the rinse liquid from the respective nozzles, thereby performing an etching process. Subsequently, the apparatus stops discharging the etching liquid without changing the positions of the nozzles and continuously discharges the rinse liquid, thereby performing a rinse process. Subsequently, the apparatus moves the nozzles together toward the periphery of the substrate, thereby positioning the nozzles such that the rinse liquid comes into contact with the region from which the thin film has been removed by the first etching process and that the etching liquid comes into contact with the position on the side closer to the periphery of the substrate. The apparatus sequentially performs etching and rinse processes again after positioning. In the second rinse process, the rinse liquid comes into contact with the region from which the thin film has been removed. This prevents a situation in which the rinse liquid comes into contact with the thin film, and metal ions of the thin film flow out and adheres to the peripheral portion.

In the apparatuses of Japanese Patent Application Laid-Open Nos. 2011-066194 and 2009-070946, however, the respective parts of the peripheral portion of the upper surface arrive at the portion below the nozzle, with the processing liquid remaining in the respective parts. Thus, a processing liquid newly discharged from the nozzle ("fresh processing liquid") comes into contact with the processing liquid ("residual processing liquid") to cause splashes. When the splashed processing liquid enters the device region, a defect occurs in the device pattern.

When an inert gas is discharged at a high flow rate onto the landing position of the processing liquid in the peripheral portion of the upper surface of the substrate toward the upstream portion in the direction of rotation of the substrate, the residual processing liquid is blown off by a gas flow of an inert gas to be removed from the peripheral portion. This prevents a collision between the residual processing liquid and a fresh processing liquid. If an inert gas comes into contact with the residual processing liquid at a high flow rate, however, the residual processing liquid may splash to arrive at the device region.

If the flow rate of the inert gas is decreased to restrict the generation of splashes that can arrive at the device region, the residual processing liquid cannot be completely removed from the peripheral portion. As a result, a fresh processing liquid may come into contact with the residual processing liquid and cause splashes, and the splashed processing liquid may enter the device region.

According to Japanese Patent Application Laid-Open Nos. 2005-142290, 2014-072389, and 2003-264168, a space exists between the substrate and the heater, and as the substrate rotates, the room-temperature atmosphere existing around the peripheral portion of the substrate is taken into the space between the substrate and the heater. The substrate is cooled from the lower surface by the room-temperature atmosphere, which unfortunately decreases the heating efficiency of the substrate.

In the apparatuses of Japanese Patent Application Laid-Open Nos. 2004-79908 and 2003-86567, the etching liquid discharged onto the peripheral portion of the upper surface of the substrate wraps around the lower surface of the substrate. As a result, the lower surface of the substrate, which is not to be etched, may be etched, thus damaging the lower surface. In addition, the pure water and the rinse liquid that protect a to-be-protected region of the upper surface may dilute the etching liquid, decreasing the processing efficiency.

SUMMARY OF THE INVENTION

The present invention is directed to a substrate processing apparatus.

A substrate processing apparatus according to an aspect of the present invention includes a substrate holder, a rotating mechanism, a processing liquid discharge unit, and a gas discharge unit. The substrate holder is rotatably disposed about a predetermined rotation axis and holds a substrate substantially horizontally. The rotating mechanism rotates the substrate holder about the rotation axis. The processing liquid discharge unit discharges a liquid flow of a processing liquid such that the liquid flow comes into contact with a landing position in a rotation path of a peripheral portion of an upper surface of the substrate being rotated about the rotation axis. The gas discharge unit discharges a first gas flow of an inert gas from above toward a first position upstream from the landing position in a direction of rotation of the substrate in the rotation path so as to direct the first gas flow from the first position toward a periphery of the substrate, and discharges a second gas flow of the inert gas from above toward a second position upstream from the first position in the direction of rotation of the substrate in the rotation path so as to direct the second gas flow from the second position toward the periphery of the substrate. A kinetic energy of the second gas flow when the second gas flow is discharged is lower than a kinetic energy of the first gas flow when the first gas flow is discharged.

In this apparatus, the second gas flow having kinetic energy lower than that of the first gas flow comes into contact with the liquid film of the residual processing liquid in the peripheral portion of the substrate at the second position. This drains out the residual processing liquid out of the substrate while restricting the generation of splashes of the residual processing liquid that can arrive at the device region, thereby reducing the film thickness of the residual processing liquid. Thus, the first gas flow having high kinetic energy is caused to come into contact with the thinner portion of the residual processing liquid at the first position on the downstream side, thus draining most of the residual processing liquid out of the substrate while suppressing the generation of splashes of the residual processing liquid that can arrive at the device region. This restricts the generation of splashes that can arrive at the device region of the substrate due to a collision between the residual processing liquid and a fresh processing liquid discharged onto a further downstream landing position. Therefore, the peripheral portion of the upper surface of the substrate is processed while restricting the processing liquid from entering the device region of the upper surface of the substrate.

A substrate processing apparatus according to another aspect of the present invention includes a substrate holder, a rotating mechanism, a chemical solution discharge unit, a heater, and a gas discharge mechanism. The substrate holder is rotatably disposed about a predetermined rotation axis and holds a substrate substantially horizontally. The rotating mechanism rotates the substrate holder about the rotation axis. The chemical solution discharge unit discharges a chemical solution onto a to-be-processed surface of the substrate. The heater includes an opposed surface opposed to an opposite surface of the substrate opposite to the to-be-processed surface in a contactless manner, and heats the substrate. The gas discharge mechanism discharges an inert gas preheated into a space between the opposite surface of the substrate and the opposed surface of the heater.

This apparatus discharges an inert gas preheated into the space between the surface of the substrate opposite to the to-be-processed surface and the opposed surface of the heater. This restricts an atmosphere from entering the space to restrict a reduction in heating efficiency and restricts a reduction in heating efficiency also by the inert gas. Therefore, the substrate is processed while heating the substrate efficiently.

A substrate processing apparatus according to still another aspect of the present invention includes a substrate holder, a rotating mechanism, a chemical solution discharge nozzle, and a rinse liquid discharge nozzle. The substrate holder is rotatably disposed about a predetermined rotation axis and holds a substrate substantially horizontally. The rotating mechanism rotates the substrate holder about the rotation axis. The chemical solution discharge nozzle discharges a chemical solution such that the chemical solution comes into contact with a first position in a first rotation path of a peripheral portion of a to-be-processed surface of the substrate. The rinse liquid discharge nozzle discharges a rinse liquid such that the rinse liquid comes into contact with a second position in a second rotation path of a peripheral portion of a to-be-protected surface of the substrate opposite to the to-be-processed surface. The second position is a position upstream from the first position in a direction of rotation of the substrate and is set in advance such that, before the rinse liquid moves in a circumferential direction of the substrate and arrives at the first position or its vicinity, the rinse liquid has wrapped around an end face of the substrate from the to-be-protected surface of the substrate and hardly wrapped around the peripheral portion of the to-be-processed surface.

This apparatus restricts the rinse liquid from wrapping around the to-be-processed surface while the rinse liquid moves from the second position to the first position or its vicinity in the circumferential direction of the substrate. This restricts the dilution of the chemical solution discharged onto the first position with the rinse liquid at the peripheral portion of the to-be-processed surface of the substrate. In addition, the rinse liquid has wrapped around the end face from the to-be-protected surface before the rinse liquid arrives at the first position or its vicinity in the circumferential direction of the substrate. As a result, the chemical solution that begins to wrap around the to-be-protected surface from the first position is washed away with the rinse liquid, thus diluting the chemical solution. This restricts the to-be-protected surface from being processed with the chemical solution that has wrapped around the to-be-protected surface while discharging the chemical solution onto the peripheral portion of the to-be-processed surface of the substrate to process the peripheral portion efficiently.

The present invention therefore has an object to provide a technique of processing a peripheral portion of an upper surface of a substrate while restricting a processing liquid from entering a device region of the upper surface of the substrate. The present invention has another object to provide a technique of processing a substrate while efficiently heating the substrate. The present invention has sill has another object to provide a technique of restricting a to-be-protected surface of a substrate from being processed with a chemical solution that has wrapped around the to-be-protected surface while efficiently discharging a chemical solution onto a peripheral portion of the to-be-processed surface to process the peripheral portion.

In the present invention, the term "to-be-processed surface" means a surface that is to be processed ("surface to be processed"), and the term "to-be-protected surface" means a surface that is to be protected ("surface to be protected"). In the event that the processing with a processing liquid is to be performed on a major surface of a substrate, the major surface represents the "to-be-processed surface" of the invention, and the surface opposite to the major surface represents the "to-be-protected surface" of the invention. Similarly, the term "to-be-processed region" means a region that is to be processed ("region to be processed"), and the term "to-be-protected region" means a region that is to be protected ("region to be protected").

These and other objects, features, aspects and advantages of the present invention will become more apparent from the following detailed description of the present invention when taken in conjunction with the accompanying drawings.

BRIEF DESCRIPTION OF THE DRAWINGS

FIGS. 15 to 17 are schematic top views of a heater of FIG. 14;

FIG. 26 is a top view schematically illustrating positions at which a processing liquid, a rinse liquid, and an inert gas discharged by the substrate processing apparatus of FIG. 23 come into contact with the peripheral portion of a substrate;

DESCRIPTION OF THE PREFERRED EMBODIMENTS

Figure 1:
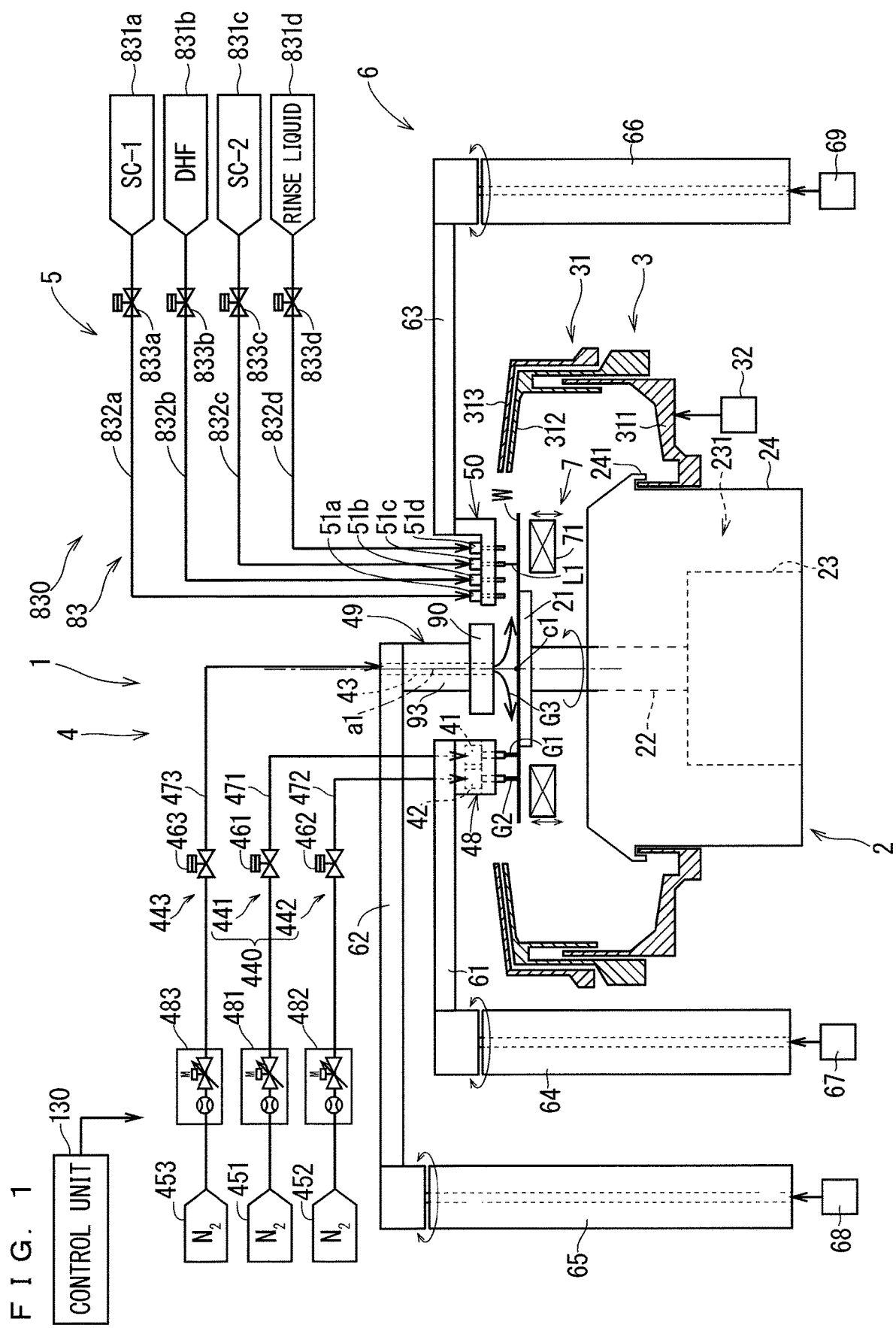
FIG. 1 is a schematic side view for explaining the configuration of a substrate processing apparatus according to a first embodiment of the present invention.

Embodiments of the present invention will now be described with reference to the drawings. In the drawings, components having similar configuration and functions bear the same reference signs, and description thereof will not be repeated below. The embodiments below are examples of the implementation of the present invention, which do not limit the technical scope of the present invention. In the drawings below, for easy understanding, the dimensions and the numbers of the respective portions may be exaggerated or simplified. The up and down direction is a vertical direction, and a side close to a substrate relative to a spin chuck is an upper side. A "processing liquid" includes a "chemical solution" for use in the chemical solution process and a "rinse liquid (also referred to as a "cleaning liquid")" for use in the rinse process of washing away the chemical solution. The substrate W has an approximately circular surface shape. The substrate is transferred to and from the substrate processing apparatus by, for example, a robot, with the nozzle head and the like arranged at retreat positions. The substrate transferred to the substrate processing apparatus is detachably held by the spin chuck. The "inert gas" is a gas that is poorly reactive to a material for the substrate W and a thin film formed on the surface of the substrate W, which is, for example, nitrogen ($N_2$) gas, argon gas, or helium gas.

1. First Embodiment

1.1. Configuration of Substrate Processing Apparatus 1

Figure 2:
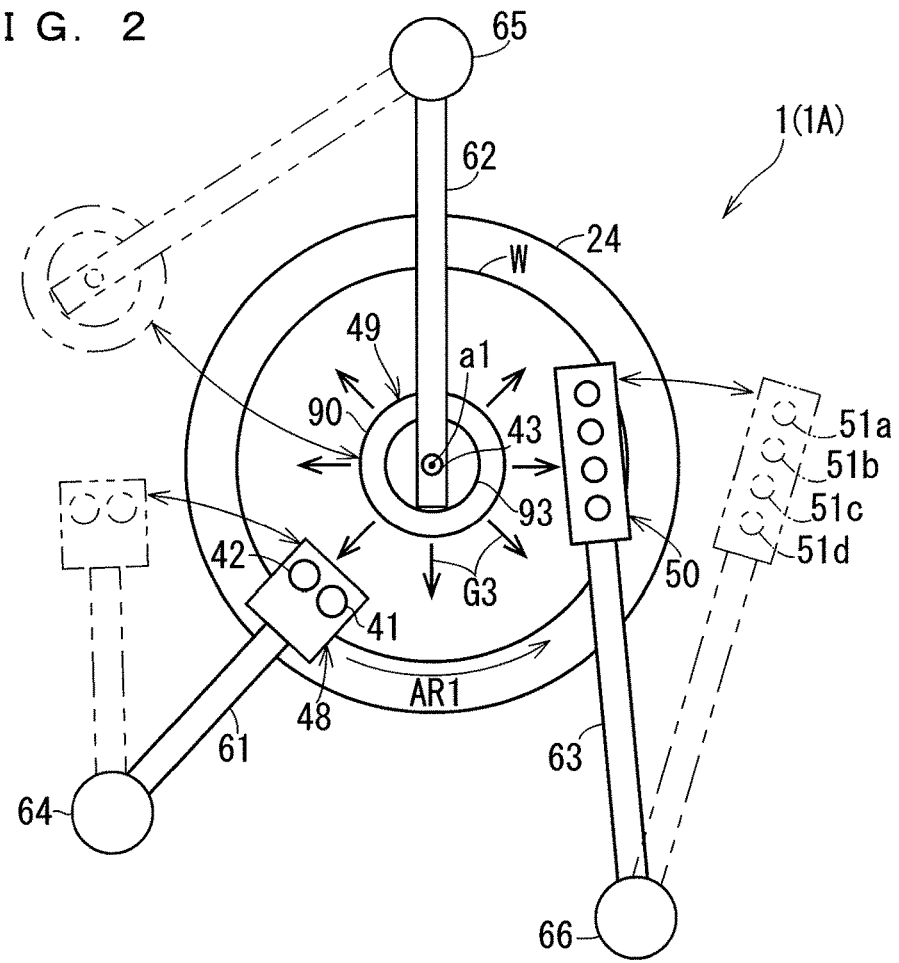
FIG. 2 is a schematic top view for explaining the configuration of the substrate processing apparatus according to the first (second) embodiment of the present invention.
Figure 3:
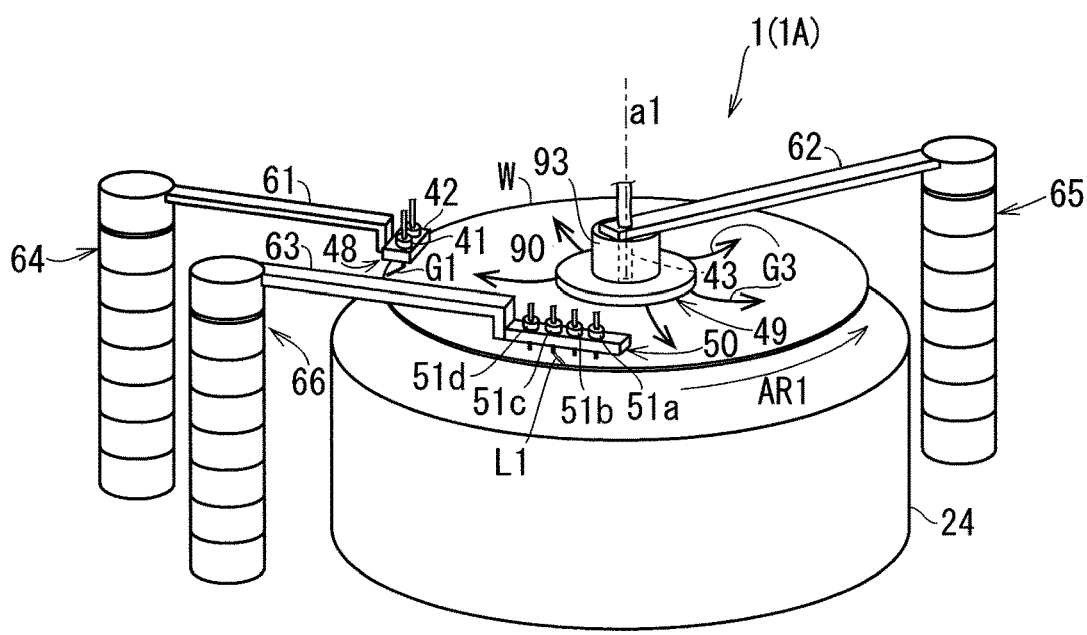
FIG. 3 is a schematic perspective view for explaining the configuration of the substrate processing apparatus according to the first (second) embodiment of the present invention.
Figure 4:
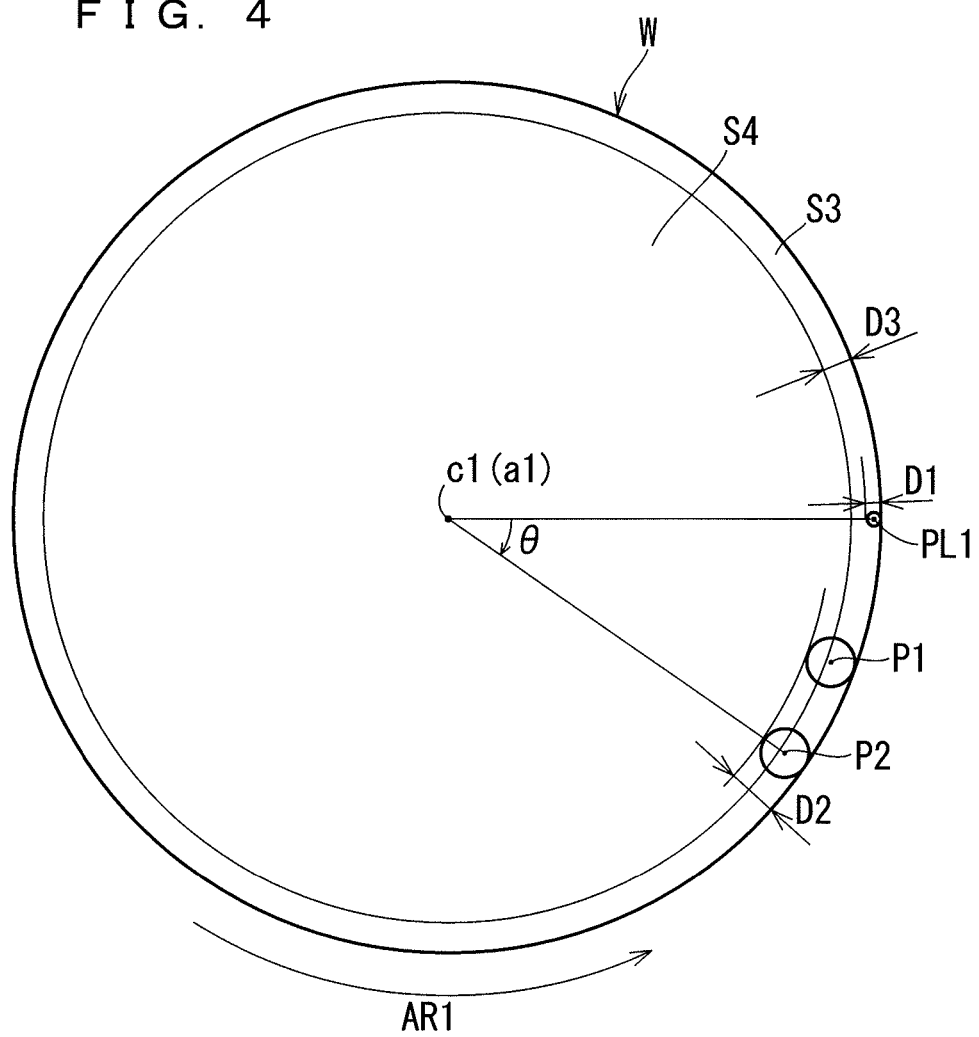
FIG. 4 is a top view schematically illustrating positions, at which a liquid flow of a processing liquid and gas flows of an inert gas that are discharged from the substrate processing apparatus according to the first (second) embodiment of the present invention come into contact with a peripheral portion of a substrate.

The configuration of a substrate processing apparatus 1 will be described with reference to FIGS. 1 to 4. FIGS. 1 to 3 are views for explaining the configuration of the substrate processing apparatus 1 according to an embodiment. FIGS. 1 and 2 are a schematic side view and a schematic top view, respectively, of the substrate processing apparatus 1. FIG. 3 is a schematic perspective view of the substrate processing apparatus 1 as viewed from diagonally above. FIG. 4 is a schematic top view of a substrate W, which illustrates an example of a positional relationship among positions at which a liquid flow of a processing liquid and gas flows of an inert gas that are discharged from the substrate processing apparatus 1 come into contact with the periphery of the substrate W.

FIGS. 1 to 3 illustrate the state in which the substrate W is being rotated in a predetermined direction of rotation (the direction of an arrow AR1) about a rotation axis a1 by a spin chuck 21, with nozzle heads 48 to 50 arranged at their respective processing positions. In FIG. 2, the nozzle heads 48 to 50 arranged at their retreat positions and the like are indicated by phantom lines. FIGS. 2 and 3 do not illustrate partial components of the substrate processing apparatus 1, such as a scatter prevention unit 3.

The substrate processing apparatus 1 includes a rotary holding mechanism 2, the scatter prevention unit 3, a surface protection unit 4, a processing unit 5, a nozzle moving mechanism 6, a heating mechanism 7, and a control unit 130. These units 2 to 7 are electrically connected to the control unit 130 and operate in response to instructions from the control unit 130. The control unit 130 may be, for example, a general-purpose computer. In other words, for example, the control unit 130 includes a CPU configured to perform various computations, a ROM that is a read-only memory configured to store a basic program, a RAM that is a random access memory for storing a various types of information, a magnetic disk for storing, for example, control software and data. The control unit 130 causes a CPU that is a main control unit to perform computations in accordance with the procedure described in the program, thereby controlling the respective units of the substrate processing apparatus 1.

Rotary Holding Mechanism 2

The rotary holding mechanism 2 is a mechanism that can rotate the substrate W while keeping the substrate W in a substantially horizontal position, with one major surface of the substrate W facing upward. The rotary holding mechanism 2 rotates the substrate W about the rotation axis a1 that extends vertically and passes through a center c1 of the major surface.

The rotary holding mechanism 2 includes a spin chuck ("holding member" or "substrate holder") 21 that is a disc-shaped member smaller than the substrate W. The spin chuck 21 is provided such that its upper surface is substantially horizontal and its central axis coincides with the rotation axis a1. The lower surface of the spin chuck 21 is coupled with a cylindrical rotary shaft 22. The rotary shaft 22 is positioned such that its axis line coincides with the vertical direction. The axis line of the rotary shaft 22 coincides with the rotation axis a1. The rotary shaft 22 is connected with a rotational drive (e.g., motor) 23. The rotational drive 23 rotatively drives the rotary shaft 22 about the axis line of the rotary shaft 22. The spin chuck 21 can accordingly rotate about the rotation axis a1 together with the rotary shaft 22. The rotational drive 23 and the rotary shaft 22 serve as a rotating mechanism 231 that rotates the spin chuck 21 about the rotation axis a1. The rotary shaft 22 and the rotational drive 23 are accommodated in a tubular casing 24.

A through hole (not shown) is provided in the central portion of the spin chuck 21 and is in communication with the interior space of the rotary shaft 22. The interior space is connected with a pump (not shown) through a pipe (not shown) and an on/off valve (not shown). The pump and the on/off valve are electrically connected to the control unit 130. The control unit 130 controls the operations of the pump and the on/off valve. The pump can selectively supply a negative pressure and a positive pressure in accordance with the control of the control unit 130. When the pump supplies a negative pressure with the substrate W positioned substantially horizontally on the upper surface of the spin chuck 21, the spin chuck 21 adheres to and holds the substrate W from below. When the pump supplies a positive pressure, the substrate W can be removed from the upper surface of the spin chuck 21.

In this configuration, when the rotational drive 23 rotates the rotary shaft 22 with the spin chuck 21 adhering to and holding the substrate W, the spin chuck 21 is rotated about the axis line extending vertically. This causes the substrate W held on the spin chuck 21 to rotate in the direction of the arrow AR1 about the rotation axis a1 that extends vertically and passes through the center c1 in the plane of the substrate W.

The spin chuck 21 may include a plurality of (e.g., six) chuck pins provided at appropriate intervals near the peripheral portion of the upper surface thereof and hold the substrate W by the plurality of chuck pins. In this case, the spin chuck 21 has a disc shape slightly larger than the substrate W. The plurality of chuck pins detachably hold the substrate W such that the center c1 of the major surface of the substrate W coincides with the rotation axis a1 and that the substrate W is positioned substantially horizontally at a position slightly higher than the upper surface of the spin chuck 21. The direction of each chuck pin is selectively set, by the motor or the like electrically connected to the control unit 130, to the direction in which the chuck pins abut against the periphery of the substrate W and holds the substrate W or the direction in which the check pins depart from the periphery of the substrate W and release the substrate W.

Scatter Prevention Unit 3

The scatter prevention unit 3 catches, for example, a processing liquid scattered from the substrate W rotated together with the spin chuck 21.

The scatter prevention unit 3 includes a splash guard 31. The splash guard 31 is a tubular member with an open upper end and is provided so as to surround the rotary holding mechanism 2. In this embodiment, for example, the splash guard 31 includes three members: a bottom member 311, an inside member (also referred to as an "inside guard" or merely a "guard") 312, and an outside member (also referred to as an "outside guard") 313. No outside member 313 may be provided, or a guard may be additionally provided outside of the outside member 313 so as to surround the rotary holding mechanism 2.

The bottom member 311 is a tubular member having an open upper end and includes an annular bottom portion, a cylindrical inside wall portion extending upward from the inner edge portion of the bottom portion, and a cylindrical outside wall portion extending upward from the outer edge portion of the bottom portion. At least an edge of the inside wall portion and its vicinity are accommodated in an inside space of a flanged member 241 provided to the casing 24 of the rotary holding mechanism 2.

On the bottom portion is formed a drain groove (not shown) communicating with the space between the inside wall portion and the outside wall portion. The drain groove is connected to the drain line of a factory. The drain groove is connected with a drain mechanism that forcibly exhausts air from the groove to provide a negative state in the space between the inside wall portion and the outside wall portion. The space between the inside wall portion and the outside wall portion is a space for collecting and exhausting the processing liquid used for processing the substrate W, and the processing liquid collected in this space is exhausted through the drain groove.

The inside member 312 is a tubular member with an open upper end, and the upper portion ("upper-end side portion" or "upper-end portion") of the inside member 312 extends inwardly and upwardly. Specifically, the upper portion extends diagonally upward toward the rotation axis a1. At the lower portion of the inside member 312 are formed a tubular inside peripheral wall portion extending downward along the inner peripheral surface of the upper portion and a tubular outside peripheral wall portion extending downward along the outer peripheral surface of the upper portion. With the bottom member 311 and the inside member 312 close to each other, the outside wall portion of the bottom member 311 is accommodated between the inside peripheral wall portion and the outside peripheral wall portion of the inside member 312. The processing liquid or the like caught by the upper portion of the inside member 312 is drained through the bottom member 311.

The outside member 313 is a tubular member with an open upper end and is provided outside of the inside member 312. The upper portion ("upper-end side portion" or "upper-end portion") of the outside member 313 extends inwardly and upwardly. Specifically, the upper portion extends diagonally upward toward the rotation axis a1. The lower portion extends downward along the outside peripheral wall portion of the inside member 312. The processing liquid or the like caught by the upper portion of the outside member 313 is drained from a gap between the outside peripheral wall portion of the inside member 312 and the lower portion of the outside member 313.

The splash guard 31 is provided with a guard drive mechanism ("elevation drive") 32 that moves the splash guard 31 upward or downward. The guard drive mechanism 32 is configured of, for example, a stepping motor. In this embodiment, the guard drive mechanism 32 independently moves the three members 311, 312, and 313 of the splash guard 31 upward or downward.

The inside member 312 and the outside member 313 are individually moved between their upper positions and lower positions through driving of the guard drive mechanism 32. Herein, the respective upper positions of the members 312 and 313 are positions at which the upper edge portions of the 312 and 313 are arranged lateral to and above the substrate W held on the spin chuck 21. On the other hand, the respective lower positions of the members 312 and 313 are positions at which the upper edge portions of the members 312 and 313 are arranged below the upper surface of the spin chuck 21. The upper position (lower position) of the outside member 313 is located slightly above the upper position (lower position) of the inside member 312. The inside member 312 and the outside member 313 are moved upward or downward simultaneously or successively so as not to come into contact with each other. The bottom member 311 is driven by the guard drive mechanism 32 between a position at which the inside wall portion of the bottom member 311 is accommodated in the inside space of the flanged member 241 provided to the casing 24 and a position below the above-mentioned position. It should be noted that the guard drive mechanism 32 is electrically connected to the control unit 130 and operates under the control of the control unit 130. That is to say, the position of the splash guard 31 (specifically, the respective positions of the bottom member 311, the inside member 312, and the outside member 313) is controlled by the control unit 130.

Surface Protection Unit 4

The surface protection unit 4 includes a gas discharge mechanism (also referred to as a "gas discharge mechanism for peripheral portion" or a "gas discharge unit") 440 that discharges gas flows of an inert gas such that the gas flows come into contact with the peripheral portion of the upper surface of the substrate W held and being rotated on the spin chuck 21. The gas discharge mechanism 440 includes gas discharge mechanisms 441 and 442. The gas discharge mechanisms 441 and 442 discharge an inert gas as, for example, gas-column-shaped gas flows G1 and G2. The gas discharge mechanism 442 discharges the gas flow G2 of the inert gas such that the gas flow G2 comes into contact with a position ("second position") P2 upstream from a position ("first position") P1, at which the gas flow G1 discharged from the gas discharge mechanism 441 comes into contact with the peripheral portion of the substrate W, in the direction of rotation of the substrate W.

The surface protection unit 4 further includes a gas discharge mechanism (also referred to as a "gas discharge mechanism for central portion" or "another gas discharge unit") 443 that discharges a gas flow G3 of the inert gas onto the center or its vicinity of the upper surface of the substrate W held and being rotated on the spin chuck 21. The surface protection unit 4 discharges the gas flows G1 to G3 of the inert gas onto the upper surface of the substrate W respectively from the gas discharge mechanisms 441 to 443, thereby protecting a to-be-protected region ("device region") S4 (FIG. 4) of the upper surface of the substrate W from, for example, the processing liquid discharged so as to come into contact with an annular processing region S3 (FIG. 4) defined by the peripheral portion of the upper surface of the substrate W. The to-be-protected region S4 is a region of the upper surface of the substrate W except for the processing region S3.

The gas discharge mechanism 440 includes a nozzle head 48. The gas discharge mechanism 443 includes a nozzle head 49. The nozzle heads 48 and 49 are attached to the distal ends of elongated arms 61 and 62 of the nozzle moving mechanism 6 described below. The arms 61 and 62 extend along the horizontal plane. The nozzle moving mechanism 6 moves the arms 61 and 62 respectively to move the nozzle heads 48 and 49 between their processing positions and retreat positions.

The nozzle head 48 includes nozzles 41 and 42 and a holding member holding these nozzles. The holding member is formed of, for example, a plate-shaped member extending along the horizontal plane and a protruding member protruding upward from one end of the plate-shaped member, which are bonded together, and has an L-shaped cross-sectional shape. The protruding member has a distal end attached to the distal end of the arm 61 and protrudes more in the extension direction of the arm 61 than the proximal end of the arm 61 relative to the distal end of the arm 61. The nozzles 41 and 42 are held by the plate-shaped member while passing through the plate-shaped member vertically. The nozzles 41 and 42 each have a distal end portion (lower end portion) protruding downward from the lower surface of the plate-shaped member and an upper end portion protruding upward from the upper surface of the plate-shaped member. The upper ends of the nozzles 41 and 42 are connected respectively with first ends of pipes 471 and 472. Second ends of pipes 471 and 472 are connected respectively to gas supply sources 451 and 452. At some midpoint in the pipe 471, a flow rate controller 481 and an on/off valve 461 are provided sequentially from the gas supply source 451 side; at some midpoint in the pipe 472, a flow rate controller 482 and an on/off valve 462 are provided sequentially from the gas supply source 452 side.

When the nozzle moving mechanism 6 arranges the nozzle head 48 at its processing position, the outlet of the nozzle 41 is opposed to a part of a rotation path of the peripheral portion of the substrate W rotated by the rotary holding mechanism 2, and the outlet of the nozzle 42 is opposed to another part of the rotation path.

With the nozzle head 48 arranged at the processing position, the nozzles 41 and 42 are supplied with an inert gas (in the illustrated example, nitrogen ($N_2$) gas) respectively from the gas supply sources 451 and 452. The nozzle 41 discharges the gas flow G1 of the supplied inert gas from above such that the gas flow G2 comes into contact with the position P1 defined in the rotation path of the peripheral portion of the substrate W. The nozzle 41 discharges the gas flow G1 in a predetermined direction through the outlet such that the discharged gas flow G1 arrives at the position P1 and then flows from the position P1 toward the periphery of the substrate W. The nozzle 42 discharges the gas flow G2 of the supplied inert gas from above such that the gas flow G2 comes into contact with the position P2 ("second position") (FIG. 4) defined in the rotation path. The nozzle 42 discharges the gas flow G2 in a predetermined direction through the outlet such that the discharged gas flow G2 arrives at the position P2 and then flows from the position P2 toward the periphery of the substrate W.

The substrate W has a radius of, for example, 150 mm. The "peripheral portion" of the substrate W is an annular portion with a width D2 from the periphery of the substrate W. The width D2 of the peripheral portion is, for example, 3 to 30 mm. The processing region S3 is an annular portion with a width D3 from the periphery of the substrate W. The width D3 of the processing region S3 is, for example, 1 to 5 mm. The processing region S3 is a partial periphery-side region of the peripheral portion of the to-be-processed surface of the substrate W.

A liquid flow L1 of a processing liquid discharged from a nozzle head 50 of the processing unit 5, which will be described below, comes into contact with a position ("landing position") PL1 (FIG. 4) defined in the rotation path of the peripheral portion on the upper surface of the substrate W. A width D1 of the liquid flow L1 in the radial direction of the substrate W is, for example, 0.5 to 2.5 mm. The nozzle head 50 can selectively discharge the liquid flow L1 of the processing liquid from each of a plurality of nozzles 51a to 51d. The position PL1 slightly varies depending on the arrangements of the nozzles 51a to 51d and the direction in which the processing liquid is discharged. The position P1 is located upstream from the position PL1 corresponding to any of the nozzles 51a to 51d in the direction of rotation of the substrate W along the circumferential direction of the substrate W. The position P2 is located upstream from the position P1 in the direction of rotation of the substrate W along the circumferential direction of the substrate W.

That is to say, the gas discharge mechanism 440 discharges the gas flow ("first gas flow") G1 of the inert gas from above toward the position P1 upstream from the position PL1, with which the processing liquid discharged from the processing unit 5 comes into contact, in the direction of rotation of the substrate W along the circumferential direction of the substrate W in the rotation path of the peripheral portion of the substrate W. The gas discharge mechanism 440 discharges the gas flow G1 in a predetermined direction such that the discharged gas flow G1 flows from the position P1 toward the periphery of the substrate W. Also, the gas discharge mechanism 440 discharges the gas flow ("second gas flow") G2 of the inert gas from above toward the position P2 upstream from the position P1 in the direction of rotation of the substrate W along the circumferential direction of the substrate W in the rotation path. The gas discharge mechanism 440 discharges the gas flow G2 in a predetermined direction such that the discharged gas flow G2 flows from the position P2 toward the periphery of the substrate W.

The nozzle head 49 of the gas discharge mechanism 443 includes a columnar member 93 attached to the lower surface of the distal end portion of the arm 62, a disc-shaped shielding plate 90 attached to the lower surface of the columnar member 93, and a cylindrical nozzle 43. The axis line of the columnar member 93 coincides with the axis line of the shielding plate 90, and each axis line extends vertically. The lower surface of the shielding plate 90 extends along the horizontal plane. The nozzle 43 passes through the columnar member 93 and the shielding plate 90 vertically such that the axis line of the nozzle 43 coincides with the axis lines of the shielding plate 90 and the columnar member 93. The upper end of the nozzle 43 further passes through the distal end portion of the arm 62 to be open to the upper surface of the arm 62. The upper opening of the nozzle 43 is connected with a first end of the pipe 473. A second end of the pipe 473 is connected to the gas supply source 453. At some midpoint in the pipe 473 are provided a flow rate controller 483 and an on/off valve 463 sequentially from the gas supply source 453 side. The lower end of the nozzle 43 is open to the lower surface of the shielding plate 90. The opening is an outlet of the nozzle 43.

When the nozzle moving mechanism 6 arranges the nozzle head 49 at its processing position, the outlet of the nozzle 43 is opposed to the center and its vicinity of the upper surface of the substrate W. In this state, the nozzle 43 is supplied with an inert gas (in the illustrated example, nitrogen ($N_2$) gas) from the gas supply source 453 through the pipe 473. The nozzle 43 discharges the supplied inert gas as a gas flow G3 of the inert gas onto the center or its vicinity of the upper surface of the substrate W. The gas flow G3 spreads radially toward the periphery of the substrate W from above the central portion of the substrate W. Specifically, the gas discharge mechanism 443 discharges an inert gas from above the central portion of the upper surface of the substrate W to generate a gas flow spreading toward the periphery of the substrate W from above the central portion.

Each of the flow rate controllers 481 to 483 includes a flowmeter that detects a flow rate of a gas flowing through each of the pipes 471 to 473 in which the flow rate control unit is provided and a variable valve that can adjust the flow rate of the gas. The control unit 130 controls an open/close amount of the variable valve of each of the flow rate controllers 481 to 483 via a valve control mechanism (not shown) such that a flow rate detected by the flowmeter is equal to a target flow rate for each of the flow rate controllers 481 to 483. The control unit 130 can set a target flow rate within a predetermined range in accordance with the preset setup information to freely control a flow rate of a gas passing through each of the flow rate controllers 481 to 483 in a predetermined range. The control unit 130 also controls the on/off valves 461 to 463 between the open state and the closed state via the valve control mechanisms. The control unit 130 thus controls how the gas flows G1 to G3 are discharged from the nozzles 41 to 43 (such as a discharge start timing, a discharge end timing, and a discharge flow rate).

How easily the residual processing liquid is blown off by the gas flows G1 and G2 varies depending on the film quality of the surface of the substrate W. Of the hydrophobic film quality and the hydrophilic film quality, the hydrophobic film quality is less likely to blow off the residual processing liquid, and the hydrophilic film quality is more likely to blow off the residual processing liquid. Therefore, how the gas flow G1 is discharged is preferably set in accordance with the film quality of the surface of the substrate W.

Processing Unit 5

The processing unit 5 processes the processing region S3 in the peripheral portion of the upper surface of the substrate W held on the spin chuck 21. Specifically, the processing unit 5 supplies the processing liquid to the processing region S3 of the substrate W held on the spin chuck 21.

The processing unit 5 includes a processing liquid discharge mechanism 830. The processing liquid discharge mechanism 830 discharges the liquid flow L1 of the processing liquid such that the liquid flow L1 comes into contact with a part of the peripheral portion (more specifically, the processing region S3 of the peripheral portion) of the upper surface (to-be-processed surface) of the substrate W held and being rotated on the spin chuck 21. The liquid flow L1 is discharged so as to come into contact with the position PL1 in the rotation path of the peripheral portion of the upper surface (more specifically, the processing region S3). The liquid flow L1 has a liquid columnar shape. The processing liquid discharge mechanism 830 includes the nozzle head 50. The nozzle head 50 is attached to the distal end of an elongated arm 63 of the nozzle moving mechanism 6. The arm 63 extends along the horizontal plane. The nozzle moving mechanism 6 moves the arm 63 to move the nozzle head 50 between its processing position and its retreat position.

The nozzle head 50 includes nozzles 51a to 51d and a holding member holding these nozzles. The holding member includes, for example, a plate-shaped member extending along the horizontal plane and a protruding member protruding upward from one end of the plate-shaped member, which are bonded together, and has an L-shaped cross-sectional shape. The distal end of the protruding member is attached to the distal end of the arm 63, and the plate-shaped member protrudes further in the extension direction of the arm 63 beyond the proximal end of the arm 63 relative to the distal end of the arm 63. The nozzles 51a to 51d are arranged in line along the extension direction of the arm 63 in order from the distal end side of the plate-shaped member. The nozzles 51a to 51d are held by the plate-shaped member while passing through the plate-shaped member vertically. The distal end portions (lower end portions) of the nozzles 51a to 51d protrude downward from the lower surface of the plate-shaped member, each of which includes an outlet at its distal end. The proximal end portions (upper end portions) of the nozzles 51a to 51d protrude upward from the upper surface of the plate-shaped member.

The nozzles 51a to 51d are connected with a processing liquid supply unit 83 that is a pipe system that supplies the processing liquid to these nozzles. Specifically, the upper ends of the nozzles 51a to 51d are connected with first ends of pipes 832a to 832d of the processing liquid supply unit 83. Each of the nozzles 51a to 51d is supplied with the processing liquid from the processing liquid supply unit 83 and discharges the supplied processing liquid through the outlet at its distal end. The processing liquid discharge mechanism 830 discharges the liquid flow L1 of the processing liquid in accordance with the control of the control unit 130 from one nozzle, which is determined by the control information set by the control unit 130, among the nozzles 51a to 51d. In the illustrated example, the liquid flow L1 of the processing liquid is discharged from the nozzle 51c.

Specifically, the processing liquid supply unit 83 is configured as a combination of an SC-1 supply source 831a, a DHF supply source 831b, an SC-2 supply source 831c, a rinse liquid supply source 831d, a plurality of pipes 832a to 832d, and a plurality of on/off valves 833a to 833d. SC-1, DHF, and SC-2 represent chemical solutions. The processing liquid discharge mechanism 830 is thus a chemical solution discharge unit that discharges the chemical solution onto the peripheral portion of the substrate W.

The SC-1 supply source 831a is a supply source that supplies SC-1. The SC-1 supply source 831a is connected to the nozzle 51a through the pipe 832a in which the on/off valve 833a is interposed. When the on/off valve 833a is opened, thus, the SC-1 supplied from the SC-1 supply source 831a is discharged from the nozzle 51a.

The DHF supply source 831b is a supply source that supplies DHF. The DHF supply source 831b is connected to the nozzle 51b through the pipe 832b in which the on/off valve 833b is interposed. When the on/off valve 833b is opened, thus, the DHF supplied from the DHF supply source 831b is discharged from the nozzle 51b.

The SC-2 supply source 831c is a supply source that supplies SC-2. The SC-2 supply source 831c is connected to the nozzle 51c through the pipe 832c in which the on/off valve 833c is interposed. When the on/off valve 833c is opened, thus, the SC-2 supplied from the SC-2 supply source 831c is discharged from the nozzle 51c.

The rinse liquid supply source 831d is a supply source that supplies a rinse liquid. Herein, the rinse liquid supply source 831d supplies, for example, pure water as the rinse liquid. The rinse liquid supply source 831d is connected to the nozzle 51d through the pipe 832d in which the on/off valve 833d is interposed. When the on/off valve 833d is opened, thus, the rinse liquid supplied from the rinse liquid supply source 831d is discharged from the nozzle 51d. The rinse liquid may be, for example, pure water, hot water, ozone water, magnetic water, regenerated water (hydrogen water), various organic solvents (e.g., ion water, isopropyl alcohol, or, IPA, and functional water such as $CO_2$ water). The nozzles 51a, 51b, and 51c that respectively discharge SC-1, DHF, and SC-2 are also referred to as "processing liquid discharge nozzles" or "chemical solution discharge nozzles".

The processing liquid supply unit 83 selectively supplies SC-1, DHF, SC-2, and a rinse liquid. When the processing liquid supply unit 83 supplies the processing liquid (SC-1, DHF, SC-2, or rinse liquid) from a corresponding nozzle among the nozzles 51a to 51d, the nozzle discharges the liquid flow L1 of the processing liquid such that the liquid flow L1 comes into contact with the processing region S3 of the peripheral portion of the upper surface of the substrate W being rotated. It should be noted that each of the on/off valves 833a to 833d of the processing liquid supply unit 83 is opened or closed under the control of the control unit 130 by a valve open/close mechanism (not shown) electrically connected to the control unit 130. That is to say, the control unit 130 controls how the processing liquid is discharged from the nozzles of the nozzle head 50 (such as a type of the processing liquid, a discharge start timing, a discharge end timing, and a discharge flow rate). In other words, the processing liquid discharge mechanism 830 discharges, through the control of the control unit 130, the liquid flow L1 of the processing liquid such that the liquid flow L1 comes into contact with the position PL1 in the rotation path of the peripheral portion of the upper surface of the substrate W being rotated about the rotation axis a1.

Nozzle Moving Mechanism 6

The nozzle moving mechanism 6 is a mechanism that moves the nozzle heads 48 to 50 of the gas discharge mechanisms 440 and 443 and the processing liquid discharge mechanism 830 between their respective processing positions and retreat positions.

The nozzle moving mechanism 6 includes the arms 61 to 63 extending horizontally, nozzle bases 64 to 66, and drives 67 to 69. The nozzle heads 48 to 50 are respectively attached to the distal end portions of the arms 61 to 63.

The proximal end portions of the arms 61 to 63 are connected to the upper end portions of the nozzle bases 64 to 66. The nozzle bases 64 to 66 are arranged dispersedly around the casing 24, with their axis lines extending vertically. The nozzle bases 64 to 66 extend vertically along their axis lines, each of which has a shaft rotatable about the axis line. The axis lines of the nozzle bases 64 to 66 coincide with the axis lines of the respective shafts. The upper end portions of the nozzle bases 64 to 66 are attached to the upper end portions of the respective shafts. The rotations of the shafts causes the upper end portions of the nozzle bases 64 to 66 to rotate about the axis lines of the respective shafts, that is, the axis lines of the nozzle bases 64 to 66. The nozzle bases 64 to 66 are respectively provided with the drives 67 to 69 that rotate their shafts about the axis lines. The drives 67 to 69 each include, for example, a stepping motor.

The drives 67 to 69 respectively rotate the upper end portions of the nozzle bases 64 to 66 via the shafts of the nozzle bases 64 to 66. Along with the rotations of the upper end portions, the nozzle heads 48 to 50 respectively rotate about the axis lines of the nozzle bases 64 to 66. This causes the drives 67 to 69 to respectively move the nozzle heads 48 to 50 horizontally between their processing positions and retreat positions.

When the nozzle head 48 is arranged at the processing position, the outlet of the nozzle 41 is opposed to a part of the rotation path of the peripheral portion of the substrate W rotated by the rotary holding mechanism 2, and the outlet of the nozzle 42 is opposed to another part of the rotation path.

When the nozzle head 49 is arranged at the processing position, the nozzle 43 is located above the center c1 of the substrate W, and the axis line of the nozzle 43 coincides with the rotation axis a1 of the spin chuck 21. The outlet (lower opening) of the nozzle 43 is opposed to the central portion of the substrate W. The lower surface of the shielding plate 90 is opposed to the upper surface of the substrate W in parallel therewith. The shielding plate 90 is close to the upper surface of the substrate W in a contactless manner.

When the nozzle head 50 is arranged at the processing position, the nozzles 51a to 51d are arranged at the processing positions. More strictly, for example, in the case in which the nozzles 51a to 51d are arranged in a line along the extension direction of the arm 63, the distance between the nozzle 51a and the periphery of the circular substrate W, the distance between the nozzle 51b and the periphery of the circular substrate W, the distance between the nozzle 51 and the periphery of the circular substrate W, and the distance between the nozzle 51d and the periphery of the circular substrate W slightly differ from each other. Even when the width of the processing region S3 is small, the drive 69 adjusts the processing position of the nozzle head 50 in accordance with the nozzle that discharges the processing liquid among the nozzles 51a to 51d under the control of the control unit 130 such that the processing liquids selectively discharged from the nozzles 51a to 51d come into contact with the processing region S3.

The respective retreat positions of the nozzle heads 48 to 50 are positions that do not interfere with the transport path of the substrate W and do not interfere with each other. Each retreat position is, for example, a position outside of and above the splash guard 31.

The drives 67 to 69 are electrically connected to the control unit 130 and operate under the control of the control unit 130. The control unit 130 causes the nozzle moving mechanism 6 to arrange the nozzle heads 48 and 50 at the processing positions in accordance with the preset setup information such that the gas flows G1 and G2 and the liquid flow L1 respectively come into contact with the positions P1, P2, and PL1 in the rotation path of the peripheral portion of the substrate W. The positions P1, P2, and PL1 are adjusted by changing the setup information. The control unit 130 causes the nozzle moving mechanism 6 to arrange the nozzle head 49 at the processing position in accordance with the setup information such that the gas flow G3 comes into contact with the center of the substrate W or its vicinity. That is to say, the control unit 130 controls the positions of the nozzle heads 48 to 50. Specifically, the control unit 130 controls the positions of the nozzles 41 to 43 and 51a to 51d.

For the control of the positions P1, P2, and PL1, a central angle θ (FIG. 4) is preferably set to not greater than 180°, more preferably not greater than 90°, and still more preferably not greater than 45°. The central angle θ is formed between the line segments, namely, a line segment connecting the center c1 of the substrate W and the position PL1 that is the landing position of the processing liquid, and a line segment connecting the center c1 and the position P2 with which the gas flow G2 comes into contact. This is because a smaller central angle θ enables the residual processing liquid to stay at each portion of the processing region S3 of the substrate W for a longer period of time, thereby improving a processing rate.

The liquid flow L1 of the processing liquid, which has been discharged onto the position PL1 in the rotation path of the peripheral portion of the upper surface of the substrate W, moves in the circumferential direction of the substrate W while adhering to the processing region S3 in the form of a liquid film. During the movement, the central angle of the circular arc, which connects the portion to which the liquid film of the processing liquid adheres and the position PL1 along the end face of the substrate W, becomes greater. The centrifugal force due to the rotation of the substrate W acts on the liquid film of the processing liquid during the movement. Thus, approximately 80% of the processing liquid is drained out of the substrate W until the central angle reaches 90°. This rate varies depending on, for example, the rotational speed and film quality of the substrate W, and the volume and viscosity of the processing liquid discharged.

If the width of the processing region S3, that is, the width for which the etching process or any other process is intended to be performed is 1 mm, the liquid flow L1 of the processing liquid is preferably discharged so as to come into contact with a portion of the substrate W with a width in the range of 0.5 mm from the periphery of the substrate W. In this case, to efficiently remove the residual processing liquid from the substrate W while restricting splashes that arrive at the to-be-protected region S4, the gas flows G1 and G2 are preferably discharged such that the centers of the cross-sections of the gas flows G1 and G2 of the inert gas come into contact with the portion of the substrate W within the range of, for example, 4 to 8 mm from the periphery of the substrate W. The width of the liquid film of the residual processing liquid that adheres to the peripheral portion of the substrate W normally spreads to be larger than the width of the liquid flow L1 of the processing liquid that comes into contact with the position PL1. Therefore, as described above, the widths of the gas flows G1 and G2 of the inert gas are preferably larger than the width of the liquid flow L1 of the processing liquid that comes into contact with the peripheral portion of the substrate W. Specifically, the widths of the gas flows G1 and G2 of the inert gas are preferably set to be, for example, three to five times the width of the liquid flow L1. The residual processing liquid that adheres to the peripheral portion of the substrate W is thus efficiently drained out of the substrate W by the gas flows G1 and G2.

Heating Mechanism 7

The heating mechanism 7 is provided below the peripheral portion of the lower surface of the substrate W. The heating mechanism 7 includes an annular heater 71 and an electric circuit (not shown) that supplies power to the heater 71 in accordance with the control of the control unit 130.

The heater 71 is arranged annularly around the spin chuck 21 below the peripheral portion of the lower surface so as to be opposed to the portion, with which the upper surface of the spin chuck 21 is not in contact, of the lower surface of the substrate W in a contactless manner. The upper surface of the heater 71 is parallel to the lower surface of the substrate W. The heater 71 is held by a holding member (not shown) provided upright on the casing 24. The heater 71 is provided to improve the processing rate of the substrate W with the processing liquid, and heats the peripheral portion of the substrate W from its lower surface side. The heating mechanism 7 further includes a moving mechanism (not shown) such as a motor. The moving mechanism moves the heater 71 upward or downward to arrange the heater 71 at the processing position or the retreat position below the processing position. The retreat position is a position at which the heater 71 does not interfere with the transport path for the substrate W when the substrate W is transferred to and from the substrate processing apparatus 1. The heater 71 is supplied with power while being arranged at the processing position, and the heater 71 generates heat to heat the peripheral portion of the substrate W.

The electric circuit that supplies power to the heater 71 and the moving mechanism that moves the heater 71 upward or downward are electrically connected to the control unit 130, and operate under the control of the control unit 130. That is to say, the control unit 130 controls how the substrate W is heated by the heater 71 and the position of the heater 71.

1-2. Discharge Directions of Gas Flows and Liquid Flow

Figure 5:
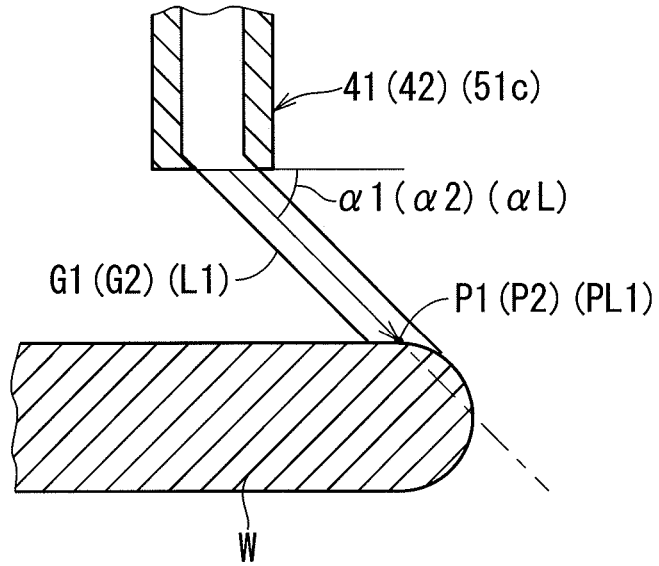
FIG. 5 is a schematic side view for explaining angles of dip of the gas flows and the liquid flow.
Figure 6:
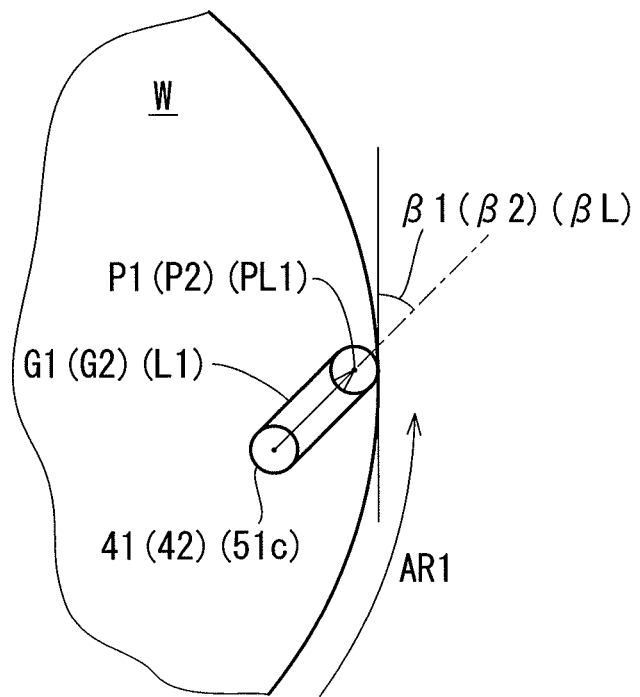
FIG. 6 is a schematic top view for explaining angles of traverse of the gas flows and the liquid flow.

FIGS. 5 and 6 are a schematic side view and a schematic top view, respectively, for explaining angles of dip α1, α2, and αL and angles of traverse β1 and β2 formed by the gas flows G1 and G2 and the liquid flow L1 discharged from the nozzles 41, 42, and 51c of the substrate processing apparatus 1. FIGS. 5 and 6 illustrate the nozzles 41, 42, and 51c as a common nozzle and the gas flows G1 and G2 and the liquid flow L1 as a common flow. The term "angle of dip" refers to an angle formed by the horizontal plane and the direction in which the gas flow G1 (gas flow G2, liquid flow L1) is discharged. The angle of dip is 90° when a gas flow or the like is discharged vertically downward or 0° when it is discharged horizontally. The term "angle of traverse" refers to an angle formed by the tangent on the end face of the substrate W closest to the position P1 (P2, PL1) at which the gas flow G1 (gas flow G2, liquid flow L1) comes into contact with the substrate W and the discharge direction in which the gas flow G1 (gas flow G2, liquid flow L1) is projected onto the substrate W. The angle of traverse is 0° when the discharge direction in the projection extends along the tangential direction or 90° when it extends along the radial direction of the substrate W.

The angles of dip α1 and α2 of the gas flows G1 and G2 are set within the range of 45° to 90°, and the angles of traverse β1 and β2 thereof are also set within the range of 45° to 90°. Preferably, the respective angles of dip α1 and α2 of the gas flows G1 and G2 are set to 45°, and the angles of traverse β1 and β2 thereof are set to 90°. The angles of dip α1 and α2 may differ from each other, and the angles of traverse β1 and β2 may differ from each other.

The angle of dip αL of the liquid flow L1 is set within the range of 30° to 90°, and the angle of traverse β3 thereof is set within the range of 0° to 45°. Preferably, the angle of dip αL and the angle of traverse βL are each set to 45°.

Figure 7:
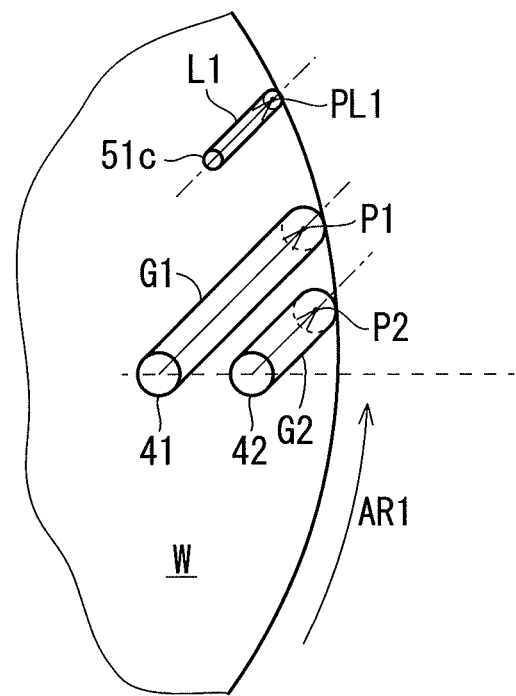
FIG. 7 illustrates an example of how the gas flows and the liquid flow are discharged.
Figure 8:
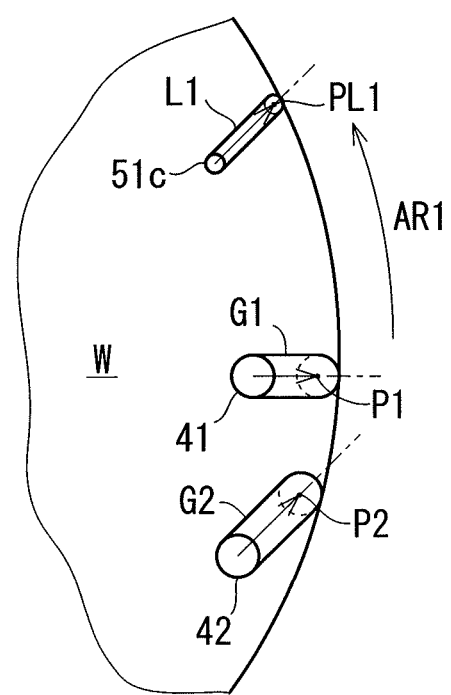
FIG. 8 illustrates another example of how the gas flows and the liquid flow are discharged.

FIGS. 7 and 8 each illustrate an example of how the gas flows G1 and G2 of the inert gas and the liquid flow L1 of the processing liquid are discharged. The circles indicated as the nozzles 41, 42, and 51c represent the outlets of the nozzles 41, 42, and 51c which are projected onto the substrate W. Although the shape of the projected outlet varies depending on the shape, direction, or the like of the outlet, it is indicated as a circle. The regions of the substrate W with which the gas flows G1 and G2 and the liquid flow L1 come into contact are indicated as the respective circles surrounding the positions P1, P2, and PL1. The position P1 is located upstream from the position PL1 in the direction of rotation of the substrate W, and the position P2 is located upstream from the position P1 in the direction of rotation of the substrate W.

In the example illustrated in FIG. 7, the outlets of the nozzles 41 and 42 are arranged along the radial direction of the substrate W. The gas flow G1 discharged from the nozzle 41 comes into contact with the position P1, and the gas flow G2 discharged from the nozzle 42 comes into contact with the position P2. The positions of the outlets of the nozzles 41 and 42 may differ from each other in the radial direction of the substrate W, as described above.

In the example illustrated in FIG. 8, the gas flow G1 and the gas flow G2 are discharged at different angles of traverse. The outlets of the nozzles 41 and 42 are located at the positions different from each other along the direction of rotation of the substrate W. The outlet of the nozzle 42 is located upstream from the outlet of the nozzle 41 in the direction of rotation of the substrate W. In the example of FIG. 8, specifically, the gas flow G1 is discharged at an angle of traverse of 90°, and the gas flow G2 is discharged at an angle of traverse of 45°. In other words, the angle of traverse of the gas flow G2 is smaller than the angle of traverse of the gas flow G1. In this case, the gas flow G2 has the speed components, namely, a speed component directed along the diameter of the substrate W toward the outside of the substrate W, and a speed component directed along the circumferential direction of the substrate W toward the downstream side in the direction of rotation. Thus, as similarly to the gas flow G1, for example, a difference in speed between the residual processing liquid and the gas flow G2 in the direction of rotation of the substrate W is smaller than in the case in which the gas flow G2 is discharged at an angle of traverse of 90°. The gas flow G2 thus drains the residual processing liquid out of the substrate W while restricting the generation of splashes when the gas flow G2 comes into contact with the liquid film of the residual processing liquid, thus reducing the thickness of the liquid film of the residual processing liquid.

1-3. Restriction of Splashes

The processing liquid discharge mechanism 830 of the substrate processing apparatus 1 discharges the liquid flow L1 of the processing liquid such that the liquid flow L1 comes into contact with the position PL1 in the rotation path of the peripheral portion of the upper surface of the substrate W being rotated. The discharged liquid flow L1 adheres to the position of discharge on the peripheral portion of the upper surface (more strictly, processing region S3) of the substrate W in the form of a liquid film, and moves in the circumferential direction of the substrate W together with the peripheral portion of the substrate W.

A gas flow is caused to come into contact with such a liquid film of the residual processing liquid from above to generate a gas flow flowing from the position with which the gas flow has come into contact toward the outside of the substrate W, thereby blowing off a portion of the processing liquid, with which the gas flow has come into contact, toward the outside of the substrate W. This results in a reduced thickness of the portion of the liquid film with which the gas flow comes into contact. As described above, the width of the gas flow of the inert gas is set to be larger than the width of the liquid flow L1 of the processing liquid discharged onto the position PL1. In this case, the widths of the gas flows G1 and G2 are larger than the width of the liquid film of the residual processing liquid that adheres to the peripheral portion of the upper surface of the substrate W. This also causes the processing liquid to move from the position, with which the gas flow comes into contact, to the portions that are located upstream and downstream from the portion, with which the gas flow comes into contact, of the liquid film of the residual processing liquid in the direction of rotation of the substrate W (also merely referred to as "adjacent portions"), resulting in increased thicknesses of the liquid films of the adjacent portions. This causes the liquid film to become wavy at the portion with which the gas flow comes into contact and its adjacent portions. In this case, splashes normally occur mainly from the adjacent portions of the liquid film and scatter toward their surroundings.

The liquid at the portion with which the gas flow comes into contact is blown off more efficiently as the gas flow that comes into contact with a unit area of the surface of the liquid film has higher kinetic energy, thus reducing the thickness of the liquid film and increasing the film thicknesses of the adjacent portions that are adjacent to the portion with which the gas flow comes into contact. If the thickness of the liquid film of the residual processing liquid is constant, larger waves are thus generated in the liquid film as the gas flow that comes into contact with a unit area of the liquid film has higher kinetic energy, increasing an amount and a speed of the splashes of the residual processing liquid generated from the waves.

The thickness of the liquid film formed on the peripheral portion of the upper surface of the rotating substrate W has an upper limit, and thus, if the gas flow that comes into contact with the unit area of the liquid film has constant kinetic energy, the waves generated in the liquid film normally become larger as the liquid film is thicker. This increases an amount and a speed of the splashes generated from the waves.

If the thickness of the liquid film is small, splashes are less likely to occur even when the liquid is blown off momentarily by a gas flow with high kinetic energy, that is, a strong gas flow. On the other hand, if the thickness of the liquid film is large, splashes are likely to occur due to the liquid film becoming wavy. However, if a gas flow with low kinetic energy, that is, a weak gas flow is brought into contact with the liquid film, small waves are generated in the portion with which the gas flow comes into contact and its adjacent portions, thus enabling the liquid film to become thinner gradually while restricting splashes.

In other words, to efficiently drain the residual processing liquid out of the substrate W while restricting the generation of splashes of the residual processing liquid, the processing liquid needs to be drained out efficiently by bringing a gas flow with low kinetic energy (weak gas flow) into contact with the portion with a thick liquid film and bringing a gas flow with high kinetic energy (strong gas flow) into contact with the portion with a thin liquid film. It should be noted that the thickness of the liquid film of the residual processing liquid also varies depending on whether the surface of the substrate W is hydrophilic or hydrophobic. Specifically, if the substrate W has a hydrophilic surface, the residual processing liquid tends to spread across the surface of the substrate W, thus reducing the thickness of the liquid film. On the other hand, if the substrate W has a hydrophobic surface, the processing liquid rises from the surface of the substrate W, thus increasing the thickness of the liquid film.

The gas discharge mechanism 440 of the substrate processing apparatus 1 discharges the gas flows G1 and G2 of the inert gas to efficiently drain the residual processing liquid out of the substrate W while restricting the generation of splashes of the residual processing liquid. Specifically, the gas discharge mechanism 440 discharges the gas flows G1 and G2 such that the gas flow G1 comes into contact with the liquid film of the residual processing liquid at the position P1 upstream from the position PL1 in the direction of rotation of the substrate W, and that the gas flow G2 comes into contact with the liquid film of the residual processing liquid at the position P2 further upstream from the position P1. The kinetic energy (more specifically, the kinetic energy of the gas flow discharged through the outlet per unit time) when the gas flow G1 or G2 is discharged is proportional to the product of the cross-sectional area of the outlet of the nozzle 41 or 42 and the cube of the flow speed in discharge. The kinetic energy of the gas flow that comes into contact with the unit area of the liquid film per unit time is also proportional to the cube of the flow speed of the gas flow. The discharge mechanism 440 discharges the gas flows G1 and G2 such that the kinetic energy of the gas flow G2 when the gas flow G2 is discharged is lower than the kinetic energy of the gas flow G1 when the gas flow G1 is discharged. More specifically, the gas discharge mechanism 440 discharges the gas flows G1 and G2 such that the kinetic energy of a portion of the gas flow G2, which is discharged from the unit cross-sectional area of the outlet per unit time, is lower than the kinetic energy of a portion of the gas flow G1, which is discharged from the unit cross-sectional area of the outlet per unit time.

In the substrate processing apparatus 1, the gas flow G2 with kinetic energy lower than that of the gas flow G1 comes into contact with the liquid film of the residual processing liquid at the position P2 earlier than the gas flow G1. Thus, the film thickness of the residual processing liquid can be reduced while restricting the generation of splashes that arrive at the to-be-protected region S4 (more strictly, splashes with speed at which splashes can arrive at the to-be-protected region S4) from the wave generated on the liquid film by the gas flow G2.

Then, at the position P1 downstream from the position P2, the gas flow G1 comes into contact with the liquid film of the processing liquid with a reduced film thickness. The gas flow G1, which has higher kinetic energy than the gas flow G2, can drain the residual processing liquid out of the substrate W more efficiently. The processing liquid is thinner than in the case in which the gas flow G2 comes into contact with the processing liquid, resulting in a smaller wave generated in the liquid film by the gas flow G1. The gas flow G1 thus drains most of the residual processing liquid out of the substrate W while restricting the generation of splashes that arrive at the to-be-protected region S4.

This restricts a collision of a fresh processing liquid, which is discharged so as to come into contact with the position PL1 downstream from the position P1, with the residual processing liquid. The peripheral portion of the upper surface of the substrate W is thus processed while restricting the processing liquid from entering the to-be-protected region S4 of the upper surface of the substrate W. The kinetic energy of the gas flow G1 (strictly, the kinetic energy of a portion of the gas flow of the gas flow G1, which is discharged per unit time from the unit cross-sectional area of the nozzle 41) is preferably set to, for example, 1.2 to 8 times the kinetic energy of the gas flow G2 (strictly, the kinetic energy of a portion of the gas flow G2, which is discharged from the unit cross-sectional area of the nozzle 42 per unit time). In this case, the ratio of the kinetic energy per unit volume of the gas flow is 1.2 to 4 times.

If the residual processing liquid is drained out of the substrate W at an extremely high speed, a part of the residual processing liquid may be scattered toward the substrate W by being reflected upon the splash guard 31 and arrive at the portion, onto which the gas flow has not been discharged, of the upper surface of the substrate W. The kinetic energy of the gas flow is thus preferably set such that the residual processing liquid reflected upon the splash guard 31 toward the substrate W will not arrive at the substrate W.

Herein, the flow rate of a gas flow is proportional to the product of the cross-sectional area and flow speed of the gas flow. Increasing the flow rate of the gas flow thus also increases the kinetic energy of the gas flow. The gas flows G1 and G2 can thus be discharged such that the flow rate of the gas flow when the gas flow G2 is discharged is lower than the flow rate of the gas flow G1 when the gas flow G1 is discharged. For example, the flow rate of the gas flow G1 is set to 1.1 to 2 times the flow rate of the gas flow G2.

Reducing the flow speed of the gas flow or reducing the cross-sectional area of the gas flow can also reduce the flow rate. Reducing the flow speed reduces the kinetic energy of the gas flow that comes into contact with a unit area of the liquid film of the residual processing liquid per unit time. Thus, the flow speed of the gas flow G2 is preferably set to be lower than the flow speed of the gas flow G1 to set the flow rate of the gas flow G2 to be lower than the flow rate of the gas flow G1. In this case, the weak gas flow G2 can be discharged in a wide range compared with the gas flow G1 by setting the cross-sectional area of the gas flow G2 to be larger than the cross-sectional area of the gas flow G1, thereby reducing the liquid film while restricting splashes from the liquid film with which the gas flow G2 has come into contact.

The gas flow has higher kinetic energy as the gas flow has higher flow speed. The gas flows G1 and G2 can thus be discharged such that the flow speed of the gas flow G2 when the gas flow G2 is discharged is lower than the flow speed of the gas flow G1 when the gas flow G1 is discharged. For example, the flow speed of the gas flow G1 is set to be 1.1 to 2 times the flow speed of the gas flow G2.

1-4. Another Example of Nozzle of Gas Discharge Mechanism

Figure 9:
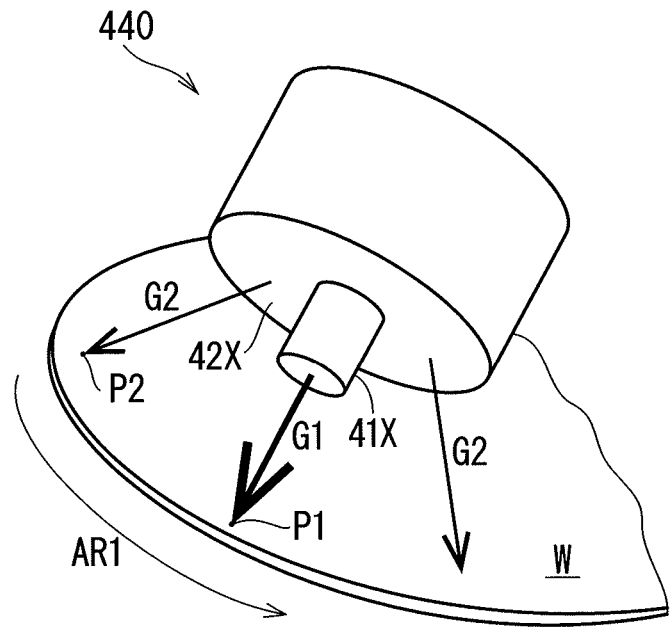
FIG. 9 is a perspective view of an example of nozzles of a gas discharge mechanism for peripheral portion.
Figure 10:
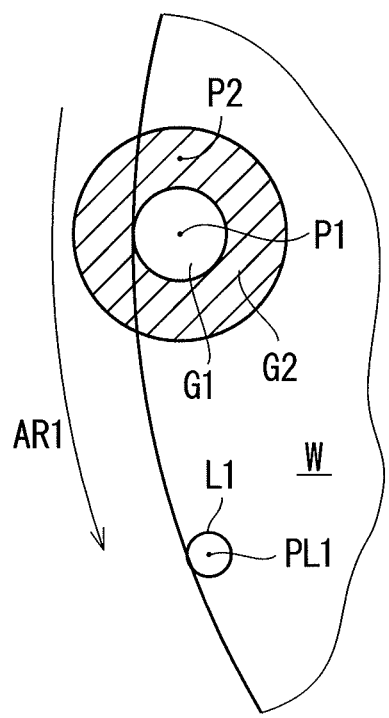
FIG. 10 schematically illustrates positions at which the gas flows discharged from the nozzles of FIG. 9 come into contact with the substrate.

FIG. 9 (FIG. 11) is a perspective view of the distal-end side portions (the portions including the outlets) of nozzles 41X and 42X (41Y and 42Y) as an example of the nozzles that can be included in the gas discharge mechanism 440 in place of the nozzles 41 and 42 of FIG. 1. FIG. 10 (FIG. 12) schematically illustrates the positions at which the gas flows G1 and G2 respectively discharged from the nozzles 41X and 42X (41Y and 42Y) come into contact with the peripheral portion of the substrate W.

The nozzle 41X and the nozzle 42X illustrated in FIG. 9 each have a cylindrical outer shape. The diameter of the outlet of the nozzle 41X is smaller than the diameter of the outlet of the nozzle 42X, and the axis of the nozzle 41X coincides with the axis of the nozzle 42X. In other words, the side wall of the nozzle 41X is surrounded by the side wall of the nozzle 42X. The respective outlets of the nozzles 41X and 42X are opposed to the peripheral portion of the upper surface of the substrate W. The nozzle 41X discharges the columnar gas flow G1, and the nozzle 42X discharges the tubular gas flow G2 having a ring-shaped cross section surrounding the gas flow G1. The gas flow G2 flows along the axis line of the nozzle 42 while spreading outward from the axis line. The kinetic energy of the gas flow G2 when the gas flow G2 is discharged is lower than the kinetic energy of the gas flow G1 when the gas flow G1 is discharged.

The gas flow G1 discharged from the nozzle 41X comes into contact with the position P1 upstream from the position PL1 with which the liquid flow L1 comes into contact, and a part of the gas flow G2 discharged from the nozzle 42X comes into contact with the position P2 further upstream from the position P1. Although a part of the gas flow G2 also comes into contact with the side downstream from the position P1 with which the gas flow G1 comes into contact, the residual processing liquid in the peripheral portion of the substrate W can be reduced while restricting splashes by a part of the gas flow G2 that comes into contact with the position P2 upstream from the position P1 and the gas flow G1 that comes into contact with the position P1. Thus, the utility of the substrate processing apparatus 1 is not impaired. The use of the nozzles 41X and 42X causes a part of the gas flow G2 to come into contact with the substrate W again on the side downstream from the position P1, thereby further reducing the residual processing liquid.

Figure 11:
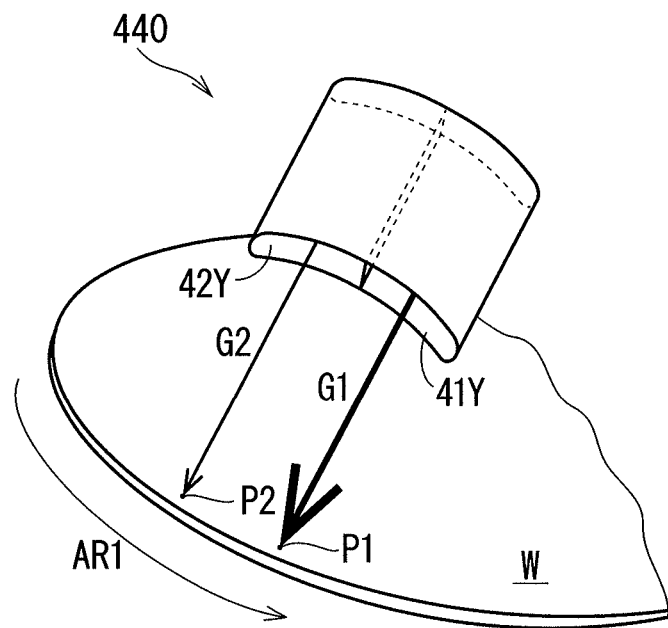
FIG. 11 is a perspective view of another example of nozzles of the gas discharge mechanism for peripheral portion.
Figure 12:
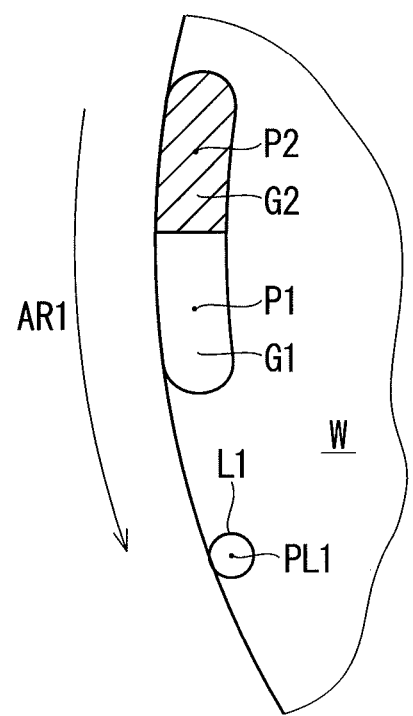
FIG. 12 schematically illustrates positions at which the gas flows discharged from the nozzle of FIG. 11 come into contact with the substrate.

The nozzles 41Y and 42Y illustrated in FIG. 11 are tubular nozzles that are longer along the periphery of the substrate W, each of which has a circular-arc-shaped cross-section with a small width in the radial direction of the substrate W. The outlets of the nozzles 41Y and 42Y are opposed to the peripheral portion of the substrate W. The nozzles 41Y and 42Y are partitioned by a partition wall axially extended such that the cross-sections of the respective flow paths are adjacent to each other along the coaxial circular arc.

The nozzles 41Y and 42Y respectively discharge the gas flows G1 and G2 each having a circular-arc-shaped cross-section along the shape of the periphery of the substrate W. The gas flow G2 is lower than the gas flow G1 in the kinetic energy in discharge.

The gas flow G1 discharged from the nozzle 41Y comes into contact with the position P1 upstream from the position PL1 with which the liquid flow L1 comes into contact, and the gas flow G2 discharged from the nozzle 42Y comes into contact with the position P2 further upstream from the position P1. The gas flow G2 with low kinetic energy can reduce the residual processing liquid while restricting splashes of the residual processing liquid that arrive at the to-be-protected region S4. Most of the residual processing liquid that has not been removed by the gas flow G2 and has remained in the substrate W is removed from the substrate W by the gas flow G1 with kinetic energy higher than that of the gas flow G2. The residual processing liquid also has a liquid film whose thickness has been reduced, thus restricting the generation of splashes that arrive at the to-be-protected region S4 even when the gas flow G1 comes into contact with the to-be-protected region S4. The gas flows G1 and G2 each come into contact with the liquid film in the form of a cross-sectional shape elongated in the circumferential direction of the substrate W, and thus, the kinetic energy of the gas flow G1 and the kinetic energy of the gas flow G2 are dispersed more than in the case in which the gas flows G1 and G2 come into contact with narrow areas. Moreover, the gas comes into contact with the area longer in the circumferential direction of the substrate W than in the case in which the gas flows G1 and G2 come into contact with narrow areas. Thus, even when the kinetic energy per unit area of each gas flow is reduced, each gas flow comes into contact with the liquid film of the residual processing liquid for a longer period of time, thus sufficiently removing the residual processing liquid.

1-5. Operation of Substrate Processing Apparatus

Figure 13:
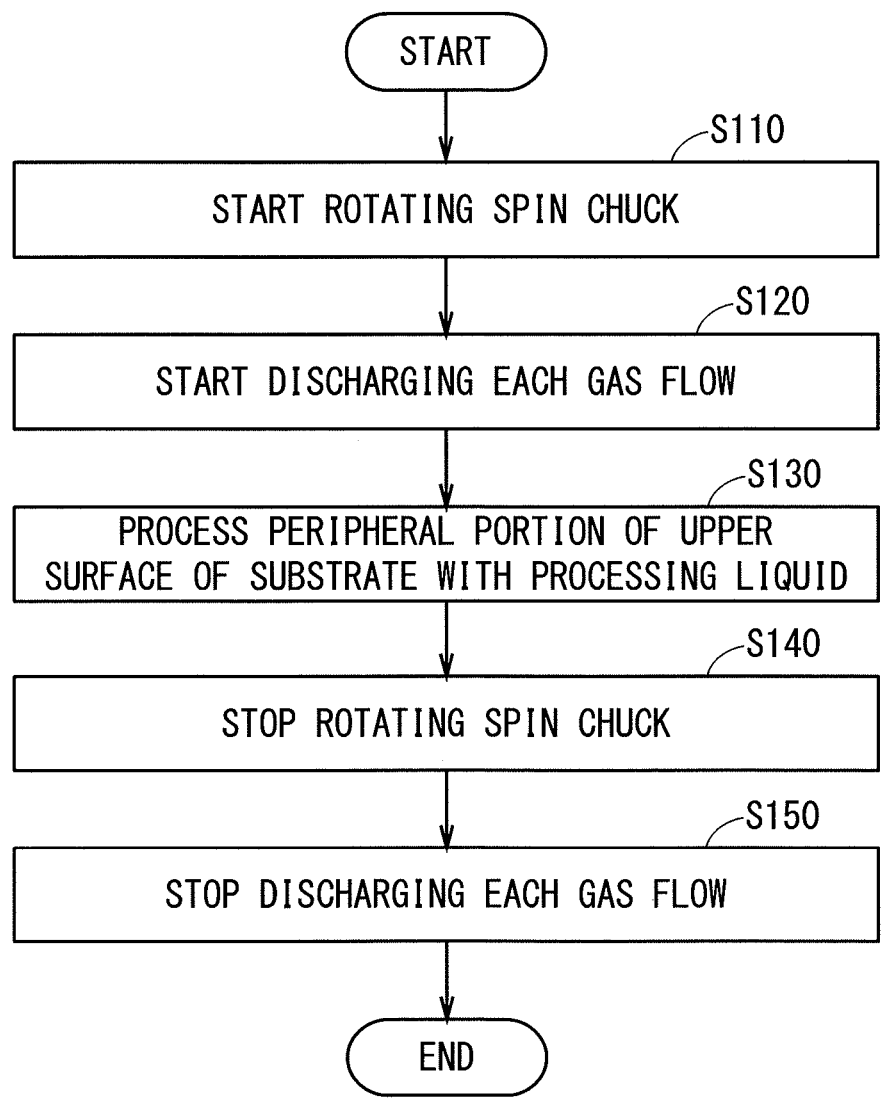
FIG. 13 is a flowchart illustrating an example of the operation of the substrate processing apparatus of FIG. 1.

FIG. 13 is a flowchart illustrating an example operation in which the substrate processing apparatus 1 processes a substrate with a processing liquid. The operation of the substrate processing apparatus 1 will be described below with reference to FIG. 13. Before the operation illustrated in FIG. 13, the substrate W has been transferred into the substrate processing apparatus 1 to be held on the spin chuck 21. The nozzle heads 48 to 50 have been arranged at the processing positions by the nozzle moving mechanism 6, and the splash guard 31 has been arranged at the upper position by the guard drive mechanism 32.

When the process illustrated in FIG. 13 is started, the rotating mechanism 231 of the substrate processing apparatus 1 starts rotating the spin chuck 21 holding the substrate W (step S110). The rotational speed of the substrate W is set to, for example, 1000 rotations per minute.

Then, the gas discharge mechanism 440 starts discharging the gas flows G1 and G2 of an inert gas from the nozzles 41 and 42 of the nozzle head 48, and simultaneously, the gas discharge mechanism 443 starts discharging the gas flow G3 of the inert gas from the nozzle 43 of the nozzle head 49 (step S120). The nozzle 43 discharges the inert gas onto the central portion of the upper surface of the substrate W from above to generate the gas flow G3 spreading from the central portion of the substrate W toward the periphery of the substrate W. The flow rate of the gas flow G3 when the gas flow G3 is discharged from the nozzle 43 is higher than the flow rates of the gas flows G1 and G2 when the gas flows G1 and G2 are discharged.

After the gas discharge mechanisms 440 and 443 have started discharging the gas flows G1, G2, and G3, the heating mechanism 7 starts heating the peripheral portion of the substrate W by the heater 71. After the temperature of the peripheral portion of the substrate W has risen and become stable after a lapse of time, the processing liquid discharge mechanism 830 discharges the liquid flow L1 of the processing liquid such that the liquid flow L1 comes into contact with the peripheral portion of the upper surface of the substrate W (more specifically, the processing region S3 of the peripheral portion of the upper surface on the side closer to the end face of the substrate W), thus processing the peripheral portion of the upper surface (step S130). Specifically, the processing liquid discharge mechanism 830 discharges the liquid flow L1 from one nozzle (in FIG. 1, the nozzle 51c) among the nozzles 51a to 51d in accordance with the control of the control unit 130. The liquid flow L1 is discharged so as to come into contact with the position PL1 defined in the rotation path of the peripheral portion of the upper surface (more specifically, the processing region S3) of the substrate W. The cross-sectional size and flow rate of the liquid flow L1 are set in advance such that the width of the liquid film, which turns from the liquid flow L2 and adheres to the peripheral portion of the substrate, is accommodated in the processing region S3. The liquid flow L1 comes into contact with the position PL1 and then forms a liquid film on the processing region S3. The liquid film of the processing liquid moves in the circumferential direction of the substrate W while adhering to the peripheral portion of the substrate W along with the rotation of the substrate W.

From the viewpoint of improving the processing rate of the substrate W, the discharged processing liquid preferably stays at the position of discharge in the processing region S3 for the longest possible period of time. The central angle, which is formed between the straight line connecting the position PL1 in the rotation path and the center c1 of the substrate W and the straight line connecting the position onto which the liquid flow L1 has been discharged and the center c1, gradually increases along with the rotation of the substrate W. For example, 80% of the processing liquid discharged onto the processing region S3 is drained out of the substrate W mainly by the centrifugal force associated with the rotation of the substrate W while the substrate W rotates until the central angle reaches 90°. After that, the liquid-film-shaped processing liquid that has not been drained out and has remained at the substrate W also moves along with the rotation of the substrate W while being gradually drained out of the substrate W and simultaneously adhering to the processing region S3, thus contributing to processing of the substrate W during the process.

The gas flow G1 (G2), whose discharge has been started from the nozzle 41 (42) in step S120, comes into contact with the liquid film of the residual processing liquid at the position P1 (P2) upstream from the position PL1 in the direction of rotation of the substrate W along the circumferential direction of the substrate W in the rotation path of the substrate W. The position P2 is located upstream from the position P1. Subsequently, the gas flow G1 (G2) flows from the position P1 (P2) toward the periphery of the substrate W by, for example, its discharge direction and the centrifugal force associated with the rotation of the substrate W. In other words, the gas discharge mechanism 440 discharges the gas flow G1 of the inert gas from above onto the position P1 upstream from the position PL1, at which the processing liquid lands, in the direction of rotation of the substrate W in the rotation path of the substrate W, thereby directing the gas flow G1 from the position P1 toward the periphery of the substrate W. Additionally, the gas discharge mechanism 440 discharges the gas flow G2 of the inert gas from above toward the position P2 upstream from the position P1 in the direction of rotation of the substrate W in the rotation path of the substrate W, thereby directing the gas flow G2 from the position P2 toward the periphery of the substrate W.

The gas flow G3 discharged from the nozzle 43 of the gas discharge mechanism 443 spreads from the central portion of the substrate W toward the periphery of the substrate W due to the influence of, for example, the direction in which the gas flow G3 is discharged and the centrifugal force associated with the rotation of the substrate W. In other words, the gas discharge mechanism 443 discharges the inert gas from above the central portion of the upper surface of the substrate W to generate the gas flow G3 spreading from the central portion toward the periphery of the substrate W.

The gas flow G2 first comes into contact with the liquid film of the residual processing liquid in the peripheral portion of the substrate W. The gas flow G2 has low kinetic energy when it is discharged compared with the gas flow G1, thus draining the processing liquid out of the substrate while restricting the generation of splashes that arrive at the to-be-protected region S4. This reduces the film thickness of the residual processing liquid. The gas flow G1 comes into contact with the liquid film of the processing liquid that has not been drained out of the substrate W by the gas flow G2, at the position P1 downstream from the position P2. The gas flow G1 has high kinetic energy when it is discharged compared with the gas flow G2, and thus, most of the remaining processing liquid is drained out of the substrate W by the gas flow G1. The liquid film of the residual processing liquid has been thinned by the gas flow G2 before the gas flow G1 comes into contact with the liquid film. This restricts the generation of splashes that arrive at the to-be-protected region S4 even when the gas flow G1 comes into contact with the liquid film of the residual processing liquid.

As described above, most of the processing liquid discharged at the position PL1 so as to come into contact with the processing region S3 of the substrate W is drained out of the substrate W during one rotation of the substrate W. This restricts the splashes generated due to a processing liquid, which is newly discharged onto the position PL1, coming into contact with the residual processing liquid. While discharging of the gas flows G1 to G3 and discharging of the liquid flow L1 are performed simultaneously, the rotating mechanism 231 repeatedly rotates the substrate W in accordance with the control of the control unit 130. For example, the gas flows G1 to G3 are discharged respectively at flow rates of 12 L/min, 4 L/min, and 30 L/min to 130 L/min.

When the control unit 130 detects a lapse of a processing time required for processing the substrate W, the processing liquid discharge mechanism 830 stops discharging the processing liquid. This completes the process of step S130.

The rotating mechanism 231 stops rotating the spin chuck 21 (step S140), and the heating mechanism 7 stops heating the peripheral portion of the substrate W by the heater 71. The gas discharge mechanisms 440 and 443 stop discharging the gas flows G1 to G3 (step S150). As a result, the operation illustrated in FIG. 13 ends.

After that, the nozzle moving mechanism 6 and the guard drive mechanism 32 respectively move the nozzle heads 48 to 50 and the splash guard 31 to the retreat positions. The substrate W is removed from the spin chuck 21 to be transferred from the substrate processing apparatus 1.

Although the substrate processing apparatus 1 includes the nozzle 43 that discharges the gas flow G3 of the inert gas, the substrate processing apparatus 1 may include no nozzle 43. In such a case, the substrate processing apparatus 1 may include no arm 62 and no nozzle head 49.

Although the nozzles 41 and 42 are held by the nozzle head 48 and moved together by the arm 61, another configuration may be employed in which the nozzles 41 and 42 are held by different nozzle heads and moved individually by different arms.

Although the substrate processing apparatus 1 discharges the nitrogen gas as the gas flows G1 to G3, at least one gas flow of the gas flows G1 to G3 may be an inert gas different from the inert gas of the other gas flows.

Although the nozzles 41 and 42 that respectively discharge the gas flows G1 and G2 of the inert gas and the nozzles that discharge the processing liquid are held by the different nozzle heads 48 and 50 in the substrate processing apparatus 1, another configuration may be employed in which the nozzle 41, the nozzle 42, and the nozzles that discharge the processing liquid are held by the same nozzle head and moved together by an arm or the like.

The nozzles 41Y and 42Y, which are adjacent to each other, are separate nozzles. For example, one nozzle having an outlet elongated in the circumferential direction of the substrate may discharge the gas flow G2 and the gas flow G2 respectively from the upstream portion and the downstream portion thereof in the direction of rotation of the substrate W. Such nozzles are achieved by, for example, providing a structure that will serve as a resistance on the downstream side in the flow path such that the resistance experienced by the gas flowing through the upstream portion of the flow path is higher than that through the downstream portion.

Between the nozzles 41 and 42 or between the nozzles 41Y and 42Y, at least one additional nozzle may be provided that discharges a gas flow of an inert gas such that the gas flow comes into contact with the peripheral portion of the substrate W. The kinetic energy of the gas flow discharged from this at least one additional nozzle may be lower or higher than the kinetic energy of the gas flow G2 discharged from the nozzle 42. This at least one additional nozzle preferably discharges a gas flow such that the kinetic energy of the gas flow of the inert gas discharged onto the peripheral portion of the substrate W becomes higher successively from the upstream side to the downstream side in the direction of rotation of the substrate W.

In the substrate processing apparatus according to the first embodiment configured as described above, at the position P2, the gas flow G2 with kinetic energy lower than that of the gas flow G1 comes into contact with the liquid film of the residual processing liquid at the peripheral portion of the substrate W. This causes the residual processing liquid to be drained out of the substrate W while restricting the generation of splashes of the residual processing liquid that can arrive at the to-be-protected region S4, thus reducing the film thickness of the residual processing liquid. Consequently, the gas flow G1 with high kinetic energy is brought into contact with the portion at which the film thickness of the residual processing liquid has been reduced at the position P1 on the downstream side, thereby draining most of the residual processing liquid out of the substrate W while restricting the generation of splashes of the residual processing liquid that can arrive at the to-be-protected region S4. This restricts the generation of splashes that can arrive at the to-be-protected region S4 of the substrate W due to a collision between a processing liquid newly discharged onto the position PL1 on the further downstream side and the residual processing liquid. The peripheral portion of the upper surface of the substrate W is thus processed while restricting the processing liquid from entering the to-be-protected region S4 of the upper surface of the substrate W.

In the substrate processing apparatus according to the first embodiment configured as described above, the flow rate of the second gas flow when the second gas flow is discharged is lower than the flow rate of the gas flow G1 when the gas flow G1 is discharged. The second gas flow thus drains the residual processing liquid out of the substrate W while restricting the generation of splashes that can arrive at the to-be-protected region S4, thereby reducing the film thickness of the residual processing liquid.

In the substrate processing apparatus according to the first embodiment configured as described above, the flow speed of the second gas flow when the second gas flow is discharged is lower than the flow speed of the gas flow G1 when the gas flow G1 is discharged. The second gas flow thus drains the residual processing liquid out of the substrate W while restricting the generation of splashes that can arrive at the to-be-protected region S4, thereby reducing the film thickness of the residual processing liquid.

In the substrate processing apparatus according to the first embodiment configured as described above, the gas discharge mechanism 443 discharges an inert gas from above the central portion of the upper surface of the substrate W to generate a gas flow spreading from above the central portion of the substrate W toward the periphery of the substrate W. The gas flow generated by the gas discharge mechanism 443 further restricts the splashes that are generated when the second gas flow, the gas flow G1, and a fresh processing liquid sequentially come into contact with the residual processing liquid from arriving at the to-be-protected region S4.

In the substrate processing apparatus according to the first embodiment configured as described above, the flow rate of a gas flow discharged from the gas discharge mechanism 443 when the gas flow is discharged is higher than the flow rate of any of the flow rate of the gas flow G1 when the gas flow G1 is discharged and the flow rate of the second gas flow when the second gas flow is discharged. A large amount of gas flow is supplied to the respective parts of the peripheral portion also in the case in which the gas flow generated by the gas discharge mechanism 443 spreads radially from the central portion of the substrate W toward the peripheral portion of the substrate W.

Figure 14:
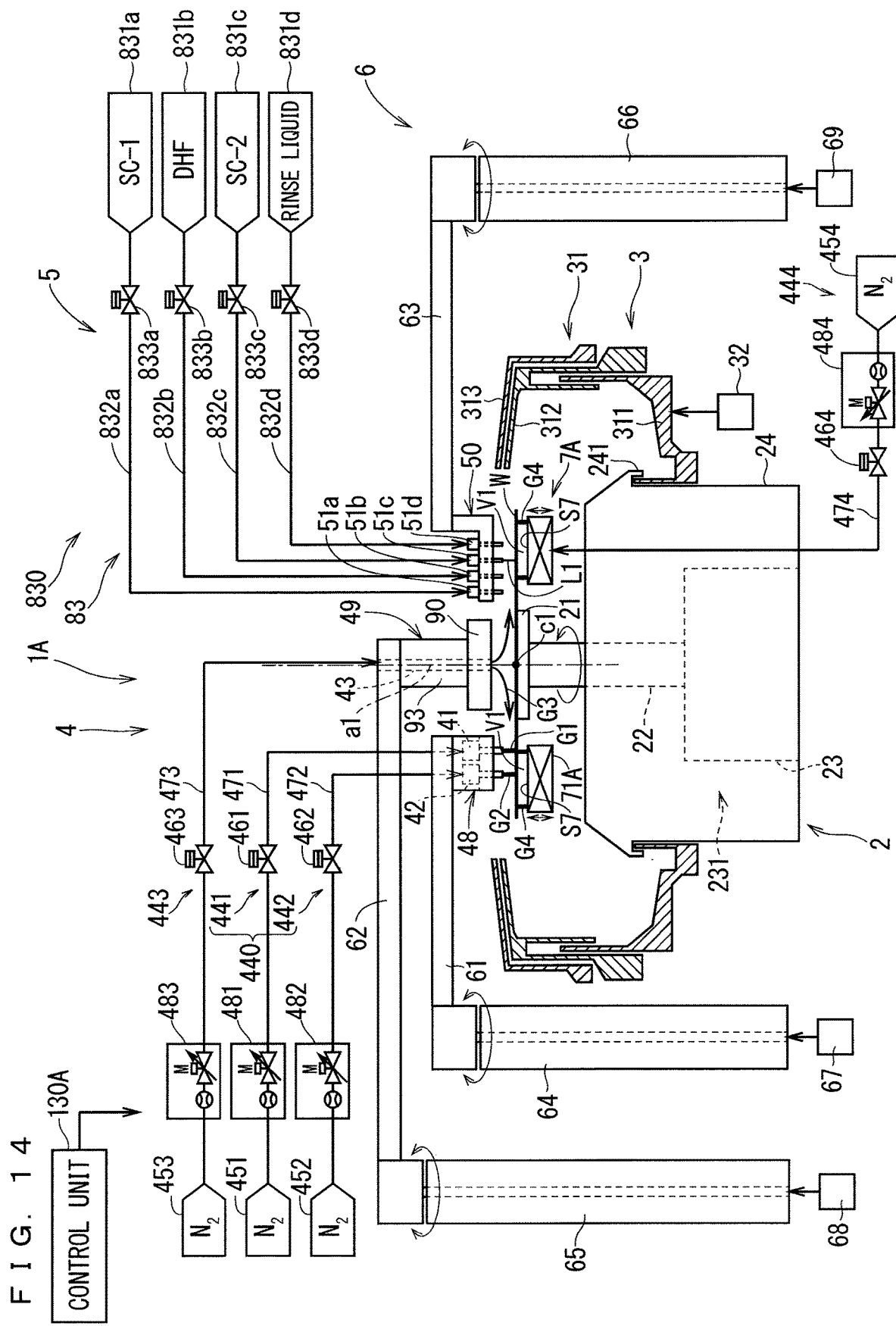
FIG. 14 is a schematic side view for explaining the configuration of the substrate processing apparatus according to the second embodiment of the present invention.

2. Second Embodiment 2-1. Configuration of Substrate Processing Apparatus 1A The configuration of a substrate processing apparatus 1A will be described with reference to FIGS. 2 to 4 and 14. FIGS. 14, 2, and 3 are views for explaining the configuration of the substrate processing apparatus 1A according to an embodiment. FIGS. 14 and 2 are a schematic side view and a schematic top view, respectively, of the substrate processing apparatus 1A. FIG. 3 is a schematic perspective view of the substrate processing apparatus 1A as viewed from diagonally above. FIG. 4 is a schematic top view of a substrate W illustrating an example of a positional relationship among positions at which a liquid flow of a processing liquid and gas flows of an inert gas that are discharged from the substrate processing apparatus 1A come into contact with the peripheral portion of the substrate W.

FIGS. 14, 2, and 3 illustrate a state in which the substrate W is being rotated in a predetermined direction of rotation (the direction of the arrow AR1) about a rotation axis a1 by a spin chuck 21, with nozzle heads 48 to 50 arranged at their respective processing positions. In FIG. 2, the nozzle heads 48 to 50 arranged at the retreat positions and the like are indicated by the phantom lines. FIGS. 2 and 3 do not illustrate partial components of the substrate processing apparatus 1A, such as a scatter prevention unit 3.

The substrate processing apparatus 1A includes a rotary holding mechanism 2, the scatter prevention unit 3, a surface protection unit 4, a processing unit 5, a nozzle moving mechanism 6, a heating mechanism 7A, and a control unit 130A. These units 2 to 6 and 7A are electrically connected to the control unit 130A and operate in response to instructions from the control unit 130A. The control unit 130A is configured similarly to the control unit 130 of the substrate processing apparatus 1. In the control unit 130A, the CPU serving as a main control unit performs computations in accordance with the procedure described in the program. The control unit 130A thus controls the respective units of the substrate processing apparatus 1A.

The units 2 to 6 of the substrate processing apparatus 1A are configured and operate similarly to those of the units 2 to 6 of the substrate processing apparatus 1. The substrate processing apparatus 1A includes the heating mechanism 7A in place of the heating mechanism 7 of the substrate processing apparatus 1. The description of the units 2 to 6 of the substrate processing apparatus 1A will be omitted, and the heating mechanism 7A will now be described.

Heating Mechanism 7A

The heating mechanism 7A is provided below the peripheral portion of the lower surface of the substrate W. The heating mechanism 7A includes an annular heater 71A extending in the circumferential direction of the substrate W along the peripheral portion of the lower surface of the substrate W, a gas discharge mechanism ("shielding gas discharge mechanism") 444, and an electric circuit (not shown) that supplies power to the heater 71A in accordance with the control of the control unit 130A.

FIGS. 15 to 17 are schematic top views of the heater 71A of the heating mechanism 7A. FIG. 15 illustrates a heating element 73 and a heating flow path 74 of the heater 71A. For easy viewing, FIG. 16 does not illustrate the heating flow path 74 of FIG. 15, and FIG. 17 does not illustrate the heating element 73 of FIG. 15. The heating element 73 is illustrated as a region in which the heating element 73 is arranged (arrangement region). The heating flow path 74 is arranged below the heating element 73.

Figure 18:
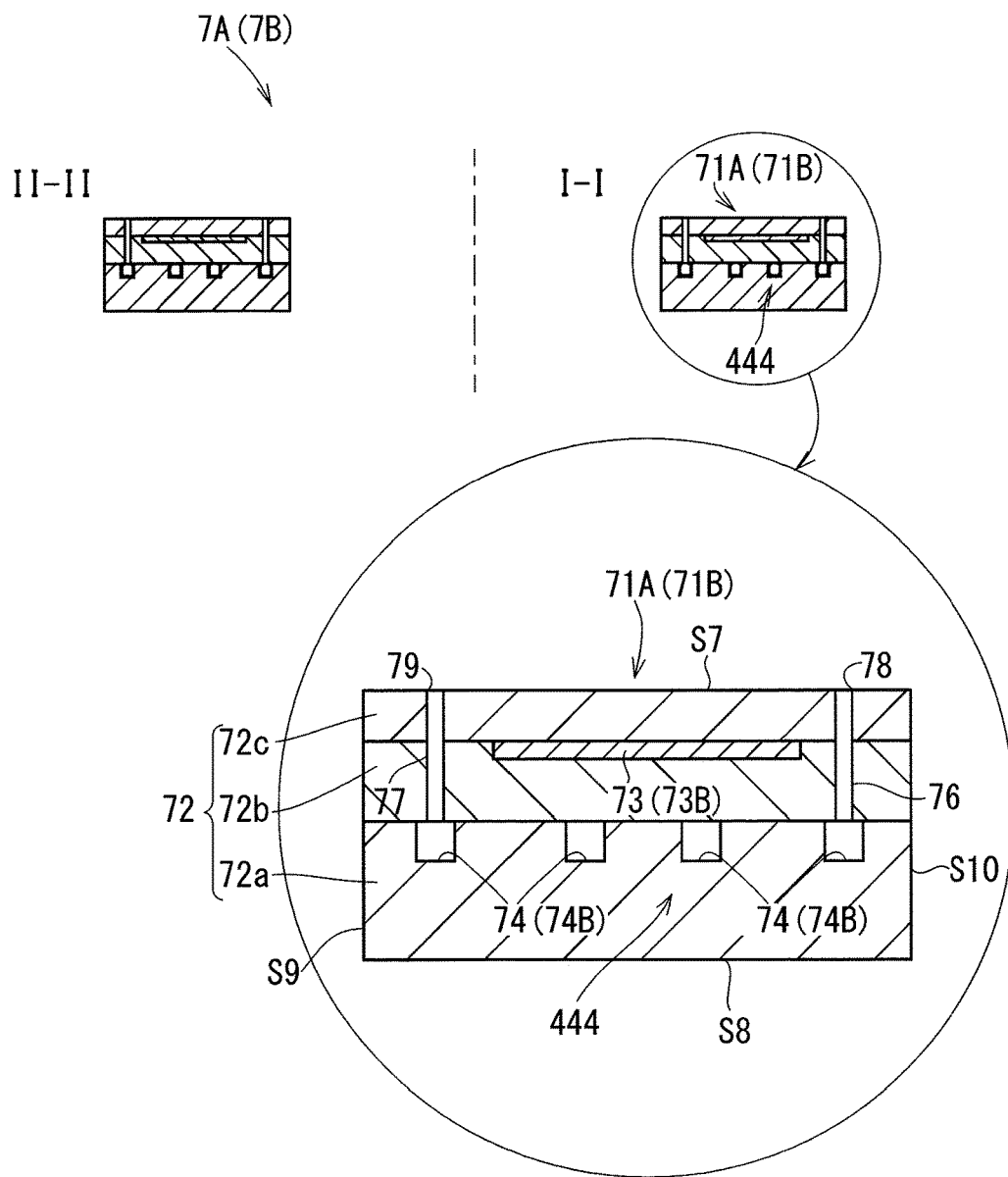
FIG. 18 is a schematic cross-sectional view of a heater of the substrate processing apparatus according to the second (third) embodiment of the present invention.
Figure 19:
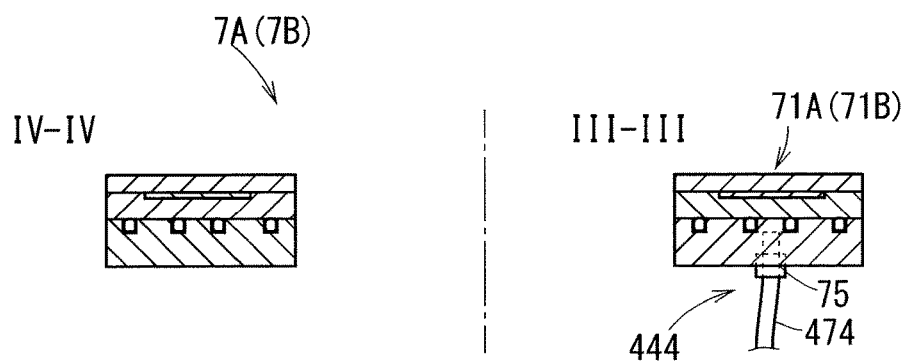
FIG. 19 is a schematic cross-sectional view of the heater of FIG. 18.

FIGS. 18 and 19 are schematic cross-sectional views of the heater 71A of the heating mechanism 7A. FIG. 18 is a longitudinal cross-sectional view of the heater 71A taken along the lines I-I and II-II of FIG. 15, and FIG. 19 is a longitudinal cross-sectional view of the heater 71A taken along the lines and IV-IV of FIG. 15.

The heater 71A is arranged annularly (more specifically, in an annular belt shape) around the spin chuck 21 below the peripheral portion of the lower surface so as to be opposed to the portion, which is not in contact with the upper surface of the spin chuck 21, of the lower surface of the substrate W in a contactless manner. The heater 71A has an annular plate shape. An opposed surface (upper surface) S7 of the heater 71A is parallel to the lower surface of the substrate W. The opposed surface S7 is opposed to the lower surface (that is, a surface opposite to the upper surface being a to-be-processed surface) of the substrate W with an interval of, for example, approximately 2 to 5 mm.

The heater 71A is held by a holding member (not shown) provided upright on the casing 24. The heater 71A is provided to improve the processing rate of the substrate W with a chemical solution and heats the peripheral portion of the substrate W from the lower surface side. The heating mechanism 7A further includes a moving mechanism (e.g., a motor, not shown). The moving mechanism moves the heater 71A upward or downward to dispose the heater 71A at the processing position or the retreat position below the processing position. The retreat position is a position at which the heater 71A does not interfere with the transfer path of the substrate W when the substrate W is transferred to and from the substrate processing apparatus 1A. The heater 71A is supplied with power while being arranged at the processing position. The heater 71A accordingly generates heat to heat the peripheral portion of the substrate W.

The gas discharge mechanism 444 supplies an inert gas to the heating flow path 74 of the heater 71A. The inert gas is preheated by the heater 71A while flowing through the heating flow path 74. The gas discharge mechanism 444 discharges the heated inert gas into a space V1 between the upper surface (opposed surface S7) of the heater 71A and the lower surface of the substrate W. The inert gas discharged into the space V1 restricts the atmosphere around the heater 71A from entering the space V1 and also heats the substrate W.

The heater 71A is a resistance heater including a body portion 72 made of silicon carbide (SiC) or ceramic and the heating element (e.g., a resistance heating element such as a nichrome wire) 73 built in the body portion 72. The heating element 73 is arranged below an annular (more specifically, an annular-belt-shaped) portion of the opposed surface S7 of the heater 71A except for the outer peripheral portion and the inner peripheral portion of the heater 71A, over the entire annular (more specifically, annular-belt-shaped) arrangement region defined along the annular portion. The arrangement region for the heating element 73 is parallel to the lower surface of the substrate W and the opposed surface S7 of the heater 71A. Preferably, the substrate W is uniformly heated with ease if the arrangement region for the heating element 73 is parallel to the lower surface of the substrate W. Inside the heater 71A, a temperature sensor (not shown) is also arranged. The temperature sensor measures the temperature of the heater 71A and transmits the measurement result to the control unit 130A. The control unit 130A controls the power supply to the heating element 73 based on the measurement result.

The heating flow path 74 is arranged along the heating element 73 below the heating element 73. In other words, the heating flow path 74 is arranged opposite to the substrate W relative to the heating element 73. In this case, the heating flow path 74 is not provided between the substrate W and the heating element 73, thus enabling the substrate W to be heated uniformly. The heat radiation and heat transfer from the heating element 73 to the substrate W are not hindered by the inert gas flowing through the heating flow path 74. The heating flow path 74 may be arranged between the substrate W and the heating element 73. To consider that the heating flow path 74 is arranged along the heating element 73, it suffices that the heating flow path 74 is arranged along the arrangement region for the heating element 73. The respective portions of the heating flow path 74 can be uniformly heated with ease if the heating flow path 74 is arranged along the heating element 73. Thee inert gas flowing through the each portion of the heating flow path 74 is thus uniformly heated with ease.

The body portion 72 of the heater 71A includes, for example, a lower member 72a, a middle member 72b, and an upper member 72c sequentially layered from below to above. The members 72a to 72c are annular plate-shaped members extending in the circumferential direction of the substrate W along the peripheral portion of the lower surface of the substrate W.

On the upper surface of the lower member 72a, a groove portion ("recess") forming the heating flow path 74 is extended. The groove portion has a bottom surface and a pair of side surfaces provided upright at the opposite widthwise ends of the bottom surface. The bottom surface and the pair of side surfaces are a bottom surface and a pair of side surfaces, respectively, of the heating flow path 74.

The middle member 72b is bonded onto the lower member 72a with, for example, bolts (not shown). The upper surface of the lower member 72a and the lower surface of the middle member 72b adhere closely to each other. The portion, which closes the groove formed in the upper surface of the lower member 72a, of the lower surface of the middle member 72b is a ceiling surface of the heating flow path 74. In the upper surface of the middle member 72b, an annular and shallow recess in which the heating element 73 is to be arranged is provided along the circumferential direction of the lower member 72a. The heating element 73 is arranged in the recess. The recess is an arrangement region for the heating element 73.

The upper member 72c is bonded onto the middle member 72b in which the heating element 73 is arranged with, for example, bolts (not shown). The upper surface of the middle member 72b and the lower surface of the upper member 72c adhere closely to each other except for in the recess provided in the upper surface of the middle member 72b. The upper surface of the upper member 72c is the opposed surface S7 of the heater 71A.

In the example illustrated in FIG. 15, the heating flow path 74 is repeatedly arranged as follows: it makes approximately one loop around the inner peripheral surface S9 of the heater 71A in the circumferential direction, is then doubled back toward the outer peripheral surface S10 of the heater 71A in the plane extending along the opposed surface S7, and makes approximately one loop around the heater 71A in the opposite direction. Consequently, the heating flow path 74 is arranged across the inner peripheral surface S9 of the heater 71A and the outer peripheral surface S10 of the heater 71A so as to make approximately four loops by being doubled back each time it makes approximately one loop around the inner peripheral surface S9 of the heater 71A in the circumferential direction of the heater 71A. The heating flow path 74 cuts across four locations of the longitudinal cross-section of the heater 71A in the circumferential direction of the heater 71A. The four locations are arranged sequentially at intervals along the radial direction of the heater 71A. The innermost (innermost peripheral) portion, that is, the portion with the smallest diameter of the heating flow path 74 is, when seen through from above, arranged between the inner periphery of the heater 71A and the inner periphery of the arrangement region for the heating element 73 along both of the inner peripheries. The outermost (outermost peripheral) portion, that is, the portion with the largest diameter of the heating flow path 74 is, when seen through from above, arranged between the outer periphery of the arrangement region for the heating element 73 and the outer periphery of the heater 71A along both of the outer peripheries.

As described above, the arrangement region for the heating element 73 is parallel to the lower surface of the substrate W. The heating flow path 74 is arranged two-dimensionally along the heating element 73 below the heating element 73. To consider that the heating flow path 74 is arranged two-dimensionally, it suffices that an imaginary plane in which the heating flow path 74 is entirely arranged can be grasped. If the heating flow path 74 is arranged two-dimensionally along the heating element 73, the heating flow path 74 can be made longer, and the distance from each portion of the heating flow path 74 to the heating element 73 can be made uniform. This facilitates sufficient heating of the inert gas flowing through each portion of the heating flow path 74 by the heating element 73 and uniform heating of the inert gas flowing through each portion of the heating flow path 74 at each portion.

As a portion of the heating flow path 74, which is arranged below the heating element 73 along the heating element 73, is longer, the inert gas flowing through the heating flow path 74 is heated by the heating element 73 for a longer period of time. The path in which the heating flow path 74 is arranged may be, for example, various arrangement paths such as a path looping in the circumferential direction of the heater 71A while meandering below the heating element 73. Although the heating flow path 74 makes approximately four loops around the inner peripheral surface S9 of the heater 71A in the example illustrated in FIG. 17, the number of loops may be less than or more than four. Alternatively, the heating flow path 74 may be arranged along the heating element 73 one-dimensionally or three-dimensionally. To consider that the heating flow path 74 is arranged three-dimensionally, it suffices that a three-dimensional region in which the heating flow path 74 is entirely arranged can be grasped.

In the lower portion of the heater 71A, an introduction hole 75 for introducing an inert gas into the heating flow path 74 is formed. The introduction hole 75 at its lower end is open to the lower surface of the lower member 72a and at its upper end is open to the bottom surface of an approximately central portion of the heating flow path 74 in the longitudinal direction of the heating flow path 74. The lower end of the introduction hole 75 is connected with the second end of a pipe 474. The introduction hole 75 is in communication with each of the pipe 474 and the heating flow path 74. The inert gas supplied from the gas supply source 454 of the gas discharge mechanism 444 through the pipe 474 is introduced into the heating flow path 74 through the introduction hole 75.

In the opposed surface S7 of the heater 71A, a plurality of (in the illustrated example, 12) outlets 78 and a plurality of (in the illustrated example, 12) outlets 79 are provided to be opposed to the lower surface of the substrate W.

The plurality of outlets 78 are provided in the outer peripheral portion of the heater 71A, and the plurality of outlets 79 are provided in the inner peripheral portion of the heater 71A. More specifically, the plurality of outlets 78 are, in a top view, distributed sparsely in the circumferential direction of the heater 71A between the outer periphery of the heater 71A and the outer periphery of the arrangement region for the heating element 73. The plurality of outlets 79 are, in a top view, distributed sparsely in the circumferential direction of the heater 71A between the inner periphery of the heater 71A and the inner periphery of the arrangement region for the heating element 73. Consequently, the flow paths (through holes 76 and 77) connecting the outlet for the inert gas and the heating flow path 74 can be arranged easily, thus easily achieving a configuration in which a gas is discharged from an outlet formed in the opposed surface S7 of the heater 71A including the heater 71A. Also, the heater 71A can be miniaturized easily.

The plurality of outlets 78 are connected with the outermost (outermost peripheral) portion of the heating flow path 74 through the plurality of through holes 76. The plurality of outlets 79 are connected with the innermost (innermost peripheral) portion of the heating flow path 74 through the plurality of through holes 77. The plurality of through holes 76 and 77 respectively pass through the upper member 72c and the middle member 72b vertically. The plurality of through holes 76 are open to the ceiling surface of the outermost portion of the heating flow path 74. The plurality of through holes 77 are open to the ceiling surface of the innermost portion of the heating flow path 74.

The gas discharge mechanism 444 includes a gas supply source 454, the pipe 474, a flow rate controller 484, an on/off valve 464, the introduction hole 75, the heating flow path 74, the plurality of through holes 76 and 77, and the plurality of outlets 78 and 79. The gas supply source 454 supplies an inert gas (in the illustrated example, nitrogen ($N_2$) gas). The pipe 474 is connected at a first end to the gas discharge mechanism 444 and at a second end to the introduction hole 75.

At some midpoint in the pipe 474, the flow rate controller 484 and the on/off valve 464 are provided sequentially from the gas supply source 454 side. The introduction hole 75, the heating flow path 74, the through hole 76, and the through hole 77 are provided in the heater 71A. The gas discharge mechanism 444 supplies an inert gas from the gas supply source 454 to the pipe 474. The flow rate controller 484 controls the flow rate of the gas flowing through the pipe 474. The inert gas is introduced through the pipe 474 and the introduction hole 75 into an approximately central portion of the heating flow path 74 in the longitudinal direction of the heating flow path 74. The introduced inert gas is divided into two gas flows flowing in the opposite directions along the path of the heating flow path 74 to flow through the heating flow path 74.

The gas that has flowed in one direction flows through the portion (specifically, the portion with the second smallest looping diameter) of the heating flow path 74 making approximately one loop around the heater 71A below the heating element 73. During the flowing, the gas is heated by the heating element 73 thereabove. Subsequently, the inert gas flows through the portion (the portion with the smallest looping diameter) closest to the inner peripheral surface S9 of the heater 71A. The portion of the heating flow path 74 closest to the inner peripheral surface S9 is arranged slightly inward of the inner periphery of the heating element 73 (on the side closer to the rotary shaft 22), and thus, the inert gas is also heated when flowing through this flow path. The inert gas then passes through the plurality of through holes 77 to be discharged through the plurality of outlets 79 into the space V1.

The gas that has been introduced into the heating flow path 74 and then flowed in the other direction flows through the portion (the portion with the second largest looping diameter) of the heating flow path 74 making approximately one loop around the heater 71A below the heating element 73. During the flowing, the gas is heated by the heating element 73. Subsequently, the inert gas flows through the outermost portion (the portion with the largest looping diameter) of the heating flow path 74. The outermost portion is arranged slightly outward of the outer periphery of the heating element 73 (opposite to the rotary shaft 22), and thus, the inert gas is also heated when flowing through this portion. The inert gas then passes through the plurality of through holes 76 to be discharged into the space V1 through the plurality of outlets 78.

As described above, the inert gas discharged into the space V1 is preheated by the heating element 73 while flowing through the heating flow path 74. Thus, the gas can be heated sufficiently without another heater provided for heating the inert gas.

The flow rate controller 484 includes, for example, a flowmeter that detects the flow rate of a gas flowing through the pipe 474 and a variable valve that can adjust the flow rate of the gas in accordance with a valve open/close amount. The control unit 130A controls the open/close amount of the variable valve of the flow rate controller 484 via a valve control mechanism (not shown) such that the flow rate detected by the flowmeter of the flow rate controller 484 is equal to a target flow rate. The control unit 130A sets a target flow rate within a predetermined range in accordance with the predetermined setting information to freely control the flow rate of the gas passing through the flow rate controller 484 within the predetermined range. The control unit 130A also controls the on/off valve 464 between the open state and the closed state via the valve control mechanism.

Thus, the control unit 130A controls how the gas flow G4 of the inert gas is discharged through the plurality of outlets 78 and 79 (such as a discharge start timing, a discharge end timing, and a discharge flow rate).

The electric circuit that supplies power to the heater 71A and the moving mechanism that moves the heater 71A upward or downward is electrically connected to the control unit 130A and operates under the control of the control unit 130A. In other words, the control unit 130A controls how the heater 71A heats the substrate W and the inert gas (such as the temperature of the substrate W and the temperature of the discharged inert gas) and also controls the position of the heater 71A.

2-2. Action of Shielding Gas

Figure 20:
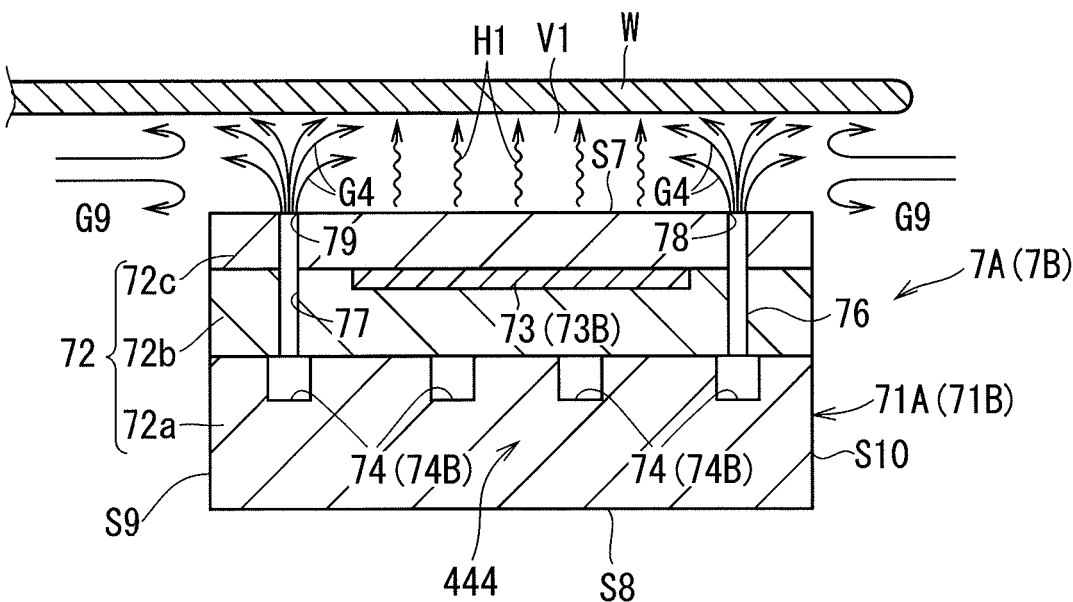
FIG. 20 illustrates an example inert gas discharged between the heater of FIG. 18 and the substrate.

FIG. 20 illustrates an example of the gas flow G4 of the inert gas discharged into a space between the heater 71A and the substrate. The heater 71A radiates rays of heat H1 onto the lower surface of the substrate W from the opposed surface S7 by heat generation of the heating element 73, thereby heating the substrate W. The inert gas supplied from the gas discharge mechanism 444 is introduced into the heating flow path 74 and is preheated by the heating element 73 while flowing through the heating flow path 74. The heated gas passes through holes 76 and 77 to be discharged through the outlets 78 and 79 into the space V1 as the gas flow G4 of the inert gas.

The gas flow G4 flows from each of the outlets 78 and 79 toward the periphery of the substrate W and the center of the substrate W. On the side close to the periphery of the substrate W relative to the heater 71A and the side close to the center of the substrate W relative to the heater 71A, an atmosphere G9 of lower temperature than that of the gas flow G4 is present. The gas flow G4 discharged through the outlet 78 and directed toward the periphery of the substrate W restricts the atmosphere G9 present on the side close to the periphery of the substrate W relative to the heater 71A from entering the space V1. The gas flow G4 discharged through the outlet 79 and directed toward the center of the substrate W restricts the atmosphere G9 present on the side close to the center of the substrate W relative to the heater 71A from entering the space V1. This restricts a temperature drop of the peripheral portion of the substrate W. Thus, the heating efficiency of the substrate W by the heater 71A is restricted from dropping due to the atmosphere G9. The gas flow G4, which has been preheated, contributes to heating of the substrate W.

The inert gas discharged from the gas discharge mechanism 441 servers as a shielding gas to prevent the atmosphere G9 from entering the space V1, as well as a heating gas to heat the substrate W.

Figure 21:
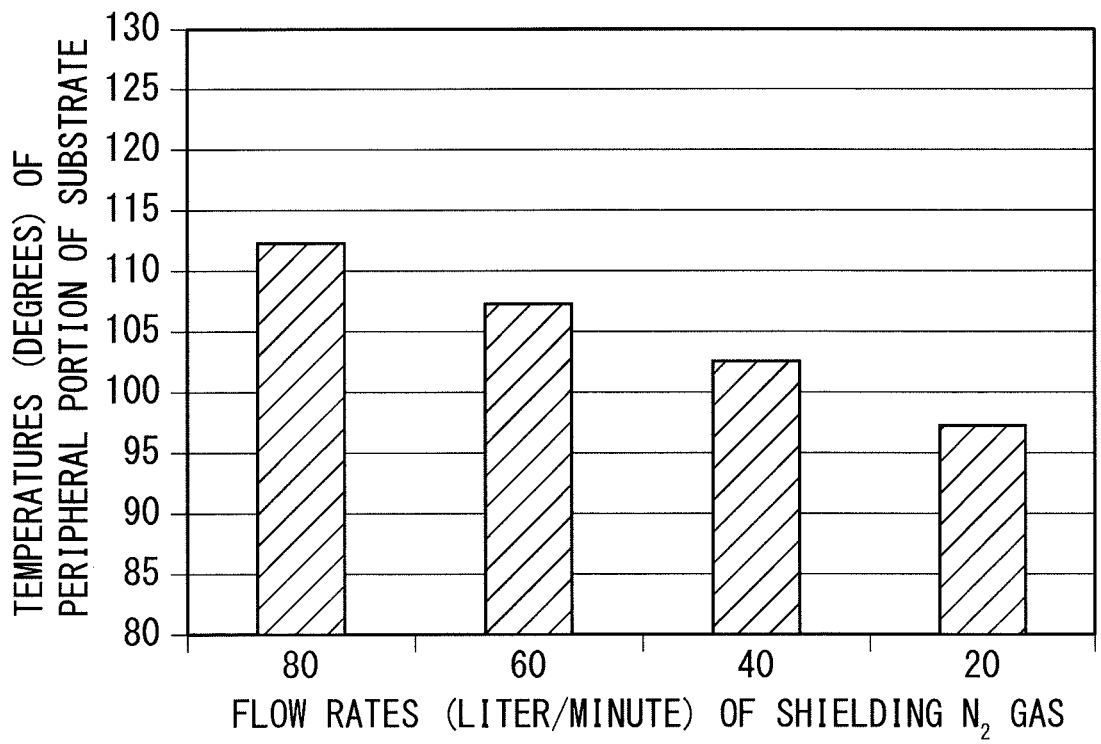
FIG. 21 graphically illustrates an example relationship between a flow rate of an inert gas and a temperature of a peripheral portion of the substrate.

FIG. 21 graphically illustrates an example relationship between the flow rate of the gas flow G4 of the inert gas and the temperature of the peripheral portion of the substrate W. The flow rate of the gas flow G4 of the inert gas (specifically, nitrogen gas) discharged onto the lower surface of the substrate W through the outlets 78 and 79 of the heater 71A is varied in four ways: 80 L/min, 60 L/min, 40 L/min, and 20 L/min. The temperature of the peripheral portion of the substrate W in FIG. 21 is the temperature of the portion of the substrate W, which is 3 mm inside of the periphery of the substrate W. The temperatures after 300 seconds from the start of discharging of the gas flow G4 are measured. The exhaust pressure of a chamber that accommodates the substrate processing apparatus 1A is 250 Pa.

As illustrated in FIG. 21, as the flow rate of the gas flow G4 is higher, the temperature of the peripheral portion of the substrate W is higher. This reveals that by discharging the preheated gas flow G4 through the outlets 78 and 79 of the heater 71A, the atmosphere G9 can be restricted from entering the space V1, thereby efficiently heating the substrate W by the heater 71A.

2-3. Operation of Substrate Processing Apparatus

Figure 22:
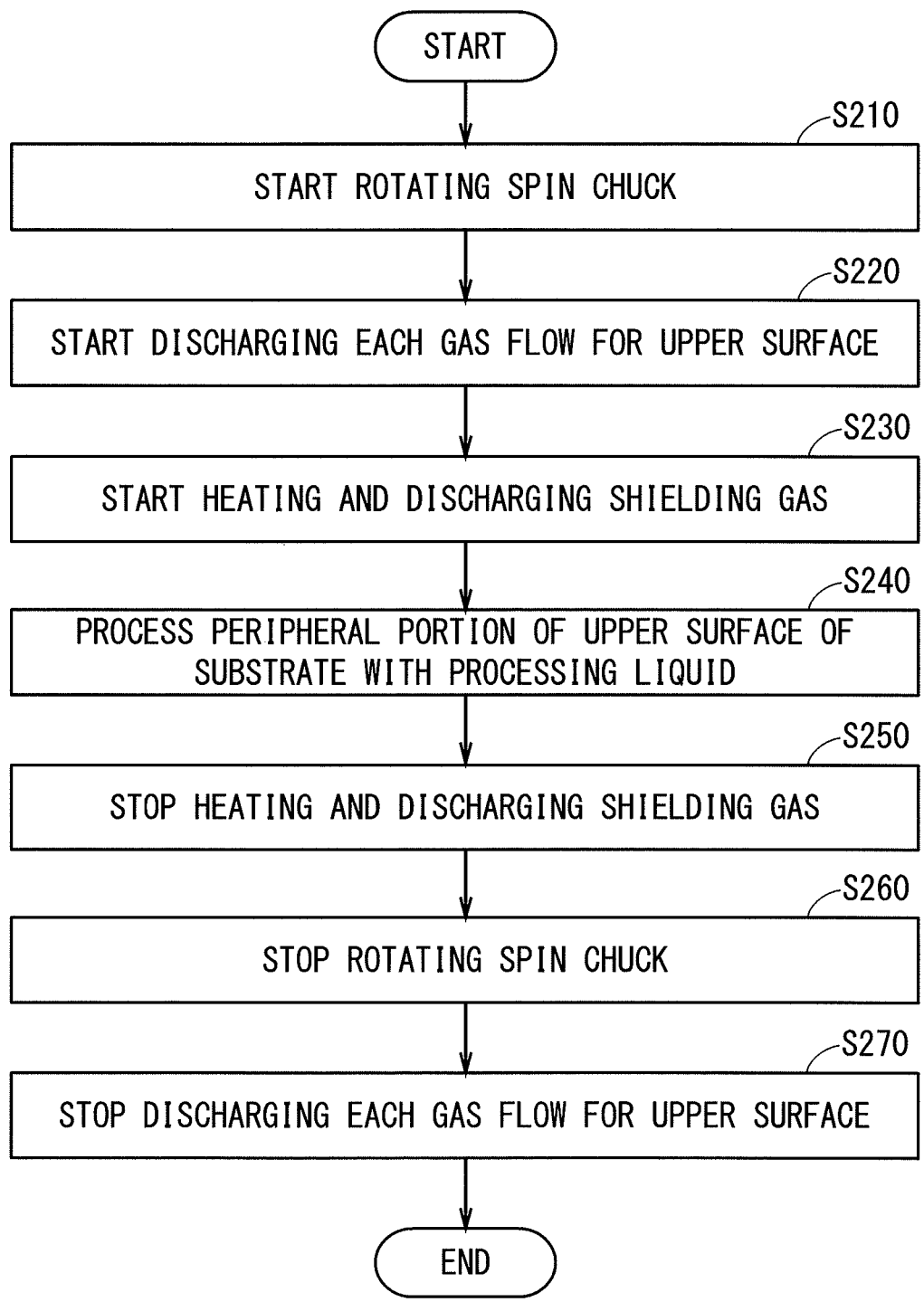
FIG. 22 is a flowchart illustrating an example operation of the substrate processing apparatus of FIG. 14.

FIG. 22 is a flowchart illustrating an example operation in which the substrate processing apparatus 1A processes a substrate with a processing liquid. The operation of the substrate processing apparatus 1A will be described below with reference to FIG. 22. Before the operation illustrated in FIG. 22, the substrate W has been transferred to the substrate processing apparatus 1A to be held on the spin chuck 21. The nozzle heads 48 to 50 have been arranged at the processing positions by the nozzle moving mechanism 6, and the splash guard 31 is arranged at the upper position by the guard drive mechanism 32.

When the process illustrated in FIG. 22 is started, the rotating mechanism 231 of the substrate processing apparatus 1A starts rotating the spin chuck 21 holding the substrate W (step S210). The rotational speed of the substrate W is set to, for example, 1000 rotations per minute.

Then, the gas discharge mechanism 440 starts discharging the gas flows G1 and G2 of the inert gas from the nozzles 41 and 42 of the nozzle head 48, and the gas discharge mechanism 443 starts discharging the gas flow G3 of the inert gas from the nozzle 43 of the nozzle head 49 (step S220). The nozzle 43 discharges the inert gas onto the central portion of the upper surface of the substrate W from above to generate the gas flow G3 spreading from the central portion of the substrate W toward the periphery of the substrate W. The flow rate of the gas flow G3 when the gas flow G3 discharged from the nozzle 43 is discharged is higher than the flow rates of the gas flows G1 and G2 when the gas flows G1 and G2 are discharged.

After the discharge of the gas flows G1 to G3 has been started, the heating mechanism 7A starts heating the peripheral portion of the substrate W by the heater 71A. The heater 71A is heated to, for example, approximately 185°. The gas discharge mechanism 444 of the heating mechanism 7A starts supplying the inert gas from the gas supply source 454 at a flow rate of, for example, 40 L/min to 60 L/min to start discharging the gas flow G4 through the plurality of outlets 78 and 79 formed in the opposed surface S7 of the heater 71A (step S230). The inert gas is heated to be higher than the processing temperature (e.g., 60° C. to 90° C.) of the substrate W.

After the temperature of the peripheral portion of the substrate W has risen and become stable after a lapse of time, the processing liquid discharge mechanism 830 discharges the liquid flow L1 of the processing liquid (chemical solution) such that the liquid flow L1 comes into contact with the peripheral portion of the upper surface of the substrate W (more specifically, the processing region S3 of the peripheral portion of the upper surface on the side closer to the end face of the substrate W), thus processing the peripheral portion of the upper surface (step S240). Specifically, the processing liquid discharge mechanism 830 discharges the liquid flow L1 from one nozzle (in FIG. 14, the nozzle 51c) among the nozzles 51a to 51d in accordance with the control of the control unit 130A. The liquid flow L1 is discharged so as to come into contact with a position PL1 defined in the rotation path of the peripheral portion of the upper surface of the substrate W (more specifically, the processing region S3). The cross-sectional size and flow rate of the liquid flow L1 are set in advance such that the width of the liquid film, which turns from the liquid flow L1 and adheres to the peripheral portion of the substrate W, fits in the processing region S3. The liquid flow L1 comes into contact with the position PL1 and then forms a liquid film on the processing region S3. The liquid film of the processing liquid moves in the circumferential direction of the substrate W while adhering to the peripheral portion of the substrate W along with the rotation of the substrate W.

From the viewpoint of improving the processing rate of the substrate W, the discharged processing liquid preferably stays at the position of discharge in the processing region S3 for the longest possible period of time. The central angle, which is formed between the straight line connecting the position PL1 in the rotation path and the center c1 of the substrate W and the straight line connecting the position onto which the liquid flow L1 has been discharged and the center c1, gradually increases along with the rotation of the substrate W. For example, 80% of the processing liquid discharged onto the processing region S3 is drained out of the substrate W mainly by the centrifugal force associated with the rotation of the substrate W while the substrate W rotates until the central angle reaches 90°. After that, the liquid-film-shaped processing liquid that has not been drained out and has remained in the substrate W also moves along the circumferential direction of the substrate W while being gradually drained out of the substrate W and simultaneously adhering to the processing region S3, thus contributing to processing of the substrate W during the process.

The gas flow G1 (G2), whose discharge has been started from the nozzle 41 (42) in step S220, comes into contact with the liquid film of the residual processing liquid at the position P1 (P2) upstream from the position PL1 in the direction of rotation of the substrate W along the circumferential direction of the substrate W in the rotation path of the substrate W. The position P2 is upstream from the position P1. Subsequently, the gas flow G1 (G2) flows from the position P1 (P2) toward the periphery of the substrate W by, for example, its discharge direction and the centrifugal force associated with the rotation of the substrate W. In other words, the gas discharge mechanism 440 discharges the gas flow G1 of the inert gas from above onto the position P1 upstream from the position PL1, at which the processing liquid lands, in the direction of rotation of the substrate W in the rotation path of the substrate W, thereby directing the gas flow G1 from the position P1 toward the periphery of the substrate W. Additionally, the gas discharge mechanism 440 discharges the gas flow G2 of the inert gas from above toward the position P2 upstream from the position P1 in the direction of rotation of the substrate W in the rotation path of the substrate W, thereby directing the gas flow G2 from the position P2 toward the periphery of the substrate W.

The gas flow G3 discharged from the nozzle 43 of the gas discharge mechanism 443 spreads from the central portion of the substrate W toward the periphery of the substrate W due to the influence of, for example, the direction in which the gas flow G3 is discharged and the centrifugal force associated with the rotation of the substrate W. In other words, the gas discharge mechanism 443 discharges the inert gas from above the central portion of the upper surface of the substrate W to generate the gas flow G3 spreading from the central portion toward the periphery of the substrate W.

The gas flow G2 first comes into contact with the liquid film of the residual processing liquid in the peripheral portion of the substrate W. The gas flow G2 has low kinetic energy when it is discharged compared with the gas flow G1, thus draining the processing liquid out of the substrate while restricting the generation of splashes that arrive at the to-be-protected region S4. This reduces the film thickness of the residual processing liquid. The gas flow G1 comes into contact with the liquid film of the processing liquid that has not been drained out of the substrate W by the gas flow G2 and has remained in the substrate W, at the position P1 downstream from the position P2. The gas flow G1 has high kinetic energy when it is discharged compared with the gas flow G2, and thus, most of the remaining processing liquid is discharged out of the substrate W by the gas flow G1. The liquid film of the residual processing liquid has been thinned by the gas flow G2 before the gas flow G1 comes into contact with the liquid film. This restricts the generation of splashes that arrive at the to-be-protected region S4 even when the gas flow G1 comes into contact with the liquid film of the residual processing liquid.

As described above, most of the processing liquid discharged at the position PL1 so as to come into contact with the processing region S3 of the substrate W is drained out of the substrate W during one rotation of the substrate W. This restricts the splashes generated due to a processing liquid, which is newly discharged onto the position PL1, coming into contact with the residual processing liquid. While discharging of the gas flows G1 to G3 and discharging of the liquid flow L1 are performed simultaneously, the rotating mechanism 231 repeatedly rotates the substrate W in accordance with the control of the control unit 130A. For example, the gas flows G1 to G3 are discharged respectively at flow rates of 12 L/min, 4 L/min, and 30 L/min to 130 L/min.

When the control unit 130A detects a lapse of a processing time required for processing the substrate W, the processing liquid discharge mechanism 830 stops discharging the processing liquid. This completes the process of step S240.

The heating mechanism 7A stops supplying power to the heater 71A to stop heating the substrate W by the heater 71A and stops discharging the gas flow G4 by the gas discharge mechanism 444 (step S250).

The rotating mechanism 231 stops rotating the spin chuck 21 (step S260), and the heating mechanism 7A stops heating the peripheral portion of the substrate W by the heater 71A. The gas discharge mechanisms 440 and 443 stop discharging the gas flows G1 to G3 (step S270). As a result, the operation illustrated in FIG. 22 ends.

After that, the nozzle moving mechanism 6 and the guard drive mechanism 32 respectively move the nozzle heads 48 to 50 and the splash guard 31 to the retreat positions. The substrate W is removed from the spin chuck 21 to be transferred from the substrate processing apparatus 1.

The gas discharge mechanism 444 discharges the gas flow G4 through the plurality of outlets 78 and 79 provided in the heater 71A, while the substrate W rotates. Thus, the gas discharge mechanism 444 may discharge the gas flow G4 through a single outlet 78 and a single outlet 79 provided in the heater 71A. Even when the gas flow G4 is discharged from only one outlet of the outlet 78 and the outlet 79, a temperature drop of the substrate W can be restricted more than in the case in which the gas flow G4 is not discharged. A flow path for the inert gas may be provided between the opposed surface S7 of the heater 71A and the heating element 73 such that the gas flow G4 may be discharged through the outlet that is open to above the heating element 73.

The substrate processing apparatus 1A discharges the chemical solution from the processing liquid discharge mechanism 830 onto the processing region S3 of the upper surface (to-be-processed surface) of the substrate W and heats the substrate W from the lower surface of the substrate W by the heater 71A opposed to the lower surface of the substrate W. Also, the gas discharge mechanism 444 discharges the gas flow G4 of the heated inert gas into the space V1 between the opposed surface S7 of the heater 71A and the lower surface of the substrate W. It should be noted that the to-be-processed surface may be the lower surface of the substrate W. In other words, the processing liquid discharge mechanism 830 may discharge the chemical solution onto the peripheral portion of the lower surface of the substrate W, the heater 71A, which is opposed to the upper surface of the substrate W, may heat the substrate W, and the gas discharge mechanism 444 may discharge the gas flow G4 into the space between the upper surface of the substrate W and the lower surface (opposed surface) of the heater 71A.

The gas discharge mechanism 444 may discharge the inert gas preheated by, for example, another heater different from the heater 71A into the space V1. Specifically, the gas discharge mechanism 444 may preheat the inert gas supplied from the gas supply source 454 by the other heater and, through the pipe outside of the heater 71A, discharge the heated inert gas into the space V1 from the nozzle outside of the heater 71A.

The heater 71A may be provided so as to cover the entire surface, which is opposite to the to-be-processed surface, of the substrate W. The heater 71A can be provided between the lower surface of the substrate W and the upper surface of the spin chuck 21 when the spin chuck 21, which includes a plurality of chuck pins, holds the substrate W such that the substrate W does not contact the upper surface of the spin chuck 21. In this case, the heater 71A is supported by a columnar support member passing through the inside of the rotary shaft 22 and the spin chuck 21.

Although the substrate processing apparatus 1A includes the nozzle 43 that discharges the gas flow G3 of the inert gas, the substrate processing apparatus 1A may include no nozzle 43. In that case, the substrate processing apparatus 1A may include no arm 62 and no nozzle head 49.

Although the nozzles 41 and 42 are held by the nozzle head 48 and moved together by the arm 61, another configuration may be employed in which the nozzles 41 and 42 are held by different nozzle heads and are moved individually by different arms.

Although the substrate processing apparatus 1A discharges the nitrogen gas as the gas flows G1 to G4, at least one gas flow of the gas flows G1 to G4 may be an inert gas different from the inert gas of the other gas flows.

Although the nozzles 41 and 42 that respectively discharge the gas flows G1 and G2 of the inert gas and the nozzles that discharge the processing liquid are held by the different nozzle heads 48 and 50 in the substrate processing apparatus 1, another configuration may be employed in which the nozzle 41, the nozzle 42, and the nozzles that discharge the processing liquid are held by the same nozzle head and moved together by an arm or the like.

In the substrate processing apparatus according to the second embodiment configured as described above, the gas flow G4 of the preheated inert gas is discharged into the space V1 between the opposed surface S7 of the heater 71A and the surface (to-be-protected surface), which is opposite to the to-be-processed surface, of the substrate W. This restricts the atmosphere G9 from entering the space V1 to restrict a drop in the heating efficiency of the substrate W, and also restricts a drop in the heating efficiency also by the gas flow G4 of the inert gas. Thus, the substrate W can be processed while being efficiently heated.

In the substrate processing apparatus according to the second embodiment configured as described above, the gas discharge mechanism 444 discharges the gas flow G4 of the inert gas preheated by the heater 71A. Thus, there is no need to separately provide the heater for heating the inert gas, reducing the cost of the substrate processing apparatus.

In the substrate processing apparatus according to the second embodiment configured as described above, the gas discharge mechanism 444 includes the heating flow path 74 arranged along the heating element 73 of the heater 71A and discharges the inert gas heated by the heater 71A when flowing through the heating flow path 74. This improves the heating efficiency of the inert gas by the heater 71A.

In the substrate processing apparatus according to the second embodiment configured as described above, the heating flow path 74 is arranged two-dimensionally along the heating element 73, thus further improving the heating efficiency of the inert gas by the heater 71A.

In the substrate processing apparatus according to the second embodiment configured as described above, the heating flow path 74 is arranged opposite to the substrate W relative to the heating element 73, and thus, the heating element 73 efficiently heats both of the substrate W and the inert gas.

In the substrate processing apparatus according to the second embodiment configured as described above, the gas discharge mechanism 444 includes the outlets 78 and 79 respectively provided in the outer peripheral portion and the inner peripheral portion of the annular heater 71A and discharges the inert gas through the outlets 78 and 79. This effectively restricts the atmosphere G1 around the heater 71A from entering the space V1 between the substrate W and the heater 71A. The substrate W is therefore heated efficiently.

3. Third Embodiment 3-1. Configuration of Substrate Processing Apparatus 1B

Figure 23:
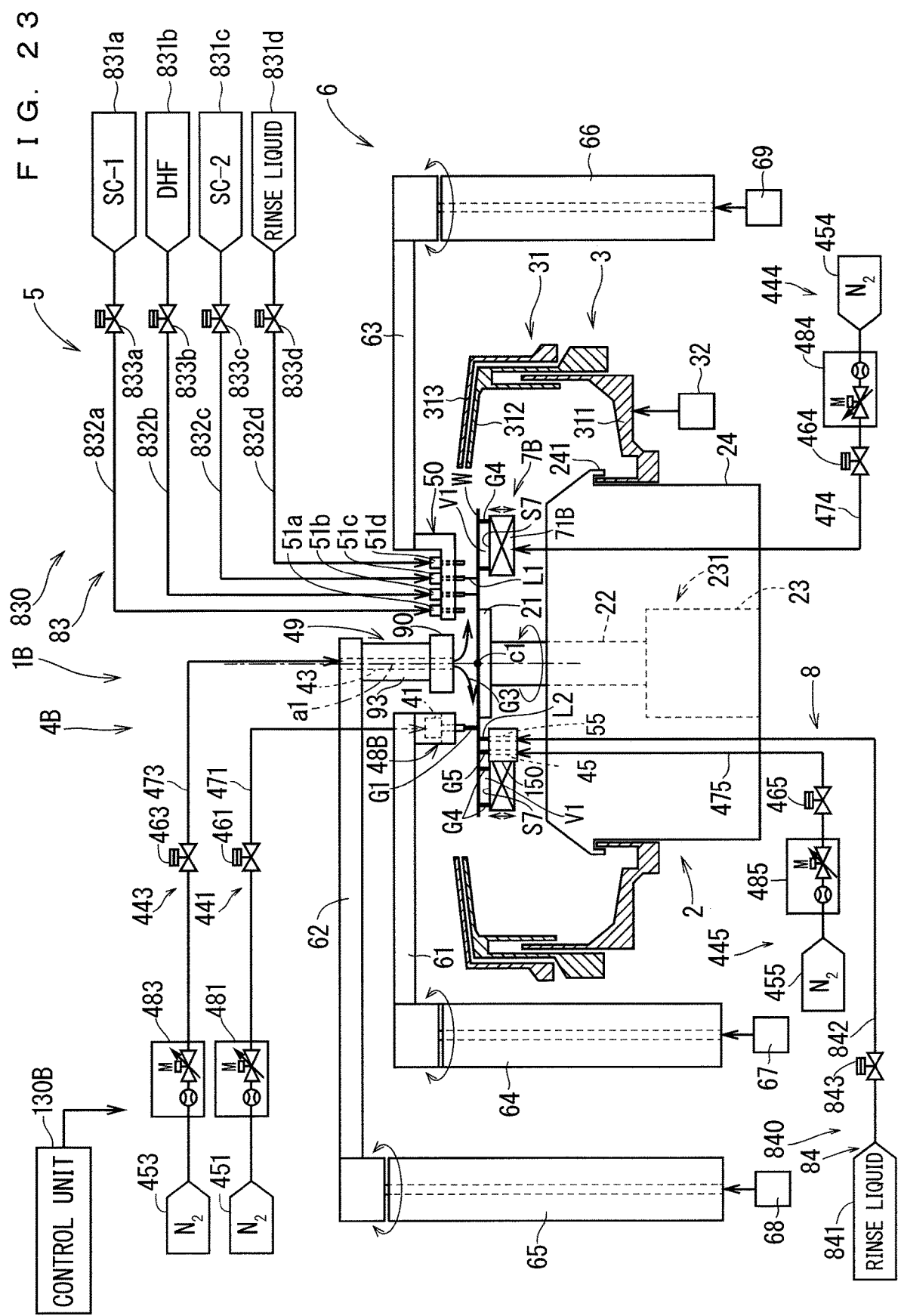
FIG. 23 is a schematic side view for explaining the configuration of the substrate processing apparatus according to the third embodiment of the present invention.
Figure 24:
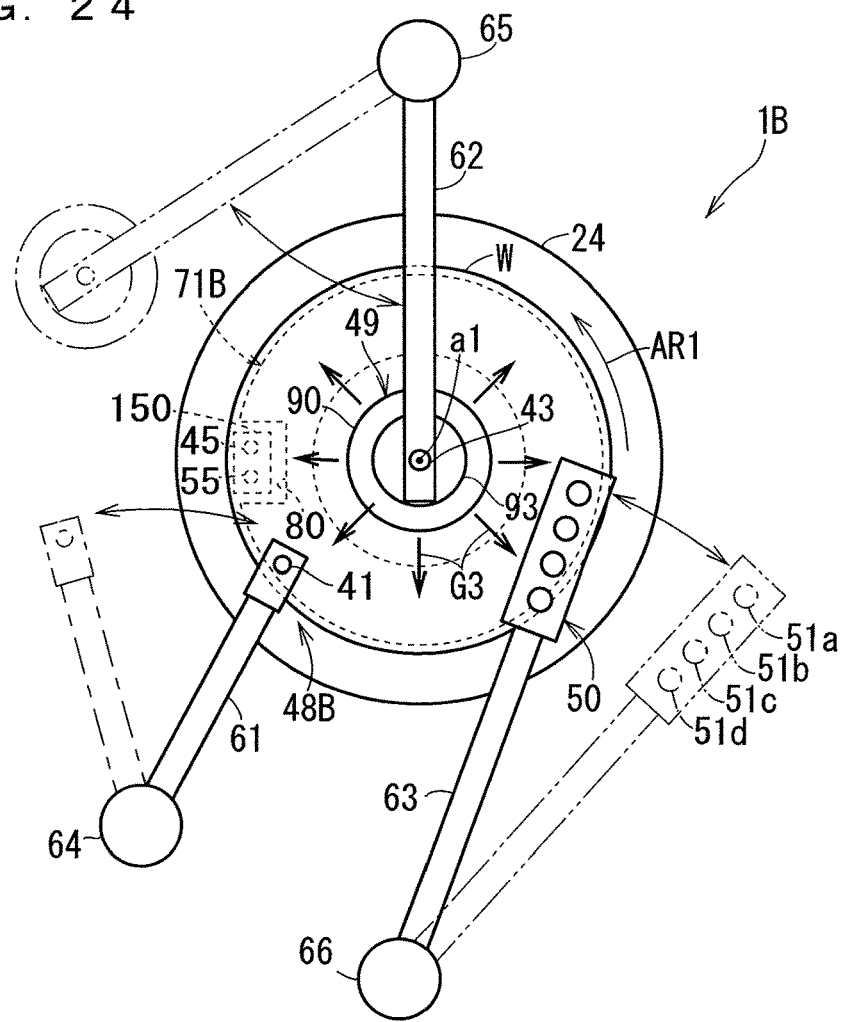
FIG. 24 is a schematic top view for explaining the configuration of the substrate processing apparatus of FIG. 23.
Figure 25:
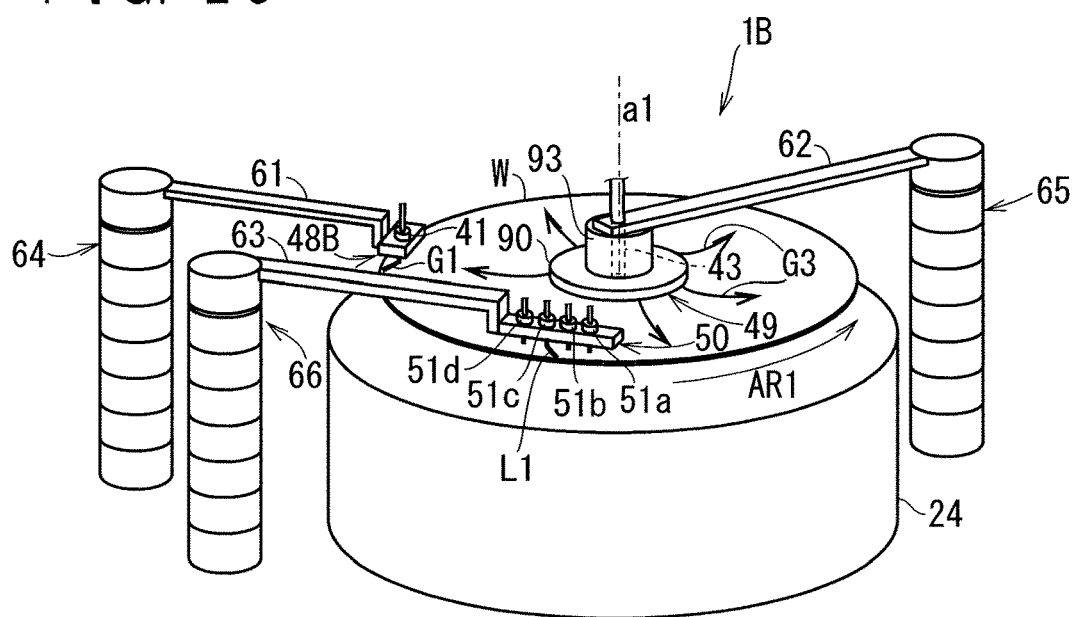
FIG. 25 is a schematic perspective view for explaining the configuration of the substrate processing apparatus of FIG. 23.
Figure 27:
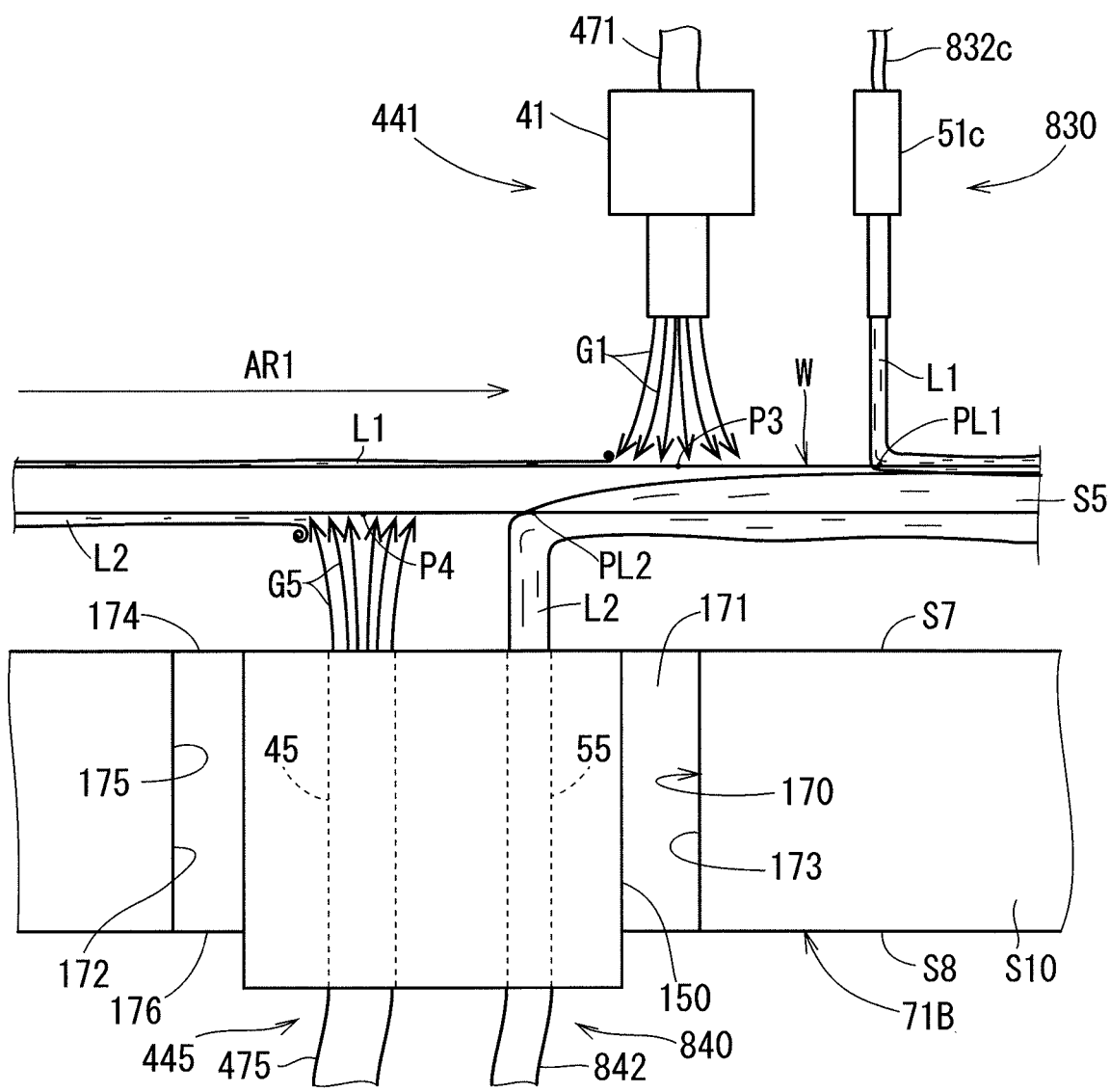
FIG. 27 is a schematic side view illustrating a state in which the nozzles individually discharge the processing liquid and the like to the positions of FIG. 26.

The configuration of a substrate processing apparatus 1B will be described with reference to FIGS. 23 to 27. FIGS. 23 to 25 are views for explaining the configuration of the substrate processing apparatus 1B according to an embodiment. FIGS. 23 and 24 are a schematic side view and a schematic top view, respectively, of the substrate processing apparatus 1B. FIG. 25 is a schematic perspective view of the substrate processing apparatus 1B as viewed from diagonally above. FIGS. 26 and 27 are a schematic top view and a schematic side view, respectively, of a substrate W, which illustrate an example of a positional relationship of the positions at which a liquid flow of a processing liquid and gas flows of an inert gas that are discharged from the substrate processing apparatus 1B come into contact with the peripheral portion of the substrate W. FIG. 26 is a top view schematically illustrating positions PL1, PL2, P3, and P4 at which the processing liquid, rinse liquid, and inert gas discharged from the substrate processing apparatus 1B come into contact with the peripheral portion of the substrate. FIG. 27 is a schematic side view illustrating a state in which the nozzles individually discharge the processing liquid and the like onto the positions PL1, PL2, P3, and P4.

FIGS. 23 to 25 illustrate a state in which the substrate W is being rotated in a predetermined direction of rotation (the direction of the arrow AR1) about a rotation axis a1 by a spin chuck 21, with nozzle heads 48B, 49, and 50 arranged at their respective processing positions. In FIG. 24, the nozzle heads 48B, 49, and 50 arranged at their retreat positions and the like are indicated by phantom lines. FIGS. 24 and 25 do not illustrate partial components of the substrate processing apparatus 1B, such as a scatter prevention unit 3.

The substrate processing apparatus 1B includes a rotary holding mechanism 2, the scatter prevention unit 3, a surface protection unit 4B, a processing unit 5, a nozzle moving mechanism 6, a heating mechanism 7B, a rear surface protection unit 8, and a control unit 130B. These units 2, 3, 4B, 5, 6, 7B, and 8 are electrically connected to the control unit 130B and operate in response to instructions from the control unit 130B. The control unit 130B is configured similarly to the control unit 130 of the substrate processing apparatus 1. In the control unit 130B, the CPU serving as a main control unit performs computations in accordance with the procedure described in the program. The control unit 130B thus controls the respective units of the substrate processing apparatus 1B.

The units 2, 3, and 5 of the substrate processing apparatus 1B are configured and operate similarly to those of the units 2, 3, and 5 of the substrate processing apparatus 1 (1A). The nozzle moving mechanism 6 of the substrate processing apparatus 1B, which is configured similarly to the nozzle moving mechanism 6 of the substrate processing apparatus 1 (1A), moves an object different from an object moved by the nozzle moving mechanism 6 of the substrate processing apparatus 1 (1A). The substrate processing apparatus 1B includes the surface protection unit 4B in place of the surface protection unit 4 of the substrate processing apparatus 1 (1A) and includes the heating mechanism 7B in place of the heating mechanism 7 (7A) of the substrate processing apparatus 1 (1A). The substrate processing apparatus 1B further includes the rear surface protection unit 8. The units 2, 3, and 5 of the substrate processing apparatus 1B will not be described here, and the units 4B, 6, 7B, and 8 will now be described.

Surface Protection Unit 4B

The surface protection unit 4B includes a gas discharge mechanism (also referred to as a "gas discharge mechanism for peripheral portion" or a "gas discharge unit") 441 that discharges a gas flow of an inert gas such that the gas flow comes into contact with the peripheral portion of the upper surface of the substrate W held and being rotated on the spin chuck 21. The gas discharge mechanism 441 discharges the inert gas as, for example, a gas-column-shaped gas flow G1.

The configuration and the like of the surface protection unit 4B, which differ from those of the surface protection unit 4 of the substrate processing apparatus 1 (1A), will be described below. Description of a similar configuration will be omitted appropriately. The components of the surface protection unit 4B, whose description will be omitted, can be described in the description of the components bearing the same reference signs of the surface protection unit 4 described above, or can be described in the description of the surface protection unit 4 by replacing the reference signs of the components of the surface protection unit 4 and the like with the reference sings of the corresponding components of the surface protection unit 4B and the like. The corresponding components bear reference sings combining numerals of the surface protection unit 4 and an alphabet "B".

The surface protection unit 4B further includes a gas discharge mechanism (also referred to as a "gas discharge mechanism for central portion" or "another gas discharge unit") 443. The gas discharge mechanism 443 is configured and operates similarly to the gas discharge mechanism 443 of the substrate processing apparatus 1 (1A). The surface protection unit 4B discharges gas flows G1 and G3 of an inert gas onto the upper surface of the substrate W respectively from the gas discharge mechanisms 441 and 443, thereby protecting the to-be-protected region ("device region") S4 (FIG. 26) of the upper surface of the substrate W from, for example, the processing liquid discharged so as to come into contact with the annular processing region S3 (FIG. 26) defined in the peripheral portion of the upper surface of the substrate W.

The gas discharge mechanism 441 includes a nozzle head 48B. The gas discharge mechanism 443 includes the nozzle head 49. The nozzle heads 48B and 49 are attached to the distal ends of elongated arms 61 and 62 of the nozzle moving mechanism 6. The arms 61 and 62 extend along the horizontal plane. The nozzle moving mechanism 6 moves the arms 61 and 62 to move the nozzle heads 48B and 49 between their processing positions and retreat positions.

The nozzle head 48B includes a nozzle ("gas discharge nozzle for to-be-processed surface") 41 and a holding member holding the nozzle 41. The holding member is configured similarly to the holding member in the nozzle head 48 of the substrate processing apparatus 1 (1A) and is also similarly attached to the distal end of the arm 61 to hold the nozzle 41. The upper end of the nozzle 41 is connected with a first end of the pipe 471. A second end of the pipe 471 is connected to the gas supply source 451. At some midpoint in the pipe 471, a flow rate controller 481 and an on/off valve 461 are provided sequentially from the gas supply source 451 side.

Here, when the nozzle moving mechanism 6 arranges the nozzle head 48B at its processing position, the outlet of the nozzle 41 is opposed to a part of the rotation path ("first rotation path") of the peripheral portion of the upper surface of the substrate W rotated by the rotary holding mechanism 2.

With the nozzle head 48B arranged at the processing position, the nozzle 41 is supplied with an inert gas (in the illustrated example, a nitrogen ($N_2$) gas) from the gas supply source 451. The nozzle 41 discharges the gas flow G1 of the supplied inert gas from above such that the gas flow G1 comes into contact with the position P3 defined in the rotation path of the peripheral portion of the upper surface of the substrate W. The nozzle 41 discharges the gas flow G1 through the outlet in a predetermined direction such that the gas flow G1 reaches the position P3 and then flows from the position P3 toward the periphery of the substrate W.

A liquid flow L1 of a processing liquid discharged from a nozzle head 50 of the processing unit 5 comes into contact with a position ("landing position", "first position") PL1 (FIG. 26) defined in the rotation path of the peripheral portion of the upper surface of the substrate W. A width D1 of the liquid flow L1 in the radial direction of the substrate W is, for example, 0.5 to 2.5 mm. The nozzle head 50 can selectively discharge the liquid flow L1 of the processing liquid from each of a plurality of nozzles 51a to 51d. The position PL1 slightly varies depending on the arrangements of the nozzles 51a to 51d and the direction in which the processing liquid is discharged. The position P3 with which the gas flow G1 comes into contact is located upstream from the position P1 corresponding to any of the nozzles 51a to 51d in the direction of rotation of the substrate W along the periphery of the substrate W.

That is to say, the gas discharge mechanism 441 discharges the gas flow ("first gas flow") G1 of the inert gas from above toward the position P3 upstream from the position PL1, with which the processing liquid discharged from the processing unit 5 comes into contact, in the direction of rotation of the substrate W along the circumferential direction of the substrate W in the rotation path of the peripheral portion of the substrate W. The gas discharge mechanism 441 discharges the gas flow G1 in a predetermined direction such that the discharged gas flow G1 flows from the position P3 toward the periphery of the substrate W.

The nozzle head 49 of the substrate processing apparatus 1B is configured and operates similarly to the substrate processing apparatus 1 (1A) described above. Flow rate control units 481 and 483 and the pipe 471 and a pipe 473 of the substrate processing apparatus 1B are configured similarly to the flow rate control units 481 and 483 and the pipes 471 and 473 of the substrate processing apparatus 1 (1A). The control unit 130B controls the flow rate control units 481 and 483 and the on/off valve 461 and an on/off valve 463 similarly to the control unit 130 (130A) of the substrate processing apparatus 1 (1A) via a valve control mechanism (not shown). The control unit 130B thus controls how the gas flows G1 and G3 are respectively discharged from the nozzles 41 and 43 (such as a discharge start timing, a discharge end timing, and a discharge flow rate).

How easily the residual processing liquid that remains on the upper surface of the substrate W is blown off by the gas flow G1 varies depending on the film quality of the surface of the substrate W. Of the hydrophobic film quality and the hydrophilic film quality, the hydrophobic film quality is less likely to blow off the residual processing liquid, and the hydrophilic film quality is more likely to blow off the residual processing liquid. Therefore, how the gas flow G1 is discharged is preferably set in accordance with the film quality of the surface of the substrate W.

Nozzle Moving Mechanism 6

The nozzle moving mechanism 6 is a mechanism that moves the nozzle heads 48B, 49, and 50 of the gas discharge mechanisms 441 and 443 and the processing liquid discharge mechanism 830 between their processing positions and retreat positions.

The nozzle moving mechanism 6 of the substrate processing apparatus 1B is configured similarly to the nozzle moving mechanism 6 of the substrate processing apparatus 1 (1A). The nozzle heads 48B, 49, and 50 are attached to the distal end portions of the arms 61 to 63 of the nozzle moving mechanism 6. Drives 67 to 69 of the nozzle moving mechanism 6 respectively move the nozzle heads 48B, 49, and 50 horizontally between their processing positions and their retreat positions in accordance with the control of the control unit 130B.

When the nozzle head 48B is arranged at the processing position, the outlet of the nozzle 41 is opposed to a part of the rotation path of the peripheral portion of the substrate W rotated by the rotary holding mechanism 2. The processing positions and retreat positions of the nozzle head 49 and the nozzle holding member 50 of the substrate processing apparatus 1B are positions respectively similar to the processing positions and the retreat positions of the nozzle head 49 and the nozzle holding member 50 of the substrate processing apparatus 1 (1A).

The respective retreat positions of the nozzle heads 48B, 49, and 50 of the substrate processing apparatus 1B are positions similar to their respective retreat positions of the nozzle heads 48, 49, and 50 of the substrate processing apparatus 1 (1A).

The drives 67 to 69 are electrically connected to the control unit 130B and operate under the control of the control unit 130B. The control unit 130B causes the nozzle moving mechanism 6 to arrange the nozzle heads 48B and 50 at the processing positions in accordance with the preset setup information such that the gas flow G1 and the liquid flow L1 respectively come into contact with the positions P3 and PL1 in the rotation path of the peripheral portion of the substrate W. The positions P3 and PL1 are adjusted by changing the setup information. The control unit 130B causes the nozzle moving mechanism 6 to arrange the nozzle head 49 at the processing position in accordance with the setup information such that the gas flow G3 comes into contact with the center or its vicinity of the substrate W. That is to say, the control unit 130B controls the positions of the nozzle heads 48B, 49, and 50. Specifically, the control unit 130 controls the positions of the nozzles 41, 43, and 51a to 51d.

The liquid flow L1 of the processing liquid, which has been discharged onto the position PL1 in the rotation path of the peripheral portion of the upper surface of the substrate W, moves in the circumferential direction of the substrate W while adhering to the processing region S3 in the form of a liquid film. During the movement, the central angle of the circular arc, which connects the portion to which the liquid film of the processing liquid adheres and the position PL1 along the end face ("edge") of the substrate W, becomes greater. The centrifugal force due to the rotation of the substrate W acts on the liquid film of the processing liquid during the movement. Thus, approximately 80% of the processing liquid is drained out of the substrate W until the central angle reaches 90°. This rate varies depending on, for example, the rotational speed and film quality of the substrate W, and the volume and viscosity of the processing liquid discharged.

If the width of the processing region S3, that is, the width with which the etching process or any other process is intended to be performed is 1 mm, the liquid flow L1 of the processing liquid is preferably discharged so as to come into contact with the substrate W with a width in the range of 0.5 mm from the periphery of the substrate W. In this case, to efficiently remove the residual processing liquid from the substrate W while restricting splashes that arrive at the to-be-protected region S4, the gas flow G1 is preferably discharged such that the center of the cross-section of the gas flow G1 of the inert gas comes into contact with the substrate W within the range of, for example, 4 to 8 mm from the periphery of the substrate W. The width of the liquid film of the residual processing liquid that adheres to the peripheral portion of the substrate W normally spreads to be larger than the width of the liquid flow L1 of the processing liquid that comes into contact with the position PL1. As described above, therefore, the width of the gas flow G1 of the inert gas is preferably larger than the width of the liquid flow L1 of the processing liquid that comes into contact with the peripheral portion of the substrate W. Specifically, the width of the gas flow G1 of the inert gas is preferably set to be, for example, three to five times the width of the liquid flow L1. The residual processing liquid that adheres to the peripheral portion of the substrate W is thus efficiently drained out of the substrate W by the gas flow G1.

Heating Mechanism 7B

The heating mechanism 7B is provided below the peripheral portion of the lower surface of the substrate W. The heating mechanism 7B includes an annular heater 71B extending in the circumferential direction of the substrate W along the peripheral portion of the lower surface of the substrate W, a gas discharge mechanism ("shielding gas discharge mechanism") 444, and an electric circuit (not shown) that supplies power to the heater 71B in accordance with the control of the control unit 130B. The heating mechanism 7B is configured similarly to the heating mechanism 7A of the substrate processing apparatus 1A except for that it includes the heater 71B in place of the heater 71A.

Figure 28:
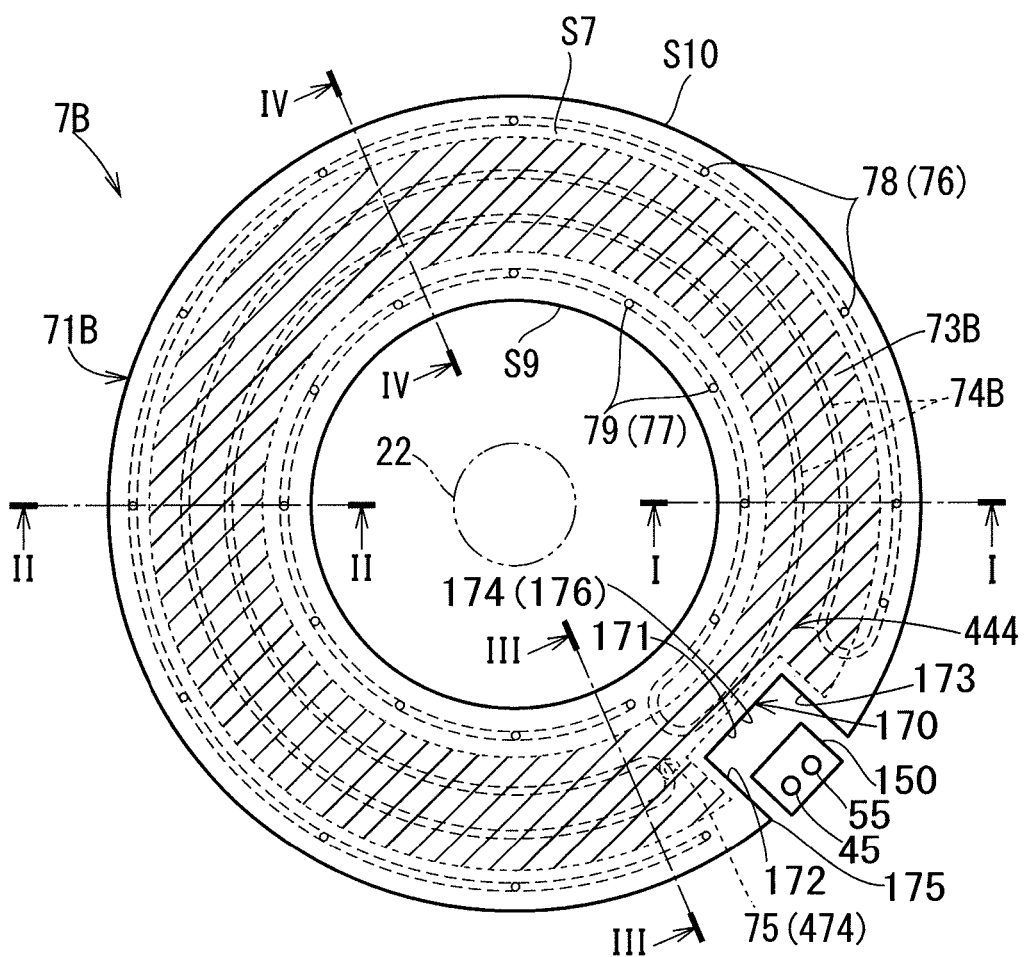
FIGS. 28 to 30 are schematic top views of a heater of the substrate processing apparatus of FIG. 23.
Figure 29:
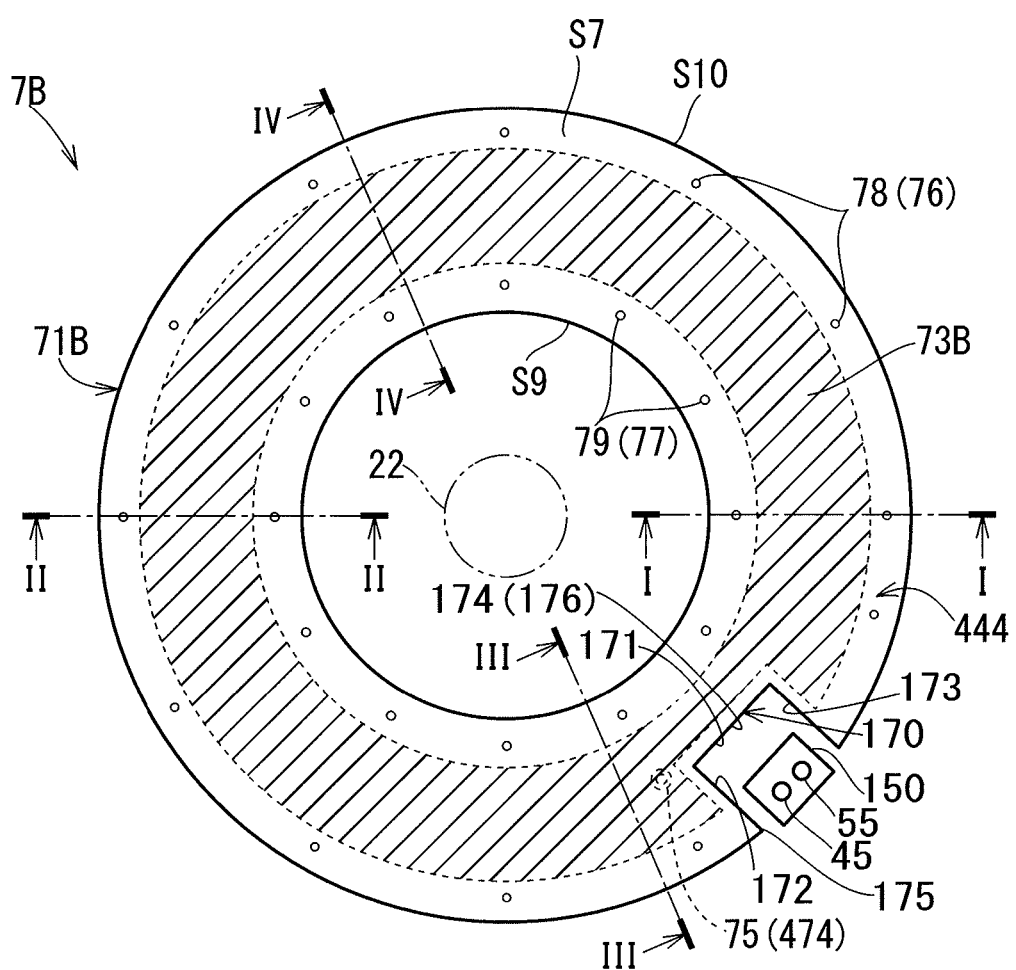
Figure 30:
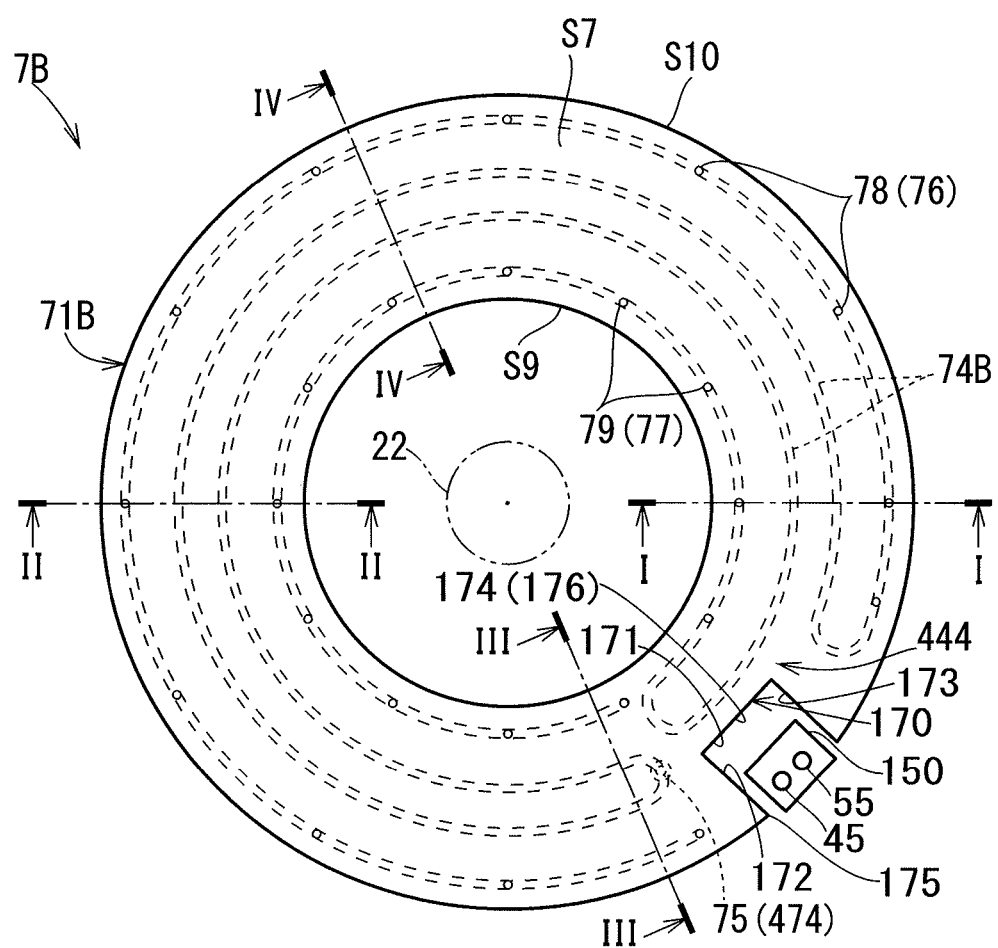

FIGS. 28 to 30 are schematic top views of the heater 71B of the heating mechanism 7B. FIG. 28 illustrates a heating element 73B and a heating flow path 74B of the heater 71A. FIG. 29 does not illustrate the heating flow path 74B of FIG. 28 for easy viewing, and FIG. 30 does not illustrate the heating element 73B of FIG. 28. The heating element 73B is illustrated as a region in which the heating element 73B is arranged (arrangement region). The heating flow path 74B is arranged below the heating element 73B. The heater 71B is configured similarly to the heater 71A of the heating mechanism 7A of the substrate processing apparatus 1A except for that it includes the heating element 73B and the heating flow path 74B in place of the heating element 73 and the heating flow path 74 and that it has a recess 170 formed in the outer peripheral surface S10 of the heater 71B.

FIGS. 18 and 19 are schematic cross-sectional views of the heater 71B of the heating mechanism 7B. FIG. 18 is a longitudinal cross-sectional view of the heater 71B taken along the lines I-I and II-II of FIG. 28, and FIG. 19 is a longitudinal cross-sectional view of the heater 71B taken along the lines and IV-IV of FIG. 28. As illustrated in FIGS. 18 and 19, the structure of each cross-section of the heater 71B taken along these cutting lines is the same as the structure of each cross-section of the heater 71A taken along corresponding cutting lines in the heater 71A of the substrate processing apparatus 1A.

A configuration of the heating mechanism 7B different from that of the heating mechanism 7A will be mainly described below. Description of a similar configuration will be omitted appropriately. The components of the heating mechanism 7B, whose description will be omitted, can be described in the description of the components bearing the same reference sings of the heating mechanism 7A described above, or can be described in the description of the heating mechanism 7A by replacing the reference sings of the components of the heating mechanism 7A and the like with the reference sings of the corresponding components of the heating mechanism 7B and the like. The corresponding components bear reference signs combining the same numerals and an alphabet "B".

The heater 71B is arranged in a positional relationship similar to that of the heater 71A of the substrate processing apparatus 1A relative to the substrate W and the spin chuck 21, and is held similarly to the heater 71A. The heater 71B is movable upward and downward by a moving mechanism (not shown) between the processing position and the retreat position similarly to the heater 71A. The heater 71B is supplied with power while being arranged at the processing position, and then, the heater 71B generates heat to heat the peripheral portion of the substrate W.

The heater 71B (body portion 72) is an annular plate-shaped member extending in the circumferential direction of the substrate W along the peripheral portion of the lower surface of the substrate W. The recess 170 is formed in the outer peripheral surface S10 of the heater 71B. The recess 170 is recessed from the outer peripheral surface S10 of the body portion 72 toward the center of the heater 71B (toward the rotation axis a1). The recess 170 passes through the heater 71B vertically from the opposed surface S7 of the heater 71B to a surface (lower surface) S8 opposite to the opposed surface S7.

The recess 170 has a bottom surface 171 and side surfaces 172 and 173. The bottom surface 171 and the side surfaces 172 and 173 are vertical planes of approximately elongated shape extending from the opposed surface S7 of the heater 71B to the surface S8 heater 71B. The normal of the bottom surface 171 is orthogonal to the rotation axis a1. The side surface 172 (173) extends from the end of the bottom surface 171 downstream (upstream) in the direction of rotation of the substrate W to the outer peripheral surface S10 of the heater 71B. The side surfaces 172 and 173 are orthogonal to the bottom surface 171 and are parallel to each other.

The recess 170 has an opening ("opposed-surface opening") 174 open to the opposed surface S7, an opening ("outer-peripheral-surface opening") 175 open to the outer peripheral surface of the heater 71B, and an opening 176 open to the surface S8. The openings 174 to 176 each have a rectangular shape. The opening 174 is opposed to the portion, which is adjacent to the position PL2 with which the liquid flow L2 of the rinse liquid discharged from the nozzle 55 comes into contact, of the peripheral portion of the to-be-protected surface of the substrate W. The upper edges (lower edges) of the bottom surface 171 and the side surfaces 172 and 173 form the periphery of the opening 174 (176). The intersecting lines of the outer peripheral surface S10 of the heater 71B and the side surfaces 172 and 173 form the periphery of the opening 175. The openings 174, 175, and 176 are sequentially continuous with each other and form one opening from the opposed surface S7 of the heater 71B to the surface S8 via the outer peripheral surface S10. The recess 170 accommodates a nozzle head 150 holding nozzles 45 and 55 of the rear surface protection unit 8, and the respective outlets of the distal end portions of the nozzles 45 and 55 are opposed to the peripheral portion of the lower surface of the substrate W.

The heating element 73B is arranged below the annular portion of the opposed surface S7 of the heater 71B except for the outer peripheral portion and the inner peripheral portion of the opposed surface S7 (more specifically, the annular-belt shaped portion except for the opening 174 of the recess 170), over the entire annular (more specifically, annular-belt-shaped) arrangement region defined along the annular portion. The arrangement region for the heating element 73B is parallel to the lower surface of the substrate W and the opposed surface S7 of the heater 71B. Preferably, the substrate W is uniformly heated with ease if the arrangement region for the heating element 73B is parallel to the lower surface of the substrate W. Inside the heater 71B, a temperature (not shown) is also arranged. The temperature sensor measures the temperature of the heater 71B and transmits the measurement result to the control unit 130B. The control unit 130B controls power supply to the heating element 73B based on the measurement result.

The heating flow path 74B is arranged below the heating element 73B along the heating element 73B. The respective portions of the heating flow path 74B can be uniformly heated with ease if the heating flow path 74B is arranged along the heating element 73B. Thus, the inert gas flowing through each part of the heating flow path 74B is uniformly heated with ease.

The body portion 72 of the heater 71B includes, for example, a lower member 72a, a middle member 72b, and an upper member 72c layered sequentially from below to above. The members 72a to 72c are annular plate-shaped members extending in the circumferential direction of the substrate W along the peripheral portion of the lower surface of the substrate W. The recess 170 is formed in a part of the body portion 72 at the outer peripheral surface side. In the cross-sectional shapes of the respective members 72a to 72c taken along the horizontal plane, a rectangular recess is formed that is recessed from the outer peripheries of the respective members 72a to 72c toward the centers of the respective members 72a to 72c.

In the example illustrated in FIG. 30, the heating flow path 74B is repeatedly arranged as follows: it makes approximately one loop around an inner peripheral surface S9 of the heater 71B in the circumferential direction, is then doubled back toward the outer peripheral surface S10 of the heater 71B in the plane extending along the opposed surface S7, and makes approximately one loop around the heater 71B in the opposite direction. Consequently, the heating flow path 74B is arranged across the inner peripheral surface S9 of the heater 71B and the outer peripheral surface S10 of the heater 71B so as to make approximately four loops by being doubled back every time it makes approximately one loop in the circumferential direction around the inner peripheral surface S9 of the heater 71B. The heating flow path 74B is formed except for in the recess 170. The heating flow path 74B cuts across four locations of the longitudinal cross-section of the heater 71B in the circumferential direction of the heater 71B. The four locations are arranged sequentially at intervals in the radial direction of the heater 71B. The innermost (innermost peripheral) portion, that is, the portion with the smallest diameter of the heating flow path 74 is, when seen through from above, arranged between the inner periphery of the heater 71B and the inner periphery of the arrangement region for the heating element 73 along both of the inner peripheries. The outermost (outermost peripheral) portion, that is, the portion with the largest diameter of the heating flow path 74 is, when seen through from above, arranged between the outer periphery of the arrangement region for the heating element 73 and the outer periphery of the heater 71B along both of the outer peripheries.

The control unit 130B controls how the heater 71B heats the substrate W and the inert gas (such as the temperature of the substrate W and the temperature of the discharged inert gas) and also controls the position of the heater 71B.

Rear Surface Protection Unit 8

The rear surface protection unit 8 includes a rinse liquid discharge mechanism 840 and a gas discharge mechanism 445. The rinse liquid discharge mechanism 840 discharges a liquid flow L2 of a rinse liquid such that the liquid flow L2 comes into contact with the peripheral portion of the lower surface of the substrate W held and being rotated on the spin chuck 21. The gas discharge mechanism 445 discharges a gas flow G5 of an inert gas such that the gas flow G5 comes into contact with the peripheral portion.

The rear surface protection unit 8 discharges the liquid flow L2 of the rinse liquid onto the peripheral portion of the lower surface of the substrate W from the rinse liquid discharge mechanism 840. By so doing, the rear surface protection unit 8 protects the lower surface of the substrate W from, for example, a processing liquid discharged so as to come into contact with the position PL1 in the rotation path of the peripheral portion of the upper surface (more specifically, the processing region S3 of the peripheral portion of the upper surface) of the substrate W. The liquid flow L2 is discharged so as to come into contact with the position ("second position") PL2 defined in the rotation path ("second rotation path") of the peripheral portion of the lower surface. The position PL2 is determined to be upstream from the position PL1 in the direction of rotation of the substrate W.

The rear surface protection unit 8 discharges the gas flow G5 of the inert gas onto the peripheral portion of the lower surface of the substrate W from the gas discharge mechanism 445. The gas flow G5 is discharged so as to come into contact with the position ("fourth position") P4 in the rotation path of the peripheral portion of the lower surface and flow from the position P4 toward the periphery of the lower surface of the substrate W. The position P4 is determined to be upstream from the position PL2 in the direction of rotation of the substrate W. A part of the liquid flow L2 of the rinse liquid discharged onto the position PL2 loops in the circumferential direction of the substrate W while and remaining in the peripheral portion of the lower surface of the substrate W in the form of a liquid film. Most of the residual rinse liquid is blown off by the gas flow G5 to be drained out of the substrate W from the peripheral portion of the lower surface of the substrate W. This restricts mixing of a rinse liquid newly discharged from the rinse liquid discharge mechanism 840 onto the position PL2 and the residual rinse liquid to excessively increase the volume of the rinse liquid.

The rinse liquid discharge mechanism 840 includes a tubular nozzle ("rinse liquid discharge nozzle") 55. The nozzle 55 passes through the nozzle head 150 and is held by the nozzle head 150. The nozzle head 150 has an approximately rectangular-solid-shaped outer appearance. The nozzle head 150 is accommodated in the recess 170 of the heater 71B so as to be arranged below the peripheral portion of the lower surface (portions adjacent to the position PL2 and the position P4) of the substrate W, with its upper surface being horizontal. The heater 71B is arranged in advance such that the recess 170 is located below the portions adjacent to the position PL2 and the position P4. The nozzle head 150 is held by, for example, a support member (not shown) provided in the casing 24. The nozzle 55 is connected with a rinse liquid supply unit 84 serving as a pipe system that supplies a rinse liquid to the nozzle 55. Specifically, the lower end of the nozzle 55 is connected with a first end of a pipe 842 of the rinse liquid supply unit 84. The outlet of the distal end of the nozzle 55 is opposed to the position PL2. The nozzle 55 is supplied with a rinse liquid from the rinse liquid supply unit 84 and discharges the supplied rinse liquid through the outlet of the distal end. The rinse liquid discharge mechanism 840 discharges the liquid flow L2 of the rinse liquid from the nozzle 55 in accordance with the control of the control unit 130B. The liquid flow L2 is discharged so as to come into contact with the position PL2 defined in the rotation path of the peripheral portion of the lower surface of the substrate W.

The rinse liquid supply unit 84 specifically includes a rinse liquid supply source 841, the pipe 842, and an on/off valve 843. The rinse liquid supply source 841 is a supply source that supplies a rinse liquid. The rinse liquid supply source 841 is connected to the nozzle 55 via the pipe 842 in which the on/off valve 843 is interposed. When the on/off valve 843 is opened, thus, the rinse liquid supplied from the rinse liquid supply source 841 is discharged from the nozzle 55 onto the position PL2 as the liquid flow L2.

The on/off valve 843 of the rinse liquid supply unit 84 is opened or closed under the control of the control unit 130B by a valve open/close mechanism (not shown) electrically connected to the control unit 130B. That is to say, the control unit 130B controls how the rinse liquid is discharged from the nozzle 55 of the nozzle head 150 (such as a discharge start timing, a discharge end timing, and a discharge flow rate). Specifically, by the control of the control unit 130B, the rinse liquid discharge mechanism 840 discharges the liquid flow L2 of the rinse liquid such that the liquid flow L2 comes into contact with the position PL2 in the rotation path of the lower peripheral portion of the substrate W being rotated about the rotation axis a1.

The gas discharge mechanism 441 includes a nozzle ("gas charge nozzle for to-be-protected surface") 45. The nozzle 45 passes through the nozzle head 150 and is held by the nozzle head 150 on the side upstream from the nozzle 55 in the direction of rotation of the substrate W. The lower end of the nozzle 45 is connected with a first end of the pipe 475. A second end of the pipe 475 is connected with the gas supply source 455 that supplies an inert gas. At some midpoint in the pipe 475, a flow rate control unit 485 and an on/off valve 465 are provided sequentially from the gas supply source 455 side. The outlet of the distal end (upper end) of the nozzle 45 is opposed to the part of the rotation path of the peripheral portion of the lower surface of the substrate W rotated by the rotary holding mechanism 2, specifically, the position P4 determined in the rotation path.

The nozzle 45 is supplied with an inert gas (in the illustrated example, a nitrogen ($N_2$) gas) from the gas supply source 455. The nozzle 45 discharges the gas flow G5 of the supplied inert gas from below such that the gas flow G5 comes into contact with the position P4. The nozzle 45 discharges the gas flow G5 through the outlet in a predetermined direction such that the discharged gas flow G5 arrives at the position P4 and then flows from the position P4 toward the periphery of the substrate W.

The flow rate control unit 485 includes a flowmeter and a variable valve. The flowmeter detects the flow rate of a gas flowing through the pipe 475. The variable valve can adjust the flow rate of the gas in accordance with an open/close amount of the valve. The control unit 130B controls an open/close amount of the variable valve of the flow rate control unit 485 via a valve control mechanism (not shown) such that the flow rate detected by the flowmeter of the flow rate control unit 485 is equal to a target flow rate. The control unit 130B can set a target flow rate within a predetermined range in accordance with the preset setup information to freely control a flow rate of a gas passing through the flow rate control unit 485 within the predetermined range. The control unit 130B also controls the on/off valve 465 between the open state and the closed state via the valve control mechanism. The control unit 130B thus controls how the gas flow G5 is discharged from the nozzle 45 (such as a discharge start timing, a discharge end timing, and a discharge flow rate).

How easily the residual rinse liquid is blown off by the gas flow G5 varies depending on the film quality of the surface of the substrate W. Of the hydrophobic film quality and the hydrophilic film quality, the hydrophobic film quality is less likely to blow off the residual processing liquid, and the hydrophilic film quality is more likely to blow off the residual processing liquid. Therefore, how the gas flow G5 is discharged is preferably set in accordance with the film quality of the surface of the substrate W.

3-2. Actions of Rinse Liquid Discharged onto Lower Surface and Inert Gas Discharged onto Upper and Lower Surfaces As illustrated in FIGS. 26 and 27, one (in the illustrated example, the nozzle 51c) among the nozzles 51a to 51c capable of discharging a chemical solution as a processing liquid discharges the liquid flow L1 of the chemical solution such that the liquid flow L1 comes into contact with the position PL1 in the rotation path of the peripheral portion of the upper surface of the substrate W. The nozzle 55 of the rinse liquid discharge mechanism 840 discharges the liquid flow L2 of the rinse liquid such that the liquid flow L2 comes into contact with the position PL2 in the rotation path of the peripheral portion of the lower surface (to-be-protected surface) opposite to the upper surface (to-be-processed surface) of the substrate W. The position PL2 is a position upstream from the position PL1 in the direction of rotation of the substrate W.

The nozzle 41 of the gas discharge mechanism 441 discharges the gas flow G1 of the inert gas such that the gas flow G1 comes into contact with the position ("third position") P3 in the rotation path of the peripheral portion of the upper surface of the substrate W. The position P3 is located between the position PL1 and the position PL2 along the periphery (end face S5) of the substrate W.

The nozzle 45 of the gas discharge mechanism 445 discharges the gas flow G5 of the inert gas such that the gas flow G5 comes into contact with the position P4 in the rotation path of the peripheral portion of the lower surface of the substrate W. The position P4 is located adjacent to the position PL2 upstream from the position PL2 in the direction of rotation of the substrate W.

Figure 34:
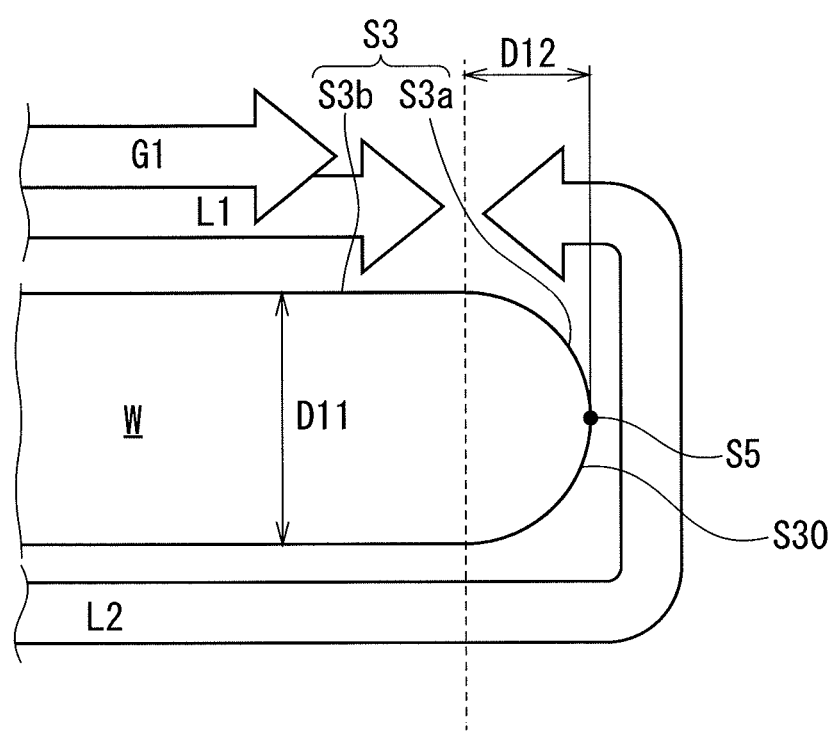
FIG. 34 is a cross-sectional view of a substrate, which schematically illustrates how the rinse liquid discharged by the substrate processing apparatus of FIG. 23 wraps around an end face of the substrate.

FIG. 34 is a longitudinal cross-sectional view of the substrate W schematically illustrating how the liquid flow L2 of the rinse liquid discharged by the substrate processing apparatus 1B wraps around an end face S5 of the substrate. The longitudinal cross-sectional view of the substrate W of FIG. 34 is a cross-sectional view of the substrate W cut on the cutting surface including the rotation axis a1 and the position PL1. The liquid flow L1 of the chemical solution, the liquid flow L2 of the rinse liquid, and the gas flow G1 of the inert gas are projected onto the cutting surface and illustrated schematically. Although the liquid flows L1 and L2 and the gas flow G1 discharged onto the surface of the substrate W flow along the surface of the substrate W, for easy viewing, FIG. 34 illustrates these flows at intervals from the surface of the substrate W.

The flat portion of the upper surface and the flat portion of the lower surface of the substrate W are connected by an annular curved surface S30 provided along the circumferential direction of the substrate W. If a depth D11 of the substrate W is, for example, 0.7 mm, a width D12 of the curved surface S30 along the radial direction of the substrate W is, for example, 0.3 mm. In the longitudinal cross-section of the substrate W, the curved surface S30 projects toward the outside of the substrate W along the radial direction of the substrate W and is curved. The annular apex (distal end portion) of the curved surface S30 is an end face (also referred to as a "periphery" or "edge") S5 of the substrate W. A curved surface portion S3a is a portion of the curved surface S30 on the side close to the upper side (on the side close to the to-be-processed surface) relative to the end face S5. The curved surface portion S3a is an annular curved surface connecting a flat portion S3b and the end face S5. The processing region S3 of the peripheral portion of the upper surface of the substrate W on the side closer to the periphery includes the annular flat portion S3b and the annular curved surface portion S3a.

The liquid flow L2 of the rinse liquid discharged onto the position PL2 loops in the circumferential direction of the substrate W along the peripheral portion of the lower surface of the substrate W due to the influence of, for example, the direction in which the liquid flow L2 is discharged and the rotation of the substrate W, and a part of the rinse liquid wraps around the curved surface S30 of the substrate W including the end face S5 from the peripheral portion of the lower surface of the substrate W. Here, although a part of the liquid flow L2 wraps around the end face S5 and the curved surface portion S3a of the substrate from the to-be-protected surface of the substrate W when the liquid flow L2 moves from the position PL2 in the circumferential direction of the substrate W and then arrives at the position PL1 or its vicinity (below the position PL1), the position PL2 (a distance from the position PL2 to the position PL1 along the periphery of the substrate W) is set in advance relative to the position PL1 such that the part of the liquid flow L2 does not wrap around up to the flat portion S3b. Specifically, the position PL2 is set in advance such that a part of the liquid flow L2 of the rinse liquid wraps around the end face S5 of the substrate W from the to-be-protected surface of the substrate W and hardly wraps around the peripheral portion of the to-be-processed surface. The position PL2 described above varies depending on the conditions for discharging the rinse liquid, such as the rotational speed and the surface film quality of the substrate W, and the viscosity and flow rate of the liquid flow L2. The position PL2 is set in advance through experiments or the like in accordance with the conditions for discharging the rinse liquid.

When the liquid flow L1 of the chemical solution is discharged onto the position PL1, the liquid flow L1 moves in the circumferential direction of the substrate W along with the rotation of the substrate W. Also, a part of the liquid flow L1 wraps around the curved surface portion S3a from the flat portion S3b of the substrate W. The position PL2, however, is set such that the rinse liquid that has been discharged onto the position PL2 and wrapped around the end face S5 hardly wraps around the peripheral portion of the upper surface, thus restricting the dilution of the processing liquid discharged onto the position PL1 with the rinse liquid on the peripheral portion of the upper surface. Also, the gas flow G1 of the inert gas discharged onto the position P3 can further restrict the rinse liquid from wrapping around peripheral portion of the upper surface.

A part of the processing liquid discharged onto the position PL1 turns into the residual processing liquid remaining on the peripheral portion of the upper surface and wraps around up to the position P3. At the position P3, the gas flow G1 blows off most of the residual processing liquid to drain the residual processing liquid out of the substrate W. This restricts the generation of splashes due to a collision between the residual processing liquid and a processing liquid newly discharged onto the position PL1.

Before the rinse liquid discharged onto the position PL1 arrives at the position PL1 or its vicinity, a part of the rinse liquid has wrapped around the end face S5. This restricts the processing liquid discharged onto the position PL1 from wrapping around the peripheral portion of the lower surface of the substrate W via the end face S5.

A part of the rinse liquid discharged onto the position PL2 turns into the liquid-film-shaped residual rinse liquid adhering to and remaining at the peripheral portion of the lower surface of the substrate W, and then loops by the rotation of the substrate W to arrive at the position P4 or its vicinity. The gas flow G5 of the inert gas discharged onto the position P4 blows off most of the residual rinse liquid to drain the residual rinse liquid out of the substrate W. This restricts a situation in which the residual rinse liquid and a rinse liquid newly discharged onto the position are mixed to excessively increase the volume of the rinse liquid, and accordingly, the rinse liquid wraps around the upper surface of the substrate W.

The heater 71B has the recess 170 formed therein, and the recess 170 has the opening 174 that is opposed to the portions adjacent to the positions PL2 and P4 in the rotation path of the peripheral portion of the lower surface of the substrate W and that is open to the opposed surface S7. At least the outlets of the nozzles 45 and 55 of the rinse liquid discharge mechanism 840 are accommodated in the recess 170. The outlet of the distal end portion of the nozzle 55 (45) is arranged in the opening 174 when the recess 170 is viewed from the opening 174 side. This enables the nozzle 55 and the nozzle 45 having simple configurations to easily perform the following operations simultaneously: heating the peripheral portion of the substrate W by the heater 71B and discharging the liquid flow L2 of the rinse liquid and the gas flow G5 of the inert gas onto the peripheral portion of the lower surface of the substrate W.

3-3. Another Example of Heater

Figure 32:
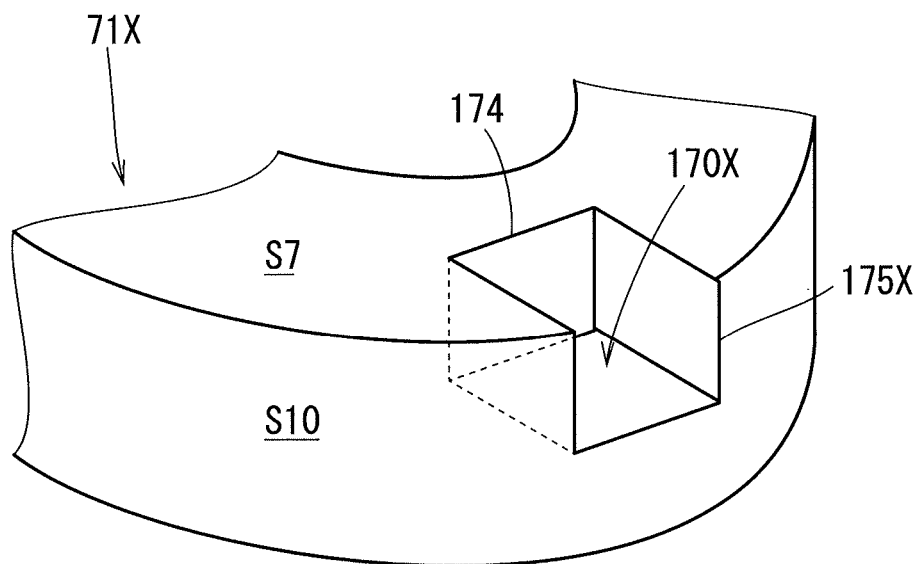
FIG. 32 is a schematic perspective view of another example of the heater of FIG. 28.
Figure 33:
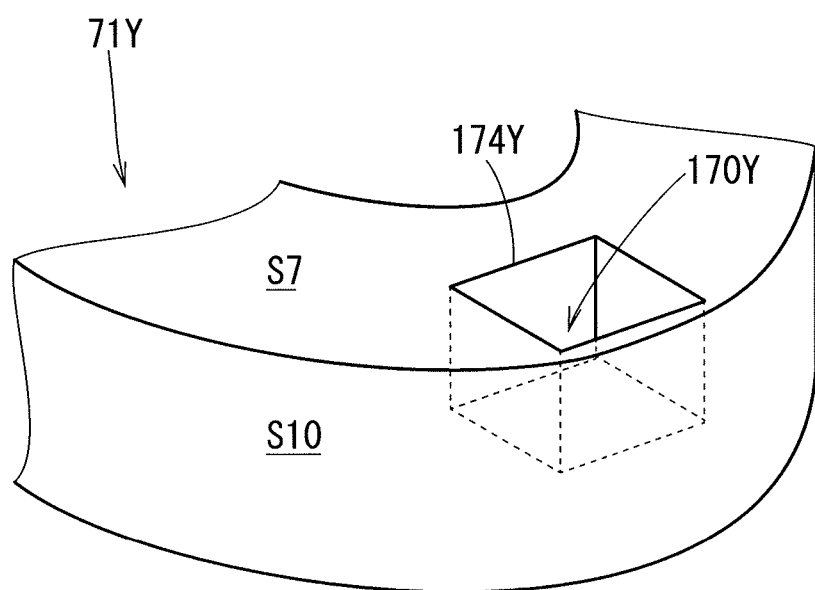
FIG. 33 is a schematic perspective view of another example of the heater of FIG. 28.

FIG. 32 (FIG. 33) is a schematic perspective view of a heater 71X (71Y) that is another example of the heater 71B, as viewed from diagonally above. The heater 71X (71Y) is configured similarly to the heater 71B except for that a recess 170X (170Y) is formed in place of the recess 170 of the heater 71B (71Y).

Unlike the recess 170 of the heater 71B, the recess 170X of the heater 71X does not pass through the heater 71X vertically. An opening 175X of the heater 71X that is open to the outer peripheral surface S10 is thus open across the outer peripheral surface S10 from the upper end of the outer peripheral surface S10 to the center and its vicinity of the outer peripheral surface S10. Like the recess 170X of the heater 71X, the recess 170Y of the heater 71Y does not pass through the heater 71Y vertically. The recess 170X differs from the recess 170Y in that the recess 170X has the opening 175X open to the outer peripheral surface S10, whereas the recess 170Y is not open to the outer peripheral surface S10. An opening 174Y that is open to the opposed surface S7 of the heater 71Y is open to the outer-periphery-side portion of the annular opposed surface S7. The opening 174Y, however, does not extend up to the outer periphery of the opposed surface S7 along the radial direction of the heater 71Y.

If the nozzle head 150 holding the nozzles 45 and 55 are accommodated in the recess 170X (170Y) such that the outlets of the nozzles 45 and 55 are opposed to the positions P4 and PL2, the following operations can be performed simultaneously: heating the peripheral portion of the substrate W by the heater 71X (71Y), and discharging the liquid flow L2 of the rinse liquid and the gas flow G5 of the inert gas onto the peripheral portion of the lower surface of the substrate W. Thus, the heater 71X (71Y) may be employed in place of the heater 71B. Alternatively, the recess 170Y of the heater 71Y may pass through the heater 71Y vertically.

3-4. Action of Shielding Gas

FIG. 20 illustrates an example of the gas flow G4 of the inert gas discharged between the heater 71B and the substrate. The heater 71B irradiates the lower surface of the substrate W with rays of heat H1 from the opposed surface S7 through heat generation of the heating element 73B, thereby heating the substrate W. The inert gas supplied by the gas discharge mechanism 444 is introduced into the heating flow path 74B and is preheated by the heating element 73B while flowing through the heating flow path 74B. The heated gas passes through the through holes 76 and 77 and is then discharged into the space V1 through the outlets 78 and 79 as the gas flow G4 of the inert gas.

The gas flow G4 flows toward the periphery of the substrate W and the center of the substrate W from each of the outlets 78 and 79. On the side close to the periphery of the substrate W and the side close to the substrate W relative to the heater 71B, an atmosphere G9 of temperature lower than that of the heated gas flow G4 is present. The gas flow G4 discharged through the outlet 78 and directed toward the periphery of the substrate W restricts the atmosphere G9, which is present on the side close to the periphery of the substrate W relative to the heater 71B, from wrapping around the space V1. The gas flow G4 discharged through the outlet 79 and directed toward the center of the substrate W restricts the atmosphere G9, which is present on the side close to the center of the substrate W relative to the heater 71B, from wrapping around the space V1. This restricts a reduction in the heating efficiency of the substrate W by the heater 71B due to the atmosphere G9. Also, the gas flow G4 is preheated, thus contributing to heating of the substrate W.

The inert gas discharged by the gas discharge mechanism 441 serves as a shielding gas that prevents the atmosphere G9 from entering the space V1 and also as a heating gas that heats the substrate W.

When the liquid flow L2 of the rinse liquid and the gas flow G5 of the inert gas that are respectively discharged onto the positions PL2 and P4 from the nozzles 55 and 45 enter the space V1 between the heater 71B and the lower surface of the substrate W, the heating efficiency of the peripheral portion of the substrate W by the heater 71B may decrease due to scattering of the rinse liquid onto the opposed surface S7 of the heater 71B. Thus, the position PL2 and the position P4 are preferably provided on the side closer to the periphery of the substrate W than the outlet 78 through which an inert gas is discharged from the outer peripheral portion of the opposed surface S7 of the heater 71B. This enables the use of the inert gas discharged from the gas discharge mechanism 444 as a shielding gas that prevents the rinse liquid or an unheated inert gas from entering the space V1.

3-5. Operation of Substrate Processing Apparatus

Figure 31:
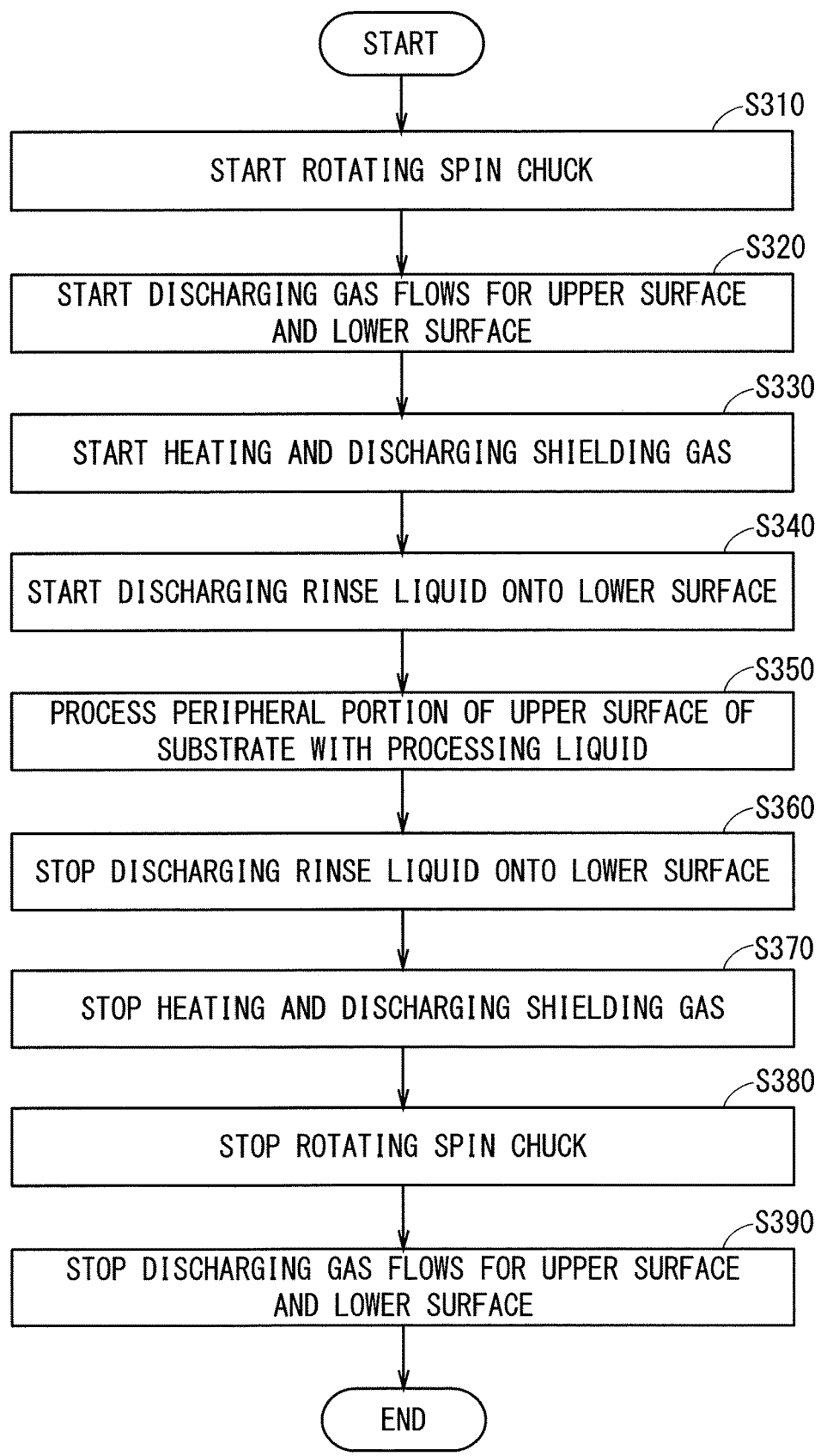
FIG. 31 is a flowchart illustrating an example operation of the substrate processing apparatus of FIG. 23.

FIG. 31 is a flowchart illustrating an example operation in which the substrate processing apparatus 1B processes a substrate with a processing liquid. The operation of the substrate processing apparatus 1B will be described below with reference to FIG. 31. Before the operation illustrated in FIG. 31, the substrate W has been transferred to the substrate processing apparatus 1B to be held on the spin chuck 21. The nozzle heads 48B, 49, and 50 have been arranged at the processing positions by the nozzle moving mechanism 6, and the splash guard 31 has been arranged at the upper position by the guard drive mechanism 32.

When the process illustrated in FIG. 31 is started, the rotating mechanism 231 of the substrate processing apparatus 1B starts rotating the spin chuck 21 holding the substrate W (step S310). The rotational speed of the substrate W is set to, for example, 1000 rotations per minute.

Then, the gas discharge mechanism 441 starts discharging the gas flows G1 of the inert gas from the nozzle 41 of the nozzle head 48B, and the gas discharge mechanism 443 starts discharging the gas flow G3 of the inert gas from the nozzle 43 of the nozzle head 49, and the gas discharge mechanism 445 starts discharging the gas flow G5 of the inert gas from the nozzle 45 (step S320). The gas flows G1 and G5 are respectively discharged onto the position P3 on the peripheral portion of the upper surface of the substrate W and the position P4 on the peripheral portion of the lower surface of the substrate W. Preferably, the gas flows G1 and G5 are respectively discharged in predetermined directions so as to come into contact with the positions P3 and P4 and then flow toward the periphery of the upper surface and the periphery of the lower surface. The nozzle 43 discharges the inert gas from above onto the central portion of the upper surface of the substrate W to generate the gas flow G3 spreading from the central portion toward the periphery of the substrate W. The flow rate of the gas flow G3 when the gas flow G3 discharged from the nozzle 43 is discharged is higher than the flow rate when the gas flow G1 is discharged.

After the discharge of the gas flows G1 and G3 has been started, the heating mechanism 7B starts heating the peripheral portion of the substrate W by the heater 71B. The heater 71B is heated to, for example, approximately 185°. The gas discharge mechanism 444 of the heating mechanism 7B starts supplying the inert gas from the gas supply source 454 at a flow rate of, for example, 40 L/min to 60 L/min to start discharging the gas flow G4 through the plurality of outlets 78 and 79 formed in the opposed surface S7 of the heater 71B (step S330). The inert gas is heated to be higher than the processing temperature (e.g., 60° C. to 90° C.) of the substrate W.

After the temperature of the peripheral portion of the substrate W has risen and become stable after a lapse of time, the rinse liquid discharge mechanism 840 starts discharging the liquid flow L2 of the rinse liquid such that the liquid flow L2 comes into contact with the position PL2 determined in the rotation path of the peripheral portion of the lower surface of the substrate W (step S340). The liquid flow L2 is preferably discharged in a predetermined direction such that the liquid flow L2, which has come into contact with the position PL2, flows also from the position PL2 toward the periphery of the lower surface of the substrate W.

The processing liquid discharge mechanism 830 discharges the liquid flow L1 of the processing liquid (chemical solution) such that the liquid flow L1 comes into contact with the position PL1 determined in the rotation path of the peripheral portion of the upper surface of the substrate W (more specifically, the processing region S3 of the upper surface on the side closer to the end face S5 of the substrate W) after the rinse liquid discharged first onto the position PL2 arrives at below the position PL1, thereby processing the peripheral portion of the upper surface (step S350). Specifically, the processing liquid discharge mechanism 830 discharges the liquid flow L1 of the chemical solution from one nozzle (in FIG. 23, the nozzle 51c) among the nozzles 51a to 51d in accordance with the control of the control unit 130B. The cross-sectional size and flow rate of the liquid flow L1 are set in advance such that the width of the liquid film, which turns from the liquid flow L1 and adheres to the peripheral portion of the substrate W, fits in the processing region S3. The liquid flow L1 comes into contact with the position PL1 and then forms a liquid film on the processing region S3. The liquid film of the processing liquid moves in the circumferential direction of the substrate W while adhering to the peripheral portion of the substrate W along with the rotation of the substrate W.

A part of the processing liquid discharged onto the position PL1 flows from the peripheral portion of the upper surface of the substrate W through the end face S5 of the substrate W to begin to wrap around the peripheral portion of the lower surface. A part of the liquid flow L2 of the rinse liquid, however, wraps around the end face S5 after being discharged onto the position PL2. Thus, the rinse liquid that has wrapped around the end face S5 restricts the processing liquid from wrapping around the lower surface of the substrate W.

From the viewpoint of improving the processing rate of the substrate W, the discharged processing liquid preferably stays at the position of discharge in the processing region S3 for the longest possible period of time. The central angle, which is formed between the straight line connecting the position PL1 in the rotation path and the center c1 of the substrate W and the straight line connecting the portion onto which the liquid flow L1 has been discharged and the center c1, gradually increases along with the rotation of the substrate W. For example, 80% of the processing liquid discharged onto the processing region S3 is drained out of the substrate W mainly by the centrifugal force associated with the rotation of the substrate W while the substrate W rotates until the central angle reaches 90°. After that, the liquid-film-shaped processing liquid that has not been drained out and has remained in the substrate W also moves along the circumferential direction of the substrate W while being gradually drained out of the substrate W and simultaneously adhering to the processing region S3, thus contributing to processing of the substrate W during the process.

The gas flow G1, whose discharge has been started from the nozzle 41 in step S310, comes into contact with the liquid film of the residual processing liquid at the position P3. The position P3 is located upstream from the position PL1 in the direction of rotation of the substrate W along the circumferential direction of the substrate W in the rotation path of the substrate W, and is also located downstream from the position PL2 in the direction of rotation. Subsequently, the gas flow G1 flows from the position P3 toward the periphery of the substrate W due to the influence of, for example, the direction in which the gas flow G1 flows and the rotation of the substrate W. In other words, the gas discharge mechanism 441 discharges the gas flow G1 of the inert gas from above onto the position P3 in the rotation path of the peripheral portion of the upper surface of the substrate W, thereby directing the gas flow G1 from the position P3 toward the periphery of the substrate W. Most of the residual processing liquid is drained out of the substrate W from the peripheral portion of the upper surface of the substrate W by the gas flow G1.

The gas flow G3 discharged from the nozzle 43 of the gas discharge mechanism 443 spreads from the central portion of the substrate W toward the periphery of the substrate W due to the influence of, for example, the direction in which the gas flow G3 is discharged and the rotation of the substrate W. In other words, the gas discharge mechanism 443 discharges the inert gas from above the central portion of the upper surface of the substrate W to generate the gas flow G3 spreading from the central portion toward the periphery of the substrate W.

The rinse liquid discharged onto the position PL2 flows to below the position PL1 along the periphery of the substrate W, and while the flowing, a part of the rinse liquid wraps around the end face S5 of the substrate W from the peripheral portion of the lower surface of the substrate W. The rinse liquid that has wrapped around the end face S5 is restricted from wrapping around the upper surface of the substrate W by the gas flow G1 flowing from the position P3 toward the periphery of the substrate W. Also, although a part of the rinse liquid discharged onto the position PL2 turns into a residual rinse liquid that adheres to and remains in the peripheral portion of the lower surface of the substrate W and makes loops on the lower surface of the substrate W, most of the residual rinse liquid is blown off by the gas flow G5 of the inert gas discharged onto the position P4 to be drained out of the substrate W. This restricts mixing of the residual rinse liquid and a rinse liquid newly discharged onto the position PL2 to excessively increase the volume of the rinse liquid.

As described above, most of the processing liquid discharged at the position PL1 so as to come into contact with the processing region S3 of the substrate W is drained out of the substrate W during one rotation of the substrate W. This restricts the splashes generated due to a processing liquid newly discharged onto the position PL1 from coming into contact with the residual processing liquid. The rinse liquid is also restricted from wrapping around the upper surface of the substrate W, thus restricting the dilution of the processing liquid discharged onto the position PL2 with the rinse liquid that has wrapped around the upper surface. Also, the rinse liquid that has wrapped around the end face S5 of the substrate W restricts the processing liquid from wrapping around the lower surface of the substrate W. Also, the residual rinse liquid can be easily drained out of the substrate W by the gas flow G5 discharged onto the position P4.

While discharging of the gas flows G1, G3, and G5 and discharging of the liquid flow L1 are performed simultaneously, the rotating mechanism 231 rotates the substrate W repeatedly in accordance with the control of the control unit 130B. For example, the gas flows G1, G3, and G5 are discharged respectively at flow rates of 12 L/min, 30 L/min to 130 L/min, and 10 L/min to 10 to 20 L/min.

When the control unit 130B detects, for example, a lapse of a processing time required for processing the substrate W, the processing liquid discharge mechanism 830 stops discharging the processing liquid. This completes the process of step S340.

The rinse liquid discharge mechanism 840 stops discharging the liquid flow L2 of the rinse liquid onto the lower surface (position PL2) of the substrate W (step S360). The heating mechanism 7B stops power supply to the heater 71B to stop heating the substrate W by the heater 71B and also stops discharging the gas flow G4 by the gas discharge mechanism 444 (step S370).

The rotating mechanism 231 stops rotating the spin chuck 21 (step S380), and the heating mechanism 7B stops heating the peripheral portion of the substrate W by the heater 71B. The gas discharge mechanisms 441, 443, and 445 respectively stop discharging the gas flows G1, G3, and G5 (step S390). As a result, the operation illustrated in FIG. 31 ends.

After that, the nozzle moving mechanism 6 and the guard drive mechanism 32 respectively move the nozzle heads 48B, 49, and 50, and the splash guard 31 to the retreat positions. The substrate W is removed from the spin chuck 21 to be transferred from the substrate processing apparatus 1B.

The substrate processing apparatus 1B discharges the chemical solution such that the chemical solution comes into contact with the position PL1 in the rotation path of the peripheral portion of the upper surface (to-be-processed surface) of the substrate W and discharges the rinse liquid such that the rinse liquid comes into contact with the position PL2 in the rotation path of the peripheral portion of the lower surface (to-be-protected surface) opposite to the upper surface of the substrate W. The position PL2 is located upstream from the position PL1 in the direction of rotation of the substrate W. The heater 71B opposed to the lower surface of the substrate W heats the substrate W from the lower surface of the substrate W. The gas discharge mechanism 444 discharges the gas flow G4 of the heated inert gas into the space V1 between the opposed surface S7 of the heater 71B and the lower surface of the substrate W. Alternatively, the to-be-processed surface may be the lower surface of the substrate W. In other words, the nozzles of the processing liquid discharge mechanism 830 may discharge the chemical solution such that the chemical solution comes into contact with the first position in the rotation path of the peripheral portion of the lower surface of the substrate W. The nozzle 55 of the rinse liquid discharge mechanism 840 may discharge the rinse liquid such that the rinse liquid comes into contact with the second position in the rotation path of the upper surface of the substrate W. The second position may be located upstream from the first position in the direction of rotation of the substrate W. In this case, the heater 71B heats the substrate W while being opposed to the upper surface of the substrate W, and the gas discharge mechanism 444 discharges the gas flow G4 into the space between the upper surface of the substrate W and the lower surface (opposed surface) of the heater 71B. The rinse liquid discharged onto the position PL2 of the upper surface wraps around the lower surface that is a to-be-processed surface more easily than in the case in which the to-be-processed surface is the upper surface. The volume of the rinse liquid is thus adjusted in advance.

The substrate processing apparatus 1B may be devoid of at least one gas discharge mechanism of the gas discharge mechanism 441 that discharges the gas flow G1 of the inert gas onto the position P3 and the gas discharge mechanism 445 that discharges the gas flow G5 of the inert gas onto the position P4.

Although the rinse liquid discharge mechanism 840 includes one nozzle 55, the rinse liquid discharge mechanism 840 may include a plurality of nozzles 55 distributed sparsely in the circumferential direction of the substrate W and discharge, from the plurality of nozzles 55, the rinse liquid onto a plurality of positions PL2 determined in the rotation path of the peripheral portion of the to-be-protected surface of the substrate W. If the rinse liquid discharge mechanism 840 includes a plurality of nozzles 55, it can protect the to-be-protected surface of the substrate more uniformly.

Although the gas discharge mechanism 445 includes one nozzle 45, the gas discharge mechanism 445 may include a plurality of nozzles 45 and discharge, from the plurality of nozzles 45, an inert gas onto a plurality of positions P4 determined in the rotation path of the peripheral portion of the to-be-protected surface of the substrate W. The plurality of positions P4 are determined on the side upstream from the position PL2 in the direction of rotation of the substrate W.

The gas discharge mechanism 441 discharges, from one nozzle 41, the gas flow G1 of the inert gas onto the position P3 in the rotation path of the peripheral portion of the upper surface of the substrate W, where the position P3 is determined between the position PL2 and the position PL1 along the peripheral portion of the substrate W. Alternatively, the gas discharge mechanism 444 may discharge, from a plurality of nozzles 41, the gas flow G1 of the inert gas onto a plurality of positions P3 in the rotation path of the peripheral portion of the upper surface. The plurality of positions P3 are determined between the position PL2 and the position PL1 along the peripheral portion of the substrate W.

The gas discharge mechanism 444 discharges the gas flow G4 from a plurality of outlets 78 and 79 provided in the heater 71B, while the substrate W rotates. The gas discharge mechanism 444 may thus discharge the gas flow G4 from a single outlet 78 and a single outlet 79 provided in the heater 71B. Even when the gas flow G4 is discharged through only one outlet of the outlet 78 and the outlet 79, a temperature drop of the substrate W can be restricted more than in the case in which the gas flow G4 is not discharged. Alternatively, a flow path for the inert gas may be provided between the opposed surface S7 of the heater 71B and the heating element 73B such that the gas flow G4 may be discharged through an outlet open to above the heating element 73B.

The gas discharge mechanism 444 may discharge the inert gas preheated by, for example, another heater different from the heater 71B into the space V1. Specifically, the gas discharge mechanism 444 may preheat the inert gas supplied from the gas supply source 454 by the other heater and, through the pipe outside of the heater 71B, discharge the heated inert gas into the space V1 from the nozzle outside of the heater 71B.

The heater 71B may be provided so as to cover the entire surface, which is opposite to the to-be-processed surface, of the substrate W. Such a heater 71B can be provided between the lower surface of the substrate W and the upper surface of the spin chuck 21 when the spin chuck 21, which includes a plurality of chuck pins, holds the substrate W such that the substrate W does not contact the upper surface of the spin chuck 21. In this case, the heater 71B is supported by a columnar support member passing through the inside of the rotary shaft 22 and the spin chuck 21.

Although the substrate processing apparatus 1B includes the nozzle 43 that discharges the gas flow G3 of the inert gas, the substrate processing apparatus 1B may include no nozzle 43. In that case, the substrate processing apparatus 1B may include no arm 62 and no nozzle head 49.

Although the substrate processing apparatus 1B discharges a nitrogen gas as the gas flows G1 and G3 to G5, at least one gas flow among the gas flows G1 and G3 to G5 may be an inert gas different from the inert gas of the other gas flows.

The substrate processing apparatus according to the third embodiment configured as described above restricts a rinse liquid from wrapping around the to-be-processed surface until the rinse liquid moves from the position PL2 to the position PL1 or its vicinity in the circumferential direction of the substrate W, thus restricting the dilution of the chemical solution discharged onto the position PL1 with the rinse liquid at the peripheral portion of the to-be-processed surface of the substrate W. The rinse liquid has wrapped around the end face from the to-be-protected surface before the rinse liquid arrives at the position PL1 or its vicinity in the circumferential direction of the substrate W, thus washing away the chemical solution that begins to wrap around the to-be-protected surface from the position PL1 with the rinse liquid to dilute the chemical solution. Thus, the to-be-protected surface can be processed with a chemical solution that has wrapped around the to-be-protected surface while the peripheral portion is processed efficiently by discharging the chemical solution onto the peripheral portion of the to-be-processed surface of the substrate W.

The substrate processing apparatus according to the third embodiment configured as described above discharges an inert gas onto the peripheral portion of the to-be-processed surface of the substrate W at the position P3 between the positions PL2 and PL1. The inert gas flows downstream in the direction of rotation of the substrate W while flowing toward the periphery of the substrate W along the to-be-processed surface due to the rotation of the substrate W. This restricts the rinse liquid from wrapping around the to-be-processed surface while the rinse liquid that has been discharged onto the to-be-protected surface of the substrate W at the position PL2 moves to the position PL1 or its vicinity in the circumferential direction of the substrate W.

The substrate processing apparatus according to the third embodiment configured as described above discharges an inert gas onto the peripheral portion of the to-be-protected surface of the substrate W at the position P4. The inert gas flows downstream in the direction of rotation of the substrate W while flowing toward the periphery of the substrate W along the to-be-protected surface due to the rotation of the substrate W. The rinse liquid discharged onto the peripheral portion of the to-be-protected surface at the position PL2 loops, on the substrate W in the circumferential direction of the substrate W, downstream in the direction of rotation of the substrate W while being drained out of the substrate W from the periphery of the to-be-protected surface due to the rotation of the substrate W. Thus, a part of the rinse liquid discharged onto the position PL2 arrives at the position P4. The rinse liquid that has arrived at the position P4 is thus blown off, by the inert gas discharged onto the position P4, from the peripheral portion of the to-be-protected surface of the substrate W toward the outside of the substrate W, thus reducing the volume of the rinse liquid further. This reduces the volume of the rinse liquid that loops around the peripheral portion of the to-be-protected surface in the circumferential direction of the substrate W and again arrives at the position PL2. Consequently, a rinse liquid newly discharged onto the position PL2 is restricted from coming into contact with the rinse liquid that has looped around the peripheral portion to generate splashes. Also, the rinse liquid is restricted from increasing excessively in amount to wrap around the to-be-protected region of the to-be-processed surface of the substrate W.

In the substrate processing apparatus according to the third embodiment configured as described above, the recess 170 with the opening 174 open to the opposed surface S7 of the heater 71B is formed in the heater 71B, and the opening 174 is opposed to the portion adjacent to the position PL2 in the rotation path of the lower surface peripheral portion. Besides, at least the outlet portion of the nozzle 55 is accommodated in the recess 170. This enables the following operations simultaneously: bringing the heater 71B closer to the to-be-protected surface of the substrate W to efficiently heat the peripheral portion of the substrate W from the to-be-protected surface side, and discharging the rinse liquid onto the position PL2.

In the substrate processing apparatus according to the third embodiment configured as described above, the recess 170 of the heater 71B passes through the heater 71B vertically, thus facilitating the work of arranging the nozzle 55 that discharges the rinse liquid.

In the substrate processing apparatus according to the third embodiment configured as described above, the opening 175X open to the outer peripheral surface S10 of the heater 71B is further formed in the recess 170X of the heater 71X, and the opening 174 open to the opposed surface S7 and the opening 175X are continuous with each other. This facilitates the work of arranging the nozzle 55 that discharges the rinse liquid.

In the substrate processing apparatus according to the third embodiment configured as described above, the opening 175 open to the outer peripheral surface S10 of the heater 71B and the opening 176 open to the surface S8 opposite to the opposed surface S7 are formed in the recess 170 of the heater 71B, and the openings 176, 175, and 174 are sequentially continuous with each other. This facilitates the work of arranging the rinse liquid discharge nozzle.

In the substrate processing apparatus according to the third embodiment configured as described above, the gas flow G4 of the preheated inert gas is discharged into the space V1 between the opposed surface S7 of the heater 71B and the surface (to-be-protected surface), which is opposite to the to-be-processed surface, of the substrate W. This restricts the atmosphere G9 from entering the space V1 to restrict a drop in the heating efficiency of the substrate W, and also restricts a drop in heating efficiency also by the gas flow G4 of the inert gas. Thus, the substrate W is processed while being efficiently heated.

In the substrate processing apparatus according to the third embodiment configured as described above, the gas discharge mechanism 444 discharges the gas flow G4 of the inert gas preheated by the heater 71B. Thus, there is no need to separately provide the heater for heating the inert gas, reducing the cost of the substrate processing apparatus.

In the substrate processing apparatus according to the third embodiment configured as described above, the gas discharge mechanism 444 includes the heating flow path 74B arranged along the heating element 73B of the heater 71B and discharges the inert gas heated by the heater 71B when flowing through the heating flow path 74. This improves the heating efficiency of the inert gas by the heater 71B.

In the substrate processing apparatus according to the third embodiment configured as described above, the heating flow path 74B is arranged two-dimensionally along the heating element 73B, thus further improving the heating efficiency of the inert gas by the heater 71B.

In the substrate processing apparatus according to the third embodiment configured as described above, the heating flow path 74B is arranged opposite to the substrate W relative to the heating element 73B, and thus, can efficiently heat both of the substrate W and the inert gas by the heating element 73B.

In the substrate processing apparatus according to the third embodiment configured as described above, the gas discharge mechanism 444 includes the outlets 78 and 79 respectively provided in the outer peripheral portion and the inner peripheral portion of the annular heater 71B and discharges the inert gas through the outlets 78 and 79. This effectively restricts the atmosphere G1 around the heater 71B from entering the space V1 between the substrate W and the heater 71B. This enables the substrate W to be heated efficiently.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus comprising:
   a substrate holder rotatably disposed about a predetermined rotation axis and holding a substrate substantially horizontally;
   a rotating mechanism that rotates said substrate holder about said rotation axis;
   a chemical solution discharge nozzle that discharges a chemical solution such that said chemical solution comes into contact with a first position in a first rotation path of a peripheral portion of a to-be-processed surface of said substrate; and
   a rinse liquid discharge nozzle that discharges a rinse liquid such that said rinse liquid comes into contact with a second position in a second rotation path of a peripheral portion of a to-be-protected surface of said substrate opposite to the to-be-processed surface,
   wherein said second position is a position upstream from said first position in a direction of rotation of said substrate.

2. The substrate processing apparatus according to claim 1, further comprising a gas discharge nozzle for to-be-processed surface that discharges an inert gas such that said inert gas comes into contact with a third position in said first rotation path,
   wherein said third position is located between said first position and said second position along a periphery of said substrate.

3. The substrate processing apparatus according to claim 1, further comprising a gas discharge nozzle for to-be-protected surface that discharges an inert gas such that said inert gas comes into contact with a fourth position in said second rotation path,
   wherein said fourth position is located adjacent to said second position upstream from said second position in the direction of rotation of said substrate.

4. The substrate processing apparatus according to claim 1, further comprising a heater annularly disposed along the peripheral portion of said to-be-protected surface of said substrate and including an opposed surface opposed to said to-be-protected surface in a contactless manner, said heater heating the peripheral portion of said substrate,
   wherein
   said heater includes a recess including an opposed-surface opening, said opposed-surface opening being opposed to a portion adjacent to said second position in said second rotation path of said substrate and being open to said opposed surface,
   at least an outlet portion of said rinse liquid discharge nozzle is accommodated in said recess, and
   an outlet of said rinse liquid discharge nozzle is disposed in said opposed-surface opening when said recess is viewed from said opposed-surface opening side.

5. The substrate processing apparatus according to claim 4, wherein said recess of said heater passes through said heater vertically.

6. The substrate processing apparatus according to claim 4, wherein
   said recess of said heater further includes an outer-peripheral-surface opening open to an outer peripheral surface of said heater, and
   said opposed-surface opening and said outer-peripheral-surface opening are continuous with each other.

7. The substrate processing apparatus according to claim 5, wherein
   said recess of said heater further includes an outer-peripheral-surface opening open to an outer peripheral surface of said heater and an opening open to an opposite surface opposed said opposite surface, and
   said opening open to said opposite surface, said outer-peripheral-surface opening, and said opposed-surface opening are sequentially continuous with each other.

* * * * *